United States Patent
Kim et al.

(10) Patent No.: US 11,966,259 B2
(45) Date of Patent: Apr. 23, 2024

(54) ELECTRONIC DEVICE INCLUDING FOLDABLE DISPLAY

(71) Applicant: Samsung Electronics Co., Ltd., Suwon-si (KR)

(72) Inventors: Gidae Kim, Suwon-si (KR); Jungjin Kim, Suwon-si (KR); Jongyoon Kim, Suwon-si (KR); Moohyun Baek, Suwon-si (KR); Chungkeun Yoo, Suwon-si (KR); Youngsik Choi, Suwon-si (KR); Minsung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/660,592

(22) Filed: Apr. 25, 2022

(65) Prior Publication Data

US 2022/0244761 A1 Aug. 4, 2022

Related U.S. Application Data

(63) Continuation of application No. 16/428,637, filed on May 31, 2019, now Pat. No. 11,314,284.

(30) Foreign Application Priority Data

Jun. 1, 2018 (KR) .................. 10-2018-0063602

(51) Int. Cl.
*G06F 1/16* (2006.01)
*H10K 50/84* (2023.01)
(Continued)

(52) U.S. Cl.
CPC .......... *G06F 1/1652* (2013.01); *G06F 1/1681* (2013.01); *H10K 50/84* (2023.02);
(Continued)

(58) Field of Classification Search
CPC ...... G06F 1/1652; G06F 1/1681; G06F 3/041; G06F 2203/04102; G06F 1/1616;
(Continued)

(56) References Cited

U.S. PATENT DOCUMENTS 9,164,547 B1 10/2015 Kwon et al.
9,395,070 B2 7/2016 Endo
(Continued)

FOREIGN PATENT DOCUMENTS

CN 105321430 A 2/2016
GB 2552090 A 1/2018
(Continued)

OTHER PUBLICATIONS

Notice of Reasons for Refusal dated Mar. 5, 2023, in connection with Japanese Application No. 2019-103875, 10 pages.
(Continued)

*Primary Examiner* — Anthony Q Edwards
*Assistant Examiner* — Hung Q Dang

(57) ABSTRACT

An electronic device includes a foldable housing including a first housing structure and a second housing structure that are foldably connected with each other and that form a recess together and a flexible display located in the recess. The flexible display includes a first part located in the first area of the recess and having a first gap from the first portion of the second housing structure in the unfolded state, the first part including a first peripheral portion facing the first portion of the second housing structure and a second part located in the second area of the recess and having a second gap from the second portion of the second housing structure, the second part including a second peripheral portion facing the second portion of the second housing structure, in which the second gap is smaller than the first gap in the unfolded state.

20 Claims, 43 Drawing Sheets

(51) Int. Cl.
*G06F 3/041* (2006.01)
*H10K 102/00* (2023.01)

(52) U.S. Cl.
CPC .... *G06F 3/041* (2013.01); *G06F 2203/04102* (2013.01); *H10K 2102/311* (2023.02)

(58) Field of Classification Search
CPC ............... G06F 1/1618; H01L 51/5237; H01L 2251/5338; H04M 1/0268
See application file for complete search history.

(56) References Cited

U.S. PATENT DOCUMENTS

| | | | |
|---|---|---|---|
| 9,504,170 | B2 | 11/2016 | Rothkopf et al. |
| 9,557,874 | B2 | 1/2017 | Franklin et al. |
| 9,588,549 | B2 | 3/2017 | Endo et al. |
| 9,684,339 | B2 | 6/2017 | Hussa |
| 9,710,019 | B2 | 7/2017 | Kwon et al. |
| 9,791,892 | B2 | 10/2017 | Park et al. |
| 9,810,406 | B2 | 11/2017 | Endo |
| 9,958,976 | B2 | 5/2018 | Endo et al. |
| 9,971,448 | B2 | 5/2018 | Franklin et al. |
| 9,983,424 | B2 * | 5/2018 | Kim ................ G06F 1/1624 |
| 10,104,787 | B2 | 10/2018 | Rothkopf et al. |
| 10,140,018 | B2 | 11/2018 | Kim et al. |
| 10,152,089 | B2 | 12/2018 | Park et al. |
| 10,228,724 | B2 | 3/2019 | Nakamura et al. |
| 10,254,796 | B2 | 4/2019 | Isa et al. |
| 10,285,263 | B2 | 5/2019 | Hong et al. |
| 10,306,783 | B2 | 5/2019 | Seo et al. |
| 10,318,061 | B2 | 6/2019 | Franklin et al. |
| 10,338,716 | B2 | 7/2019 | Endo et al. |
| 10,578,284 | B2 | 3/2020 | Endo |
| 10,585,458 | B2 | 3/2020 | Park et al. |
| 10,618,255 | B2 | 4/2020 | Choi et al. |
| 10,739,908 | B2 | 8/2020 | Franklin et al. |
| 10,823,374 | B2 | 11/2020 | Endo |
| 11,093,007 | B2 | 8/2021 | Lim |
| 11,137,801 | B2 | 10/2021 | Park et al. |
| 11,304,316 | B2 | 4/2022 | Rothkopf et al. |
| 2013/0010405 | A1 | 1/2013 | Rothkopf et al. |
| 2013/0083496 | A1 | 4/2013 | Franklin et al. |
| 2014/0111954 | A1 | 4/2014 | Lee et al. |
| 2014/0123436 | A1 | 5/2014 | Griffin et al. |
| 2015/0261259 | A1 | 9/2015 | Endo |
| 2015/0338888 | A1 | 11/2015 | Kim et al. |
| 2015/0378397 | A1 | 12/2015 | Park et al. |
| 2016/0066411 | A1 | 3/2016 | Hong et al. |
| 2016/0224066 | A1 | 8/2016 | Hussa |
| 2016/0324023 | A1 | 11/2016 | Kim et al. |
| 2017/0126979 | A1 | 5/2017 | Evans, V et al. |
| 2017/0139532 | A1 | 5/2017 | Franklin et al. |
| 2017/0237884 | A1 | 8/2017 | Evans, V et al. |
| 2017/0277226 | A1 | 9/2017 | Hussa |
| 2017/0315589 | A1 | 11/2017 | Isa et al. |
| 2018/0032108 | A1 | 2/2018 | Park et al. |
| 2018/0058665 | A1 | 3/2018 | Endo |
| 2018/0110139 | A1 | 4/2018 | Seo et al. |
| 2018/0219987 | A1 | 8/2018 | Pantel |
| 2018/0307269 | A1 | 10/2018 | Pantel |
| 2018/0364759 | A1 | 12/2018 | Ahn et al. |
| 2019/0036068 | A1 | 1/2019 | Kim et al. |
| 2019/0079561 | A1 | 3/2019 | Park et al. |
| 2019/0208649 | A1 * | 7/2019 | Jeon ................ H05K 5/0217 |
| 2019/0339742 | A1 | 11/2019 | Jia |
| 2021/0333836 | A1 | 10/2021 | Lim |
| 2022/0129041 | A1 | 4/2022 | Kim et al. |
| 2022/0225514 | A1 | 7/2022 | Rothkopf et al. |

FOREIGN PATENT DOCUMENTS

| | | |
|---|---|---|
| JP | 2017-201393 A | 11/2017 |
| JP | 2018-013849 A | 1/2018 |
| JP | 2018-059991 A | 4/2018 |
| KR | 20140069302 A | 6/2014 |
| KR | 10-2016-0009890 A | 1/2016 |
| KR | 20160129724 A | 11/2016 |
| KR | 10-2018-0027467 A | 3/2018 |
| KR | 10-1834793 B1 | 3/2018 |
| KR | 10-1837568 B1 | 3/2018 |
| KR | 10-2016-0150007 A | 12/2018 |
| WO | 2017/075099 A1 | 5/2017 |
| WO | 2017188308 A1 | 11/2017 |

OTHER PUBLICATIONS

Written Decision on Registration dated Mar. 3, 2023, in connection with Korean Application No. 10-2018-0063602, 10 pages.
ISA/KR, International Search Report and Written Opinion of the International Searching Authority, International Application No. PCT/KR2019/006423, dated Sep. 19, 2019, 3 pages.
Partial European Search Report dated Apr. 8, 2020 in connection with European Patent Application No. EP 19 17 7417, 10 pages.
National Intellectual Property Administration, PRC, "The First Office Action," dated Jun. 6, 2023, in connection with Indian Patent Application No. 201980051193.4, 16 pages.
Notice of Preliminary Review Results issued Dec. 11, 2023, in connection with Korean Patent Application No. 10-2023-0064938, 6 pages.
Notice of Allowance issued Jan. 18, 2024, in connection with Korean Patent Application No. 10-2023-0064938, 10 pages.

* cited by examiner

ELECTRONIC DEVICE INCLUDING FOLDABLE DISPLAY

CROSS-REFERENCE TO RELATED APPLICATION

This application is a continuation of application Ser. No. 16/428,637, filed May 31, 2019, now U.S. Pat. No. 11,314,284, which is based on and claims priority under 35 U.S.C. § 119 to Korean Patent Application No. 10-2018-0063602, filed on Jun. 1, 2018, in the Korean Intellectual Property Office, the disclosures of which are incorporated by reference herein in their entirety.

BACKGROUND

1. Field

The disclosure relates to an electronic device, and more particularly, to an electronic device including a foldable display.

2. Description of Related Art

With the development of display technology, an electronic device employing a flexible display has been widely used. For example, an electronic device including a flat panel display and a curved display extending from one side or opposite sides of the flat panel display has been widely used.

Meanwhile, an electronic device such as a notebook computer or a flip phone that is foldable through a hinge structure exists among electronic devices having a flat panel display. The electronic device having a folder structure may include a flat panel display disposed on one side or opposite sides of the hinge structure of the display.

The above information is presented as background information only to assist with an understanding of the disclosure. No determination has been made, and no assertion is made, as to whether any of the above might be applicable as prior art with regard to the disclosure.

SUMMARY

A portable electronic device having a small size and an electronic device providing a large screen have a trade-off relationship. To provide both high portability and a large screen, a flexible display may be employed in a foldable electronic device.

The flexible display includes a plurality of layers. Therefore, when the device is folded, the flexible display may be deformed and housing design of the electronic device, which does not take into account characteristics of the flexible display, may cause deformation or damage of the display.

Furthermore, the foldable electronic device may include a first part and a second part with respect to a folding axis, and the first part and the second part may be electrically connected by a wiring member. The wiring member may be deformed when the electronic device is folded, and stress may be applied to the wiring member by repeated folding. Design that does not take into account this may cause damage to the wiring member.

The foldable electronic device may include a housing in which the flexible display is displaced. The housing may be constituted by a first part and a second part with respect to the folding axis, and the flexible display may be bent when the first part and the second part of the housing are folded.

In order to enable such an operation of the electronic device, an assembly structure of the housing and the display needs to be presented.

In accordance with an aspect of the disclosure, an electronic device includes a foldable housing including a first housing structure and a second housing structure that are foldably connected with each other and that form a recess together and a flexible display located in the recess. The first housing structure and the second housing structure face each other in a folded state and are foldable toward each other with respect to a first axis extending in a first direction to form a planar structure in an unfolded state. The recess, when viewed from above the recess in the unfolded state, includes a first area between a first portion of the first housing structure and a first portion of the second housing structure and a second area between a second portion of the first housing structure and a second portion of the second housing structure, the first area having a first width extending in a second direction perpendicular to the first direction and the second area having a second width extending in the second direction, in which the second width is greater than the first width, and the first portion of the second housing structure is closer to the first axis than the second portion of the second housing structure. The flexible display includes a first part located in the first area of the recess and having a first gap from the first portion of the second housing structure in the unfolded state, the first part including a first peripheral portion facing the first portion of the second housing structure and a second part located in the second area of the recess and having a second gap from the second portion of the second housing structure, the second part including a second peripheral portion facing the second portion of the second housing structure, in which the second gap is smaller than the first gap in the unfolded state.

In accordance with another aspect of the disclosure, an electronic device includes a foldable housing including a first housing structure and a second housing structure that are foldably connected with each other and that form a recess between a first portion of the first housing structure and a first portion of the second housing structure and a flexible display located in the recess. The first housing structure and the second housing structure face each other in a folded state and are foldable toward each other with respect to a first axis extending in a first direction to form a planar structure in an unfolded state. The first portion of the first housing structure includes a recess with a first length on a first inner surface facing toward the recess, and the first portion of the second housing structure includes a recess with a second length on a second inner surface facing toward the recess. The flexible display includes a first peripheral portion extending in the first direction and inserted into the recess with the first length and a second peripheral portion extending in the first direction and inserted into the recess with the second length.

In accordance with another aspect of the disclosure, an electronic device includes a flexible display including a first area, a second area, and a folding area disposed between the first area and the second area and a housing including a first housing in which the first area and at least part of the folding area are disposed and a second housing in which the second area and the rest of the folding area are disposed, the second housing being foldably connected with the first housing with respect to a folding axis extending in a first direction. The first housing includes a first horizontal frame that forms a periphery of the first housing and extends in a second direction perpendicular to the first direction and a second horizontal frame that faces the first horizontal frame in parallel. The second housing includes a third horizontal frame that forms a periphery of the second housing and extends in the second direction and a fourth horizontal frame that faces the third horizontal frame in parallel. A first groove, a second groove, a third groove, and a fourth groove that extend in the second direction are formed in the first horizontal frame, the second horizontal frame, the third horizontal frame, and the fourth horizontal frame, respectively. The flexible display includes a peripheral portion that includes a first peripheral portion extending in the second direction and a second peripheral portion parallel to the first peripheral portion. The first peripheral portion is inserted into the first groove and the third groove, and the second peripheral portion is inserted into the second groove and the fourth groove.

In accordance with another aspect of the disclosure, an electronic device includes a flexible display folded with respect to a first axis extending in a first direction, a bracket structure including a first bracket having a first surface on which at least part of the flexible display is disposed and a second bracket having a first surface on which at least part of the flexible display is disposed, the second bracket being disposed in a second direction perpendicular to the first direction of the first bracket, a hinge structure that includes a folding axis perpendicular to the first direction and that connects the first bracket and the second bracket such that the first bracket and the second bracket are folded or unfolded with respect to the folding axis, a hinge housing having an inner surface that is connected with the first surface of the first bracket and the first surface of the second bracket, the hinge structure being disposed in the hinge housing, a substrate including a first substrate disposed on a second surface of the first bracket and a second substrate disposed on a second surface of the second bracket, and a wiring member that electrically connects the first substrate and the second substrate. At least part of the wiring member extends on the first surface of the first bracket or the first surface of the second bracket.

Other aspects, advantages, and salient features of the disclosure will become apparent to those skilled in the art from the following detailed description, which, taken in conjunction with the annexed drawings, discloses various embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
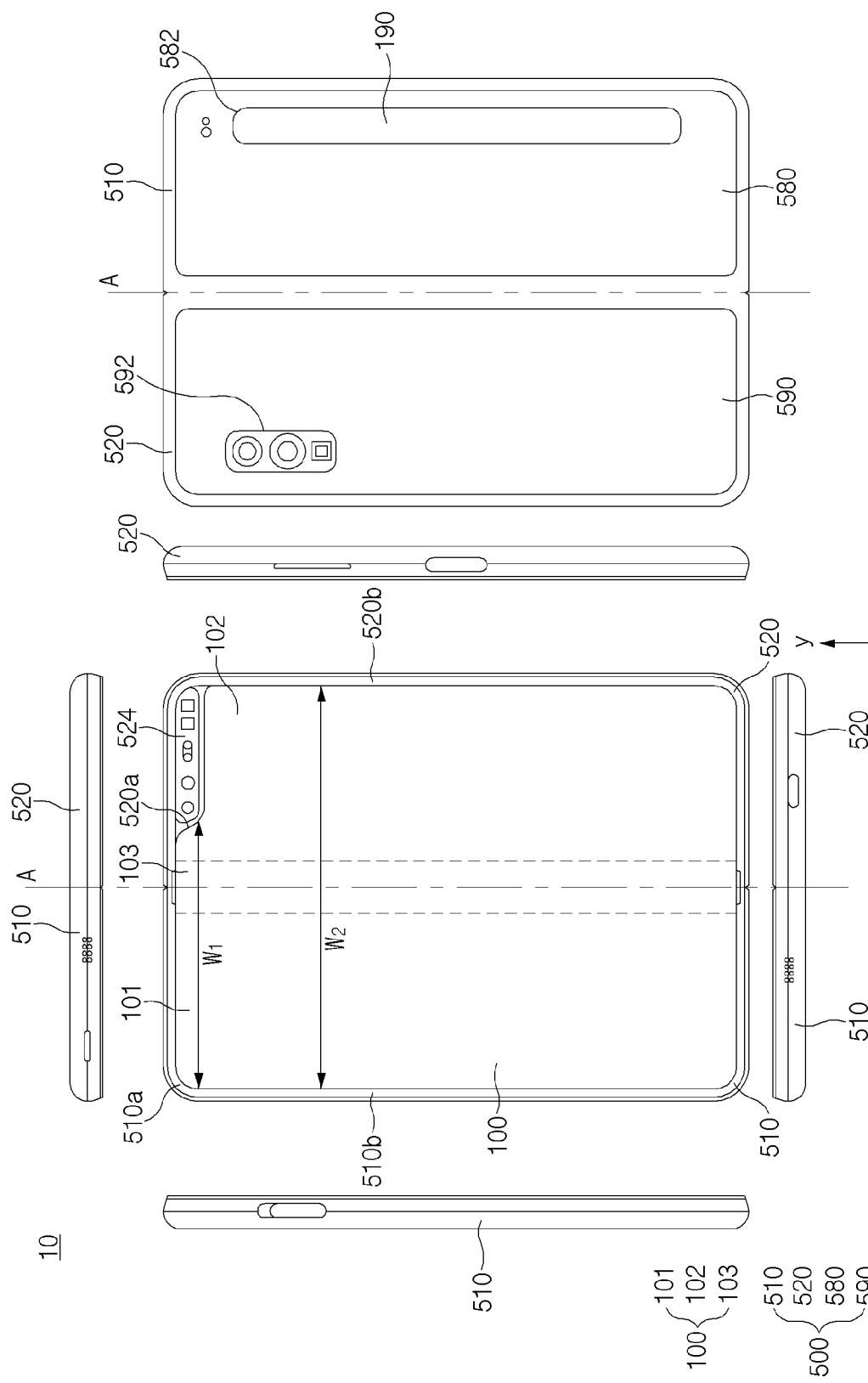
FIG. 1 illustrates a view of a flat state of an electronic device according to an embodiment.

FIGS. 1 through 27C, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the disclosure may be described with reference to accompanying drawings. Accordingly, those of ordinary skill in the art will recognize that modifications, equivalents, and/or alternatives on the various embodiments described herein can be variously made without departing from the scope and spirit of the disclosure. With regard to description of drawings, similar components may be marked by similar reference numerals.

In the disclosure, the expressions "have", "may have", "include" and "comprise", or "may include" and "may comprise" used herein indicate existence of corresponding features (e.g., components such as numeric values, functions, operations, or parts) but do not exclude presence of additional features.

In the disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in the disclosure may be used to refer to various components regardless of the order and/or the priority and to distinguish the relevant components from other components, but do not limit the components. For example, "a first user device" and "a second user device" indicate different user devices regardless of the order or priority. For example, without departing the scope of the disclosure, a first component may be referred to as a second component, and similarly, a second component may be referred to as a first component.

It will be understood that when a component (e.g., a first component) is referred to as being "(operatively or communicatively) coupled with/to" or "connected to" another component (e.g., a second component), it may be directly coupled with/to or connected to the other component or an intervening component (e.g., a third component) may be present. In contrast, when a component (e.g., a first component) is referred to as being "directly coupled with/to" or "directly connected to" another component (e.g., a second component), it should be understood that there are no intervening component (e.g., a third component).

According to the situation, the expression "configured to" used in the disclosure may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other parts. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in the disclosure are used to describe specified embodiments and are not intended to limit the scope of the disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of the disclosure. In some cases, even if terms are terms which are defined in the disclosure, they may not be interpreted to exclude embodiments of the disclosure.

An electronic device according to various embodiments of the disclosure may include at least one of, for example, smartphones, tablet personal computers (PCs), mobile phones, video telephones, electronic book readers, laptop PCs, netbook computers, mobile medical devices, cameras, or wearable devices. According to various embodiments, the wearable device may include at least one of an accessory type (e.g., watches, rings, bracelets, anklets, necklaces, glasses, contact lens, or head-mounted-devices (HMDs)), a fabric or garment-integrated type (e.g., an electronic apparel), a body-attached type (e.g., a skin pad or tattoos), or a bio-implantable type (e.g., an implantable circuit).

Hereinafter, electronic devices according to various embodiments will be described with reference to the accompanying drawings. In the disclosure, the term "user" may refer to a person who uses an electronic device or may refer to a device (e.g., an artificial intelligence electronic device) that uses the electronic device.

Figure 2:
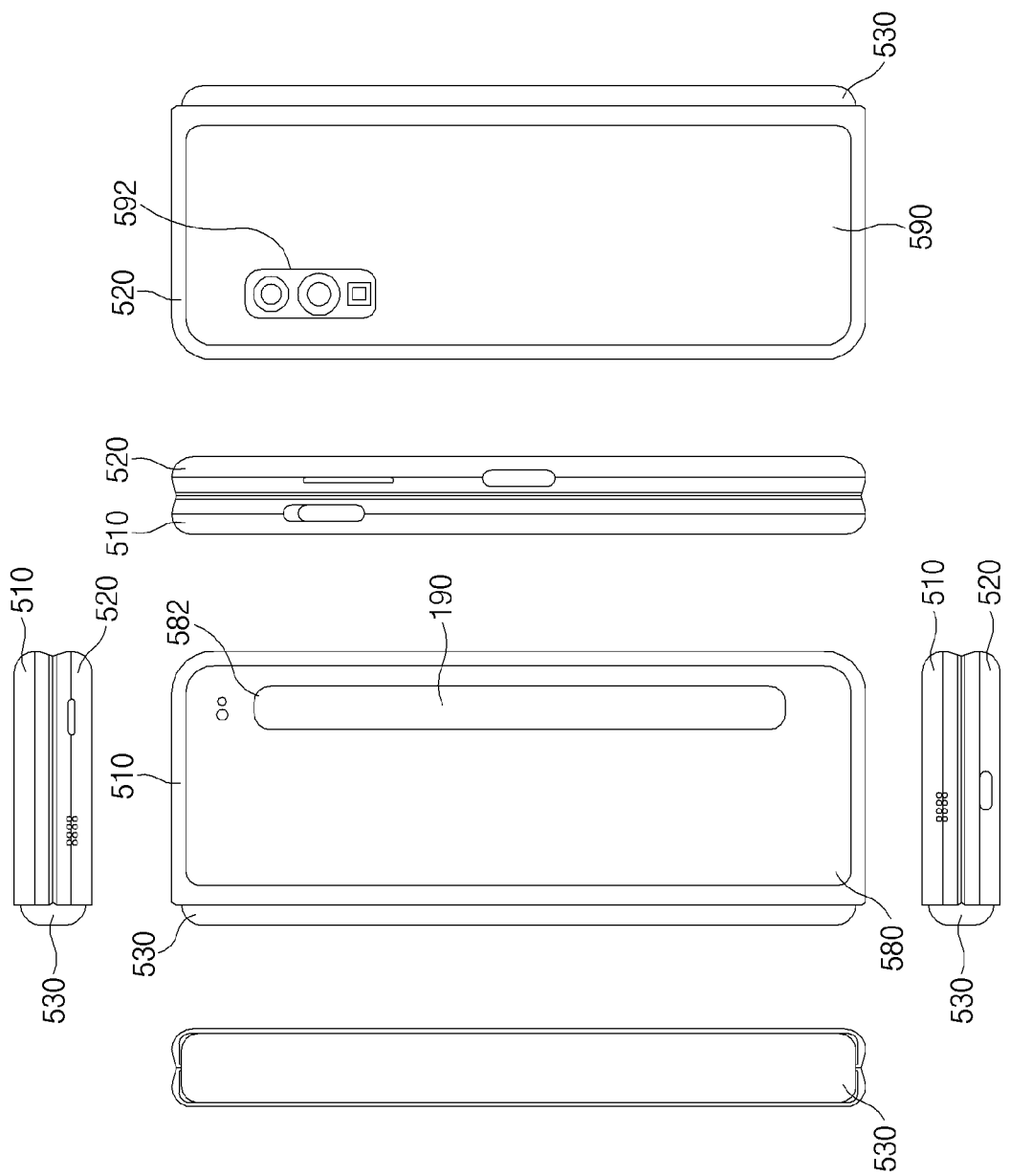
FIG. 2 illustrates a view of a folded state of the electronic device according to an embodiment.

FIG. 1 illustrates a view of a flat state of an electronic device according to an embodiment. FIG. 2 illustrates a view of a folded state of the electronic device according to an embodiment. In an embodiment, the electronic device 10 may have the flat state or the unfolded state illustrated in FIG. 1, the folded state illustrated in FIG. 2, and an intermediate state between the flat state and the folded state. As used herein, the term "folded state" refers to a "fully folded state" unless specifically stated otherwise, and an illustration of the intermediate state in which the electronic device 10 is folded with a certain angle will be separately described.

Referring to FIGS. 1 and 2, in an embodiment, the electronic device 10 may include a foldable housing 500, a hinge cover 530 that covers a foldable portion of the foldable housing 500, and a flexible or foldable display 100 (hereinafter, abbreviated to the "display 100") that is disposed in a space formed by the foldable housing 500. In this disclosure, a surface on which the display 100 is disposed is defined as a first surface or a front surface of the electronic device 10. A surface opposite to the front surface is defined as a second surface or a rear surface of the electronic device 10. A surface that surrounds a space between the front surface and the rear surface is defined as a third surface or a side surface of the electronic device 10.

In an embodiment, the foldable housing 500 may include a first housing structure 510, a second housing structure 520 including a sensor area 524, a first back cover 580, and a second back cover 590. The foldable housing 500 of the electronic device 10 is not limited to the form and the coupling illustrated in FIGS. 1 and 2 and may be implemented by a combination and/or a coupling of other shapes or parts. For example, in another embodiment, the first housing structure 510 and the first back cover 580 may be integrally formed with each other, and the second housing structure 520 and the second back cover 590 may be integrally formed with each other.

In the illustrated embodiment, the first housing structure 510 and the second housing structure 520 may be disposed on opposite sides of a folding axis (an axis A) and may have substantially symmetrical shapes with respect to the folding axis A. As will be described below, the angle or distance between the first housing structure 510 and the second housing structure 520 may vary depending on whether the electronic device 10 is in a flat, folded, or intermediate state. In the illustrated embodiment, unlike the first housing structure 510, the second housing structure 520 may additionally include the sensor area 524 in which various sensors are arranged, but may have a symmetrical shape in the other area.

In an embodiment, as illustrated in FIG. 1, the first housing structure 510 and the second housing structure 520 may form a recess together in which the display 100 is received. In the illustrated embodiment, due to the sensor area 524, the recess may have two or more different widths in a direction perpendicular to the folding axis A.

For example, the recess may have (1) a first width w1 between a first portion 510a of the first housing structure 510 that is parallel to the folding axis A and a first portion 520a of the second housing structure 520 that is formed on the periphery of the sensor area 524 and (2) a second width w2 formed by a second portion 510b of the first housing structure 510 and a second portion 520b of the second housing structure 520 that does not correspond to the sensor area 524 and that is parallel to the folding axis A. In this case, the second width w2 may be formed to be longer than the first width w1. In other words, the first portion 510a of the first housing structure 510 and the first portion 520a of the second housing structure 520 that have asymmetrical shapes may form the first width w1 of the recess, and the second portion 510b of the first housing structure 510 and the second portion 520b of the second housing structure 520 that have symmetrical shapes may form the second width w2 of the recess. In an embodiment, the first portion 520a and the second portion 520b of the second housing structure 520 may have different distances from the folding axis A. The widths of the recess are not limited to the illustrated examples. In various embodiments, the recess may have a plurality of widths by the form of the sensor area 524 or by the portions of the first housing structure 510 and the second housing structure 520 that have asymmetrical shapes.

In an embodiment, at least a part of the first housing structure 510 and the second housing structure 520 may be formed of metal or non-metal having strength selected to support the display 100.

In an embodiment, the sensor area 524 may be formed to have a predetermined area adjacent to one corner of the second housing structure 520. However, the arrangement, shape, and size of the sensor area 524 are not limited to the illustrated example. For example, in another embodiment, the sensor area 524 may be provided in another corner of the second housing structure 520 or in any area between an upper corner and a lower corner of the second housing structure 520. In an embodiment, parts embedded in the electronic device 10 to perform various functions may be exposed on the front surface of the electronic device 10 though the sensor area 524 or through one or more openings formed in the sensor area 524. In various embodiments, the parts may include various types of sensors. The sensors may include, for example, at least one of a front camera, a receiver, or a proximity sensor.

The first back cover 580 may be disposed on one side of the folding axis A on the rear surface of the electronic device 10 and may have, for example, a substantially rectangular periphery that is surrounded by the first housing structure 510. Similarly, the second back cover 590 may be disposed on an opposite side of the folding axis A on the rear surface of the electronic device 10 and may have a periphery surrounded by the second housing structure 520.

In the illustrated embodiment, the first back cover 580 and the second back cover 590 may have substantially symmetrical shapes with respect to the folding axis (the axis A). However, the first back cover 580 and the second back cover 590 do not necessarily have symmetrical shapes, and in another embodiment, the electronic device 10 may include the first back cover 580 and the second back cover 590 in various shapes. In another embodiment, the first back cover 580 may be integrally formed with the first housing structure 510, and the second back cover 590 may be integrally formed with the second housing structure 520.

In an embodiment, the first back cover 580, the second back cover 590, the first housing structure 510, and the second housing structure 520 may form a space in which various parts (e.g., a printed circuit board or a battery) of the electronic device 10 are disposed. In an embodiment, one or more parts may be disposed or visually exposed on the rear surface of the electronic device 10. For example, at least part of a sub-display 190 may be visually exposed through a first rear area 582 of the first back cover 580. In another embodiment, one or more parts or sensors may be visually exposed through a second rear area 592 of the second back cover 590. In various embodiments, the sensors may include a proximity sensor and/or a rear camera.

Referring to FIG. 2, the hinge cover 530 may be disposed between the first housing structure 510 and the second housing structure 520 to hide internal parts (e.g., hinge structures). In an embodiment, the hinge cover 530 may be hidden by part of the first housing structure 510 and part of the second housing structure 520, or may be exposed to the outside, depending on a state (e.g., a flat state or a folded state) of the electronic device 10.

For example, when the electronic device 10 is in a flat state as illustrated in FIG. 1, the hinge cover 530 may be hidden by the first housing structure 510 and the second housing structure 520 and thus may not be exposed. In another example, when the electronic device 10 is in a folded state (e.g., a fully folded state) as illustrated in FIG. 2, the hinge cover 530 may be exposed between the first housing structure 510 and the second housing structure 520 to the outside. In another example, when the electronic device 10 is in an intermediate state in which the first housing structure 510 and the second housing structure 520 are folded with a certain angle, the hinge cover 530 may be partially exposed between the first housing structure 510 and the second housing structure 520 to the outside. However, in this case, the exposed area may be smaller than that when the electronic device 10 is in a fully folded state. In an embodiment, the hinge cover 530 may include a curved surface.

The display 100 may be disposed in the space formed by the foldable housing 500. For example, the display 100 may be mounted in the recess formed by the foldable housing 500 and may form almost the entire front surface of the electronic device 10.

Accordingly, the front surface of the electronic device 10 may include the display 100, and a partial area of the first housing structure 510 and a partial area of the second housing structure 520 that are adjacent to the display 100. The rear surface of the electronic device 10 may include the first back cover 580, a partial area of the first housing structure 510 that is adjacent to the first back cover 580, the second back cover 590, and a partial area of the second housing structure 520 that is adjacent to the second back cover 590.

The display 100 may refer to a display, at least a partial area of which is able to be transformed into a flat surface or a curved surface. In an embodiment, the display 100 may include a folding area 103, a first area 101 disposed on one side of the folding area 103 (on a left side of the folding area 103 illustrated in FIG. 1), and a second area 102 disposed on an opposite side of the folding area 103 (on a right side of the folding area 103 illustrated in FIG. 1).

The areas of the display 100 illustrated in FIG. 1 are illustrative, and the display 100 may be divided into a plurality of (e.g., four or more, or two) areas according to a structure or function of the display 100. For example, in the embodiment illustrated in FIG. 1, the areas of the display 100 may be divided from each other by the folding area 103 or the folding axis (the axis A) that extends in parallel to the y-axis. However, in another embodiment, the display 100 may be divided into areas with respect to another folding area (e.g., a folding area parallel to the x-axis) or another folding axis (e.g., a folding axis parallel to the x-axis).

The first area 101 and the second area 102 may have substantially symmetrical shapes with respect to the folding area 103. However, unlike the first area 101, the second area 102 may include a notch 104 that is cut according to the presence of the sensor area 524, but in the other area, the second area 102 may be symmetric to the first area 101. In other words, the first area 101 and the second area 102 may each include a portion having a symmetrical shape and a portion having an asymmetrical shape.

Hereinafter, operations of the first housing structure 510 and the second housing structure 520 and the areas of the display 100 according to states (e.g., a flat state and a folded state) of the electronic device 10 will be described.

In an embodiment, when the electronic device 10 is in a flat state (e.g., FIG. 1), the first housing structure 510 and the second housing structure 520 may be arranged to face the same direction while forming an angle of 180 degrees. The surface of the first area 101 of the display 100 and the surface of the second area 102 thereof may face the same direction (e.g., face away from the front surface of the electronic device 10) while forming an angle of 180 degrees. The folding area 103 may form the same plane together with the first area 101 and the second area 102.

In an embodiment, when the electronic device 10 is in a folded state (e.g., FIG. 2), the first housing structure 510 and the second housing structure 520 may be arranged to face each other. The surface of the first area 101 of the display 100 and the surface of the second area 102 thereof may face each other while forming a narrow angle (e.g., an angle between 0 degrees and 10 degrees). At least part of the folding area 103 may form a curved surface having a predetermined curvature.

In an embodiment, when the electronic device 10 is in an intermediate state (e.g., FIG. 2), the first housing structure 510 and the second housing structure 520 may be arranged to have a certain angle therebetween. The surface of the first area 101 of the display 100 and the surface of the second area 102 thereof may form an angle that is greater than that in the folded state and is smaller than that in the flat state. At least part of the folding area 103 may form a curved surface having a predetermined curvature, and the curvature may be smaller than that in the folded state.

Figure 3:
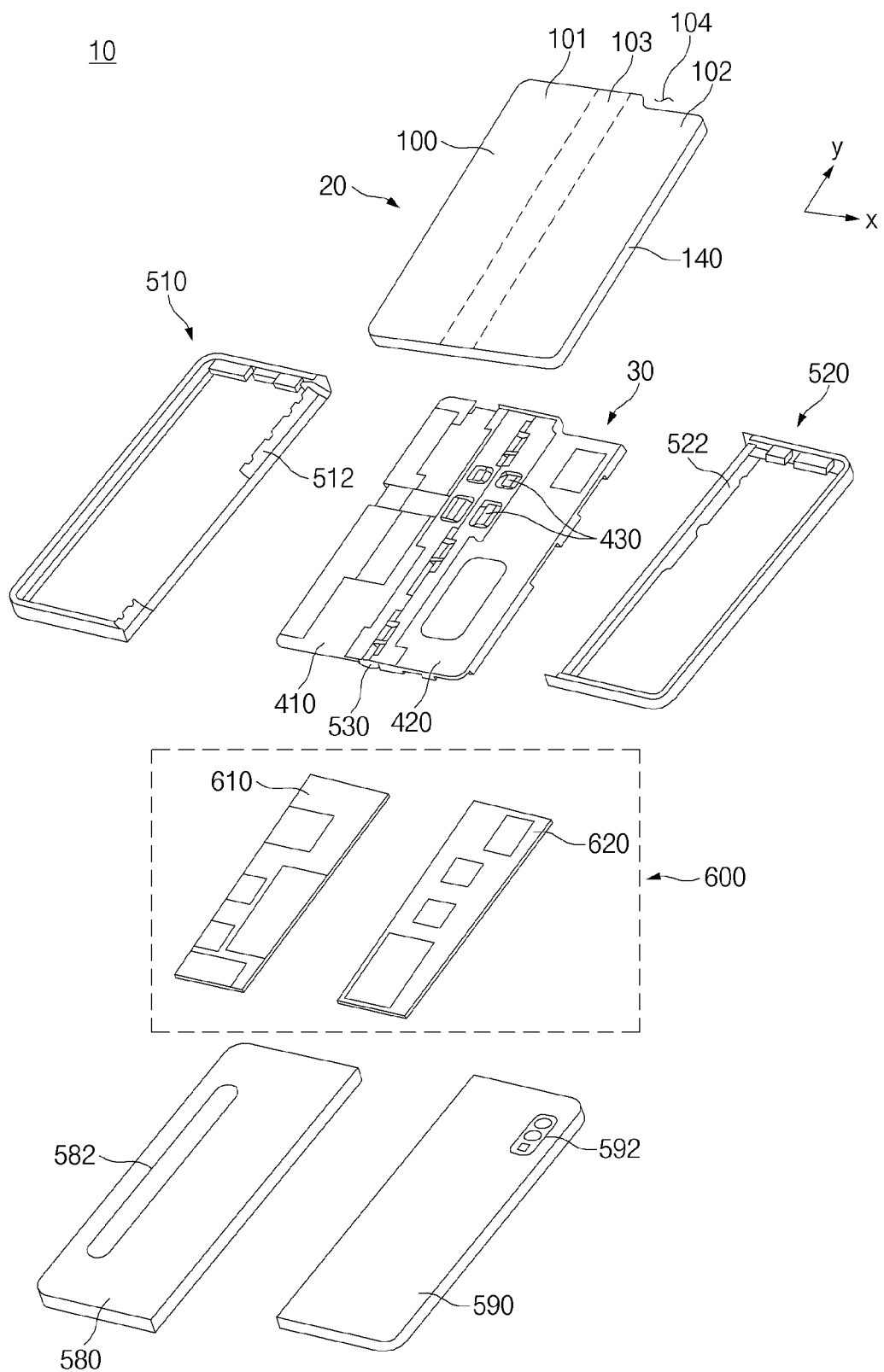
FIG. 3 illustrates an exploded perspective view of the electronic device according to an embodiment.

FIG. 3 illustrates an exploded perspective view of the electronic device according to an embodiment.

Referring to FIG. 3, in an embodiment, the electronic device 10 may include a display unit 20, a bracket assembly 30, a substrate 600, the first housing structure 510, the second housing structure 520, the first back cover 580, and the second back cover 590. In this disclosure, the display unit 20 may be referred to as the display module or the display assembly.

The display unit 20 may include the display 100 and at least one plate or layer 140 on which the display 100 is mounted. In an embodiment, the plate 140 may be disposed between the display 100 and the bracket assembly 30. The display 100 may be disposed on at least part of one surface (e.g., an upper surface with respect to FIG. 3) of the plate 140. The plate 140 may be formed in a shape corresponding to the display 100. For example, a partial area of the plate 140 may be formed in a shape corresponding to the notch 104 of the display 100.

The bracket assembly 30 may include a first bracket 410, a second bracket 420, hinge structures 300 disposed between the first bracket 410 and the second bracket 420, the hinge cover 530 that covers the hinge structures 300 when viewed from the outside, and a wiring member 430 (e.g., a flexible printed circuit (FPC)) that traverses the first bracket 410 and the second bracket 420.

In an embodiment, the bracket assembly 30 may be disposed between the plate 140 and the substrate 600. For example, the first bracket 410 may be disposed between the first area 101 of the display 100 and a first substrate 610. The second bracket 420 may be disposed between the second area 102 of the display 100 and a second substrate 620.

In an embodiment, at least a part of the wiring member 430 and the hinge structures 300 may be disposed inside the bracket assembly 30. The wiring member 430 may be arranged in a direction (e.g., the x-axis direction) across the first bracket 410 and the second bracket 420. The wiring member 430 may be arranged in a direction (e.g., the x-axis direction) that is perpendicular to a folding axis (e.g., the y-axis or the folding axis A of FIG. 1) of the folding area 103 of the electronic device 10.

As mentioned above, the substrate 600 may include the first substrate 610 disposed at the first bracket 410 side and the second substrate 620 disposed at the second bracket 420 side. The first substrate 610 and the second substrate 620 may be disposed in a space that is formed by the bracket assembly 30, the first housing structure 510, the second housing structure 520, the first back cover 580, and the second back cover 590. Parts for implementing various functions of the electronic device 10 may be mounted on the first substrate 610 and the second substrate 620.

The first housing structure 510 and the second housing structure 520 may be assembled so as to be coupled to opposite sides of the bracket assembly 30 in the state in which the display unit 20 is coupled to the bracket assembly 30. As will be described herein, the first housing structure 510 and the second housing structure 520 may slide on the opposite sides of the bracket assembly 30 and may be coupled with the bracket assembly 30.

In an embodiment, the first housing structure 510 may include a first rotation support surface 512, and the second housing structure 520 may include a second rotation support surface 522 corresponding to the first rotation support surface 512. The first rotation support surface 512 and the second rotation support surface 522 may include curved surfaces that correspond to curved surfaces included in the hinge cover 530.

In an embodiment, when the electronic device 10 is in a flat state (e.g., the electronic device 10 of FIG. 1), the first rotation support surface 512 and the second rotation support surface 522 may cover the hinge cover 530 such that the hinge cover 530 is not exposed, or is exposed to a minimum, on the rear surface of the electronic device 10. Meanwhile, when the electronic device 10 is in a folded state (e.g., the electronic device 10 of FIG. 2), the first rotation support surface 512 and the second rotation support surface 522 may rotate along the curved surfaces included in the hinge cover 530, such that the hinge cover 530 is exposed on the rear surface of the electronic device 10 to the maximum.

Figure 4:
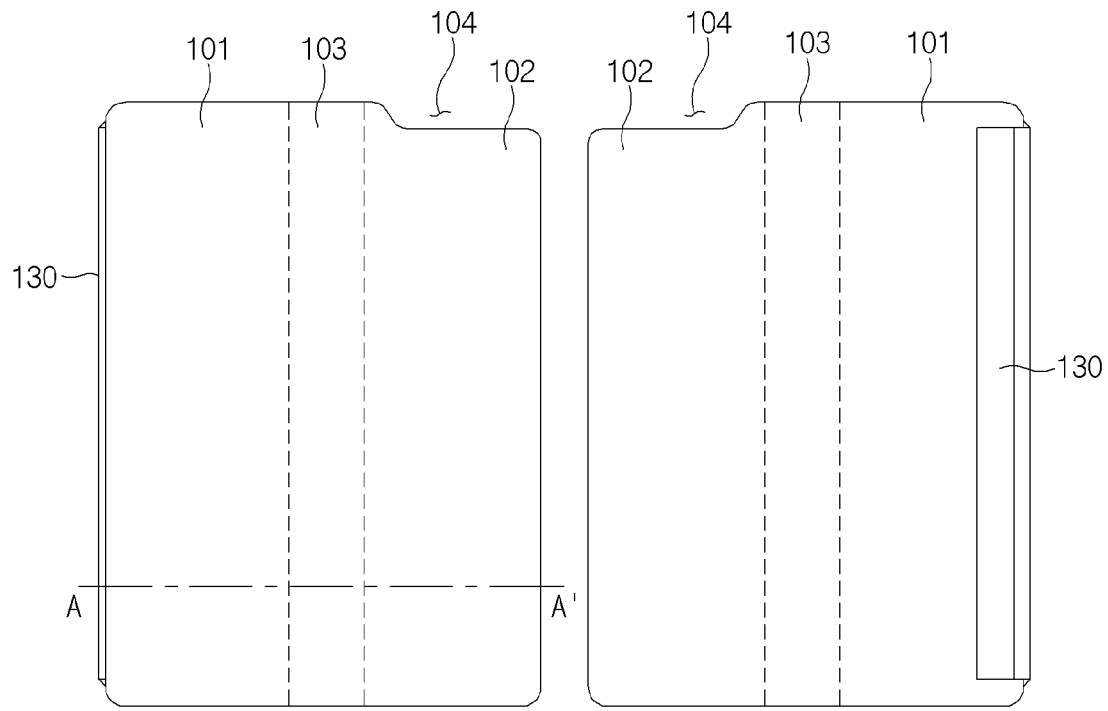
FIG. 4 illustrates a plan view and a sectional view of a display of the electronic device according to an embodiment.
Figure 4:
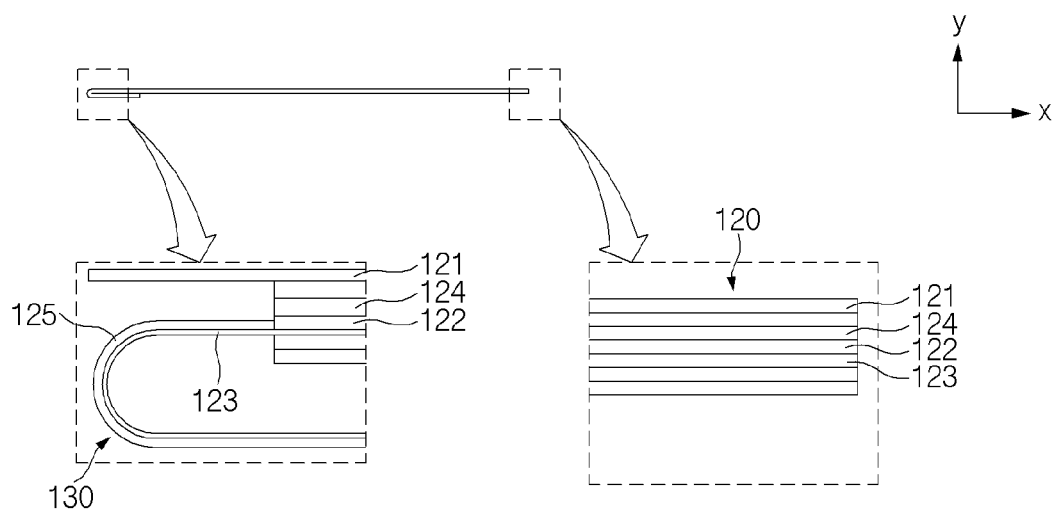

FIG. 4 illustrates a plan view and a sectional view of the display of the electronic device according to an embodiment. In the illustrated embodiment, the display 100 may include the first area 101, the second area 102, and the folding area 103 (or also referred to as the third area) when viewed from above. When the electronic device 10 is in a folded state (e.g., FIG. 2), the first area 101 and the second area 102 may face each other, and the folding area 103 may form a curved surface having a predetermined curvature. When the electronic device 10 is in a flat state (e.g., FIG. 1), the first area 101 and the second area 102 may face the same direction, and the folding area 103 may form a flat surface.

The display 100 may have a layer structure 120 including a plurality of layers 121, 122, 123, and 124. The layer structure 120 may include a polyimide (PI) layer 121 disposed to face the front surface of the electronic device 10, a display panel 122 including a plurality of light emitting elements (e.g., OLEDs), a wiring layer 123 electrically connected with the display panel 122, and a touch sensor layer 124 including a plurality of touch electrodes. In various embodiments, the layer structure 120 may further include a polarized layer and a cushion layer.

In an embodiment, at least part of the wiring layer 123 may be formed of a curved surface. The wiring layer 123 may be formed in the form of a thin film having wiring printed thereon. The wiring layer 123 may be formed by printing wiring on a PI film having flexibility.

In various embodiments, the display panel 122 may include a light emitting layer in which light emitting elements are arranged, an encapsulation layer that covers the light emitting layer, and a thin film transistor layer including thin film transistors connected to the light emitting elements.

Figure 5:
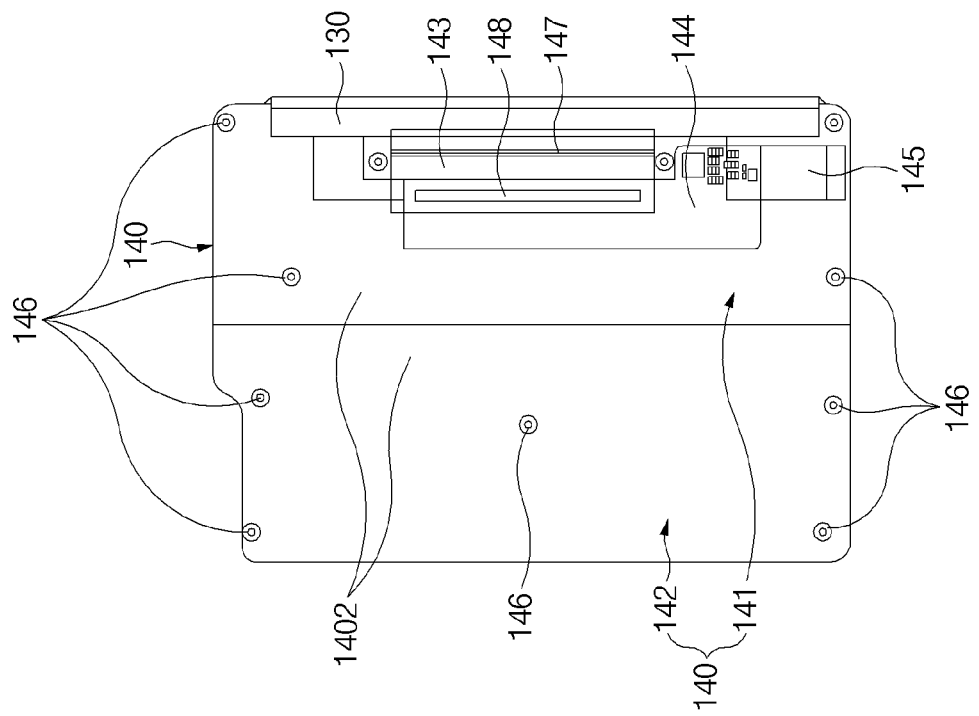
FIG. 5 illustrates a view of a display unit of the electronic device according to an embodiment.
Figure 5:
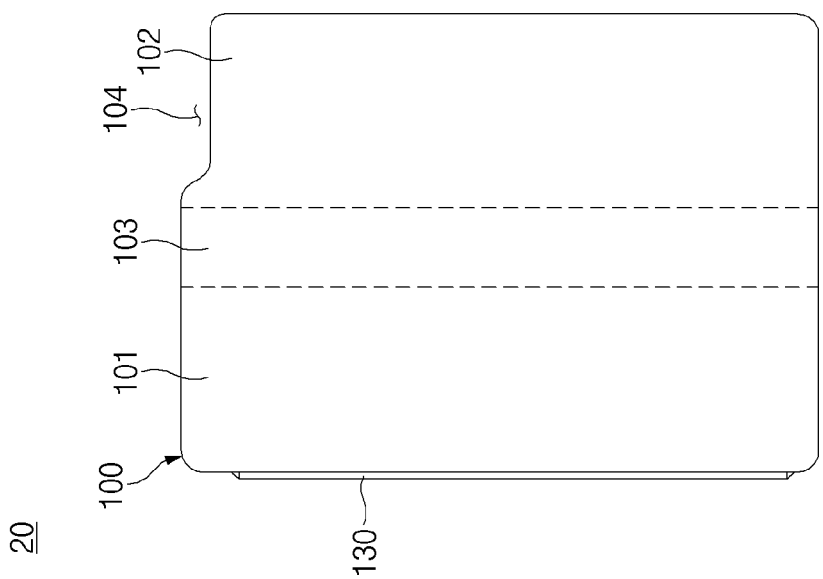

In an embodiment, the display 100 may include a first connecting part 130 that extends to a side of the display 100 (e.g., in the x-axis direction) and that is connected with a display driver IC (e.g., a display driver IC 144 of FIG. 5). One or more layers of the layer structure 120 of the display 100 may extend to form the first connecting part 130. The wiring layer 123 electrically connected with the display panel 122 may extend to form the first connecting part 130. The first connecting part 130 may be formed on a side end portion of the first area 101 and/or a side end portion of the second area 102.

In an embodiment, the first connecting part 130 may include the wiring layer 123 and a bending protection layer (BPL) 125 for protecting the wiring layer 123. At least part of the wiring layer 123 may be formed of a curved surface. The bending protection layer 125 may be formed on one surface of the wiring layer 123 and may be formed of a curved surface corresponding to the wiring layer 123 to prevent damage to the wiring layer 123.

Figure 6:
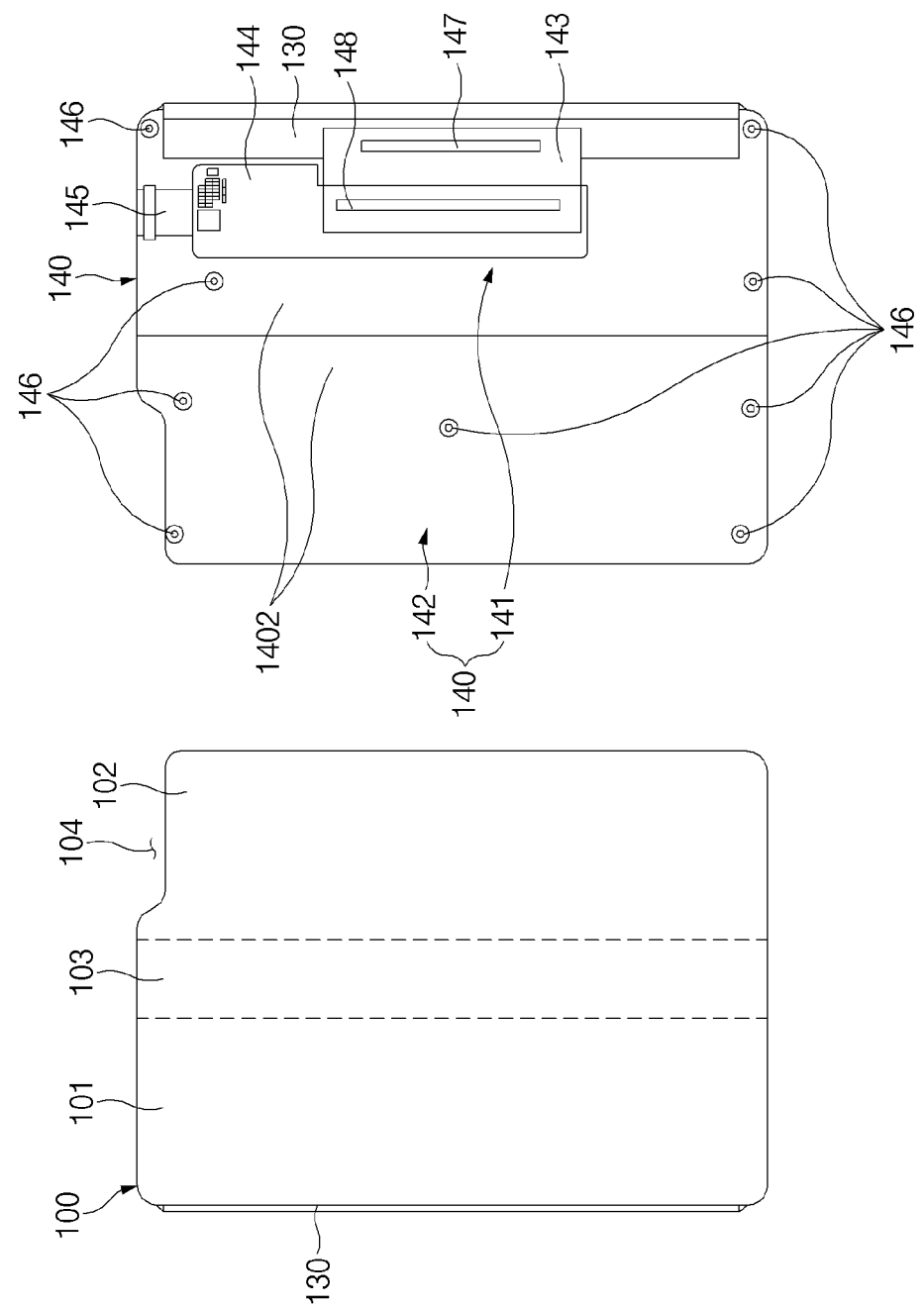
FIG. 6 illustrates a view of the display unit of the electronic device according to an embodiment.

FIGS. 5 and 6 illustrate views of the display unit of the electronic device according to an embodiment. FIGS. 5 and 6 illustrate views of the display unit 20 in which the display 100 and the plate 140 of the electronic device 10, which have been described above with reference to FIG. 3, are combined. In the illustrated embodiment, the display unit 20 may include the display 100, the plate 140 on which the display 100 is disposed, the display driver IC 144 formed on the plate 140, the first connecting part 130, a second connecting part 145, a fastening part, and a wiring film 143.

In the embodiment, the display 100 may be mounted on a first surface (e.g., a first surface 1401 of FIG. 8) of the plate 140, and the bracket assembly 30 (e.g., the bracket assembly 30 of FIG. 3) may be disposed on a second surface 1402 of the plate 140 that is opposite to the first surface (e.g., the first surface 1401 of FIG. 8) of the plate 140.

The display driver IC 144 may be disposed on at least part of the second surface 1402 of the plate 140. The display driver IC 144 may be electrically connected with the display 100 through the first connecting part 130 and may be electrically connected with main control circuitry (not illustrated) (e.g., at least one processor) that is formed on a substrate (e.g., the substrate 600 of FIG. 3) of the electronic device 10, through the second connecting part 145. The display driver IC 144 may drive the display 100 and may be controlled by the main control circuitry (e.g., a main chip 650 of FIG. 22) of the electronic device 10.

In an embodiment, at least part of the first connecting part 130 may include a curved surface having a predetermined curvature, and the curved surface may surround at least part of an end portion of the plate 140 (e.g., a left end portion of the plate 140 with respect to the front surfaces of FIGS. 5 and 6).

In an embodiment, the wiring film 143 may be formed on at least part of the second surface 1402 of the plate 140. The wiring film 143 may include a film having wiring printed thereon for electrically connecting the first connecting part 130 and the display driver IC 144.

In an embodiment, the electronic device 10 may further include a first connector 147 that connects the wiring film 143 and the first connecting part 130 and a second connector 148 that connects the wiring film 143 and the display driver IC 144. The display 100 and the display driver IC 144 may be electrically connected through the wiring film 143, the first connector 147, and the second connector 148.

In an embodiment, bosses 146 may be formed on the second surface 1402 of the plate 140 and may be coupled with corresponding bosses (e.g., corresponding bosses 490 of FIG. 16A) that are formed on the bracket assembly 30 (e.g., the bracket assembly 30 of FIG. 3). The bosses 146 and the corresponding bosses may be formed in a protruding shape, and a space may be formed between the plate 140 and the bracket assembly 30 by the coupling of the bosses 146 and the corresponding bosses. The display driver IC 144, the wiring film 143, the first connecting part 130, the second connecting part 145, the first connector 147, and the second connector 148, which have been described above, may be disposed in the space.

In an embodiment, the second connecting part 145 may be disposed on an end portion of the second surface 1402 of the plate 140. The second connecting part 145 may include a curved surface that surrounds part of an end portion of the bracket assembly 30 (e.g., the bracket assembly 30 of FIG. 3) that is disposed on the second surface 1402 of the plate 140. For example, the second connecting part 145 may be formed in the shape of "U" or "⊂". As illustrated in FIG. 5, the second connecting part 145 may be disposed on a lower side of the second surface 1402 of the plate 140. Meanwhile, as illustrated in FIG. 6, the second connecting part 145 may be disposed on an upper side of the second surface 1402 of the plate 140.

Figure 7:
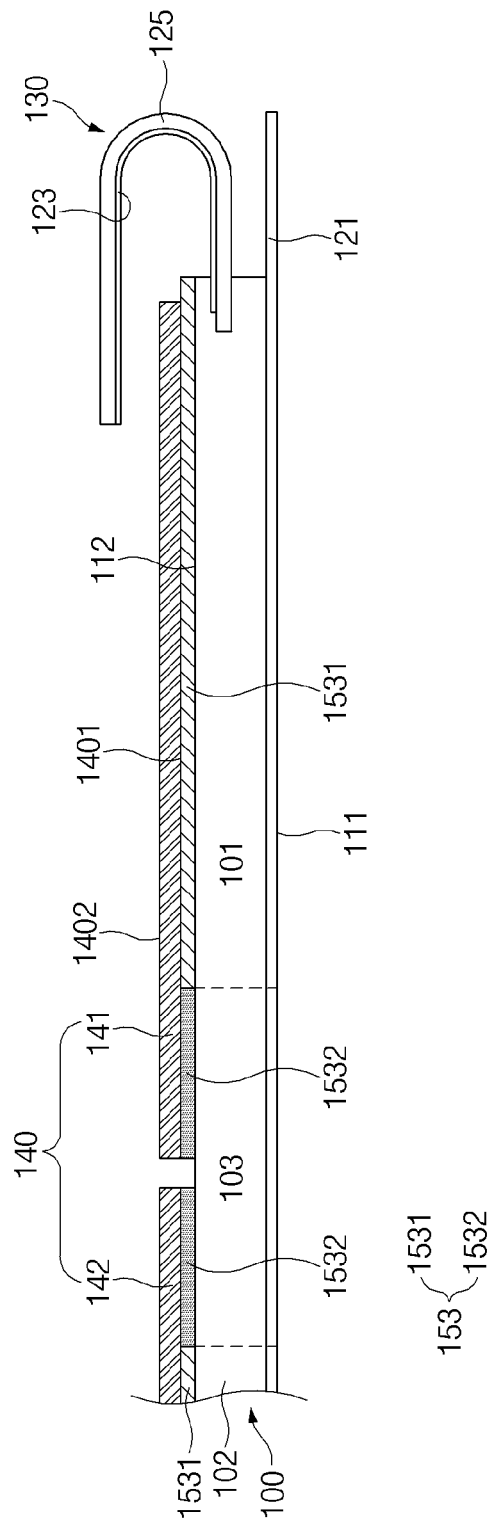
FIG. 7 illustrates a view of a portion of a cross-section of the display and a plate when the electronic device is in a flat state according to an embodiment.
Figure 8:
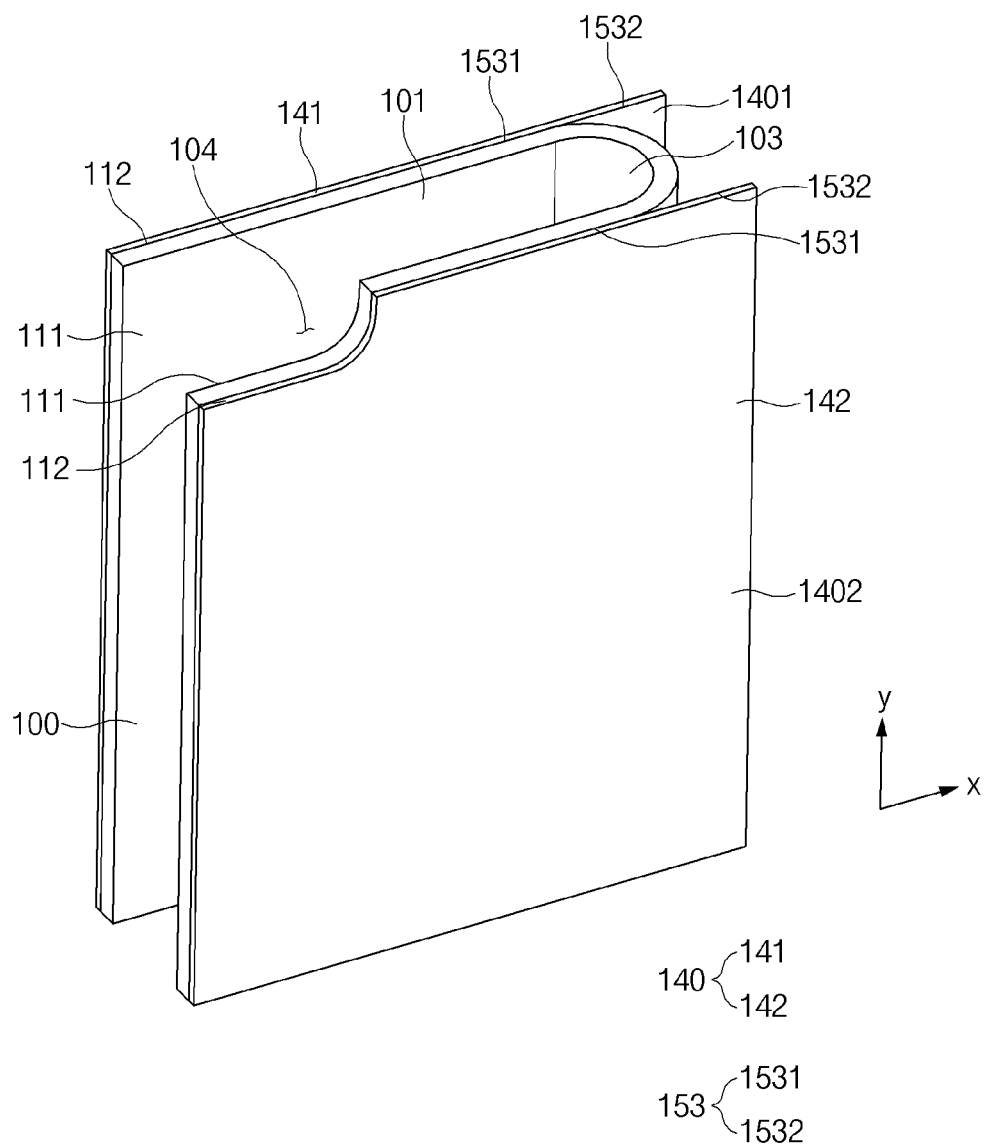
FIG. 8 illustrates a perspective view of the display and the plate when the electronic device is in a folded state according to an embodiment.

FIG. 7 illustrates a view of a portion of a cross-section of the display 100 and the plate 140 when the electronic device (e.g., the electronic device illustrated in FIGS. 5 and 6) is in a flat state according to an embodiment. FIG. 8 illustrates a perspective view of the display 100 and the plate 140 when the electronic device is in a folded state according to an embodiment.

Referring to FIG. 7, the plate 140 may include a first plate 141 on which the first area 101 and part of the folding area 103 of the display 100 are disposed and a second plate 142 on which the second area 102 and the rest of the folding area 103 of the display 100 are disposed. The plate 140 may further include an adhesive layer 153 disposed between the plate 140 and the display 100.

In an embodiment, the adhesive layer 153 may include a double-sided adhesive layer 1531 and a single-sided adhesive layer 1532 that are disposed between the display 100 and the plate 140. For example, the single-sided adhesive layer 1532 may be disposed in at least a partial area between the folding area 103 and the first plate 141 and/or the second plate 142. The single-sided adhesive layer 1532 may be bonded to the folding area 103, but may not be bonded to the first plate 141 and the second plate 142 of the plate 140.

In an embodiment, the adhesive layer 153 may be disposed only between at least part of the first plate 141 and the first area 101 of the display 100. For example, the single-sided adhesive layer 1532 may not be formed between the first plate 141 and the folding area 103. The folding area 103 may not be bonded with the first plate 141.

In an embodiment, the adhesive layer 153 may be disposed only between at least part of the second plate 142 and the second area 102 of the display 100. For example, the single-sided adhesive layer 1532 may not be formed between the second plate 142 and the folding area 103. The folding area 103 may not be bonded with the second plate 142.

Referring to FIG. 8, when the electronic device 10 is in a folded state (e.g., the electronic device of FIG. 2), part of the first plate 141 and part of the second plate 142 may be separated from the display 100. The separated parts of the first plate 141 and the second plate 142 may be unbonded areas to which the display 100 is not bonded, or the single-sided adhesive 1532 bonded to only the folding area 103 of the display 100. The unbonded areas or the single-sided adhesive layer 1532 may correspond to the folding area of the display 100.

Referring to FIG. 8, the display 100 may include the first area 101, the second area 102 (not shown), and the folding area 103. When the electronic device 10 is in a folded state, at least part of the folding area 103 may form a curved surface, and the first area 101 and the second area 102 may be flat. A first surface 111 included in the first area 101 and a first surface 111 included in the second area 102 may face each other. A second surface 112 included in the first area 101 and a second surface 112 included in the second area 102 may face opposite directions.

Referring again to FIG. 7, when the electronic device 10 is in a flat state (e.g., the electronic device of FIG. 1), the first area 101, the second area 102, and the folding area 103 may be flat. In an embodiment, when the electronic device 10 is in a folded state or an intermediate state, at least part of the folding area 103 may form a curved surface, and the first area 101 and the second area 102 may be flat. The curvature of the folding area 103 may be increased as the electronic device 10 moves from the flat state to the intermediate state.

Figure 9:
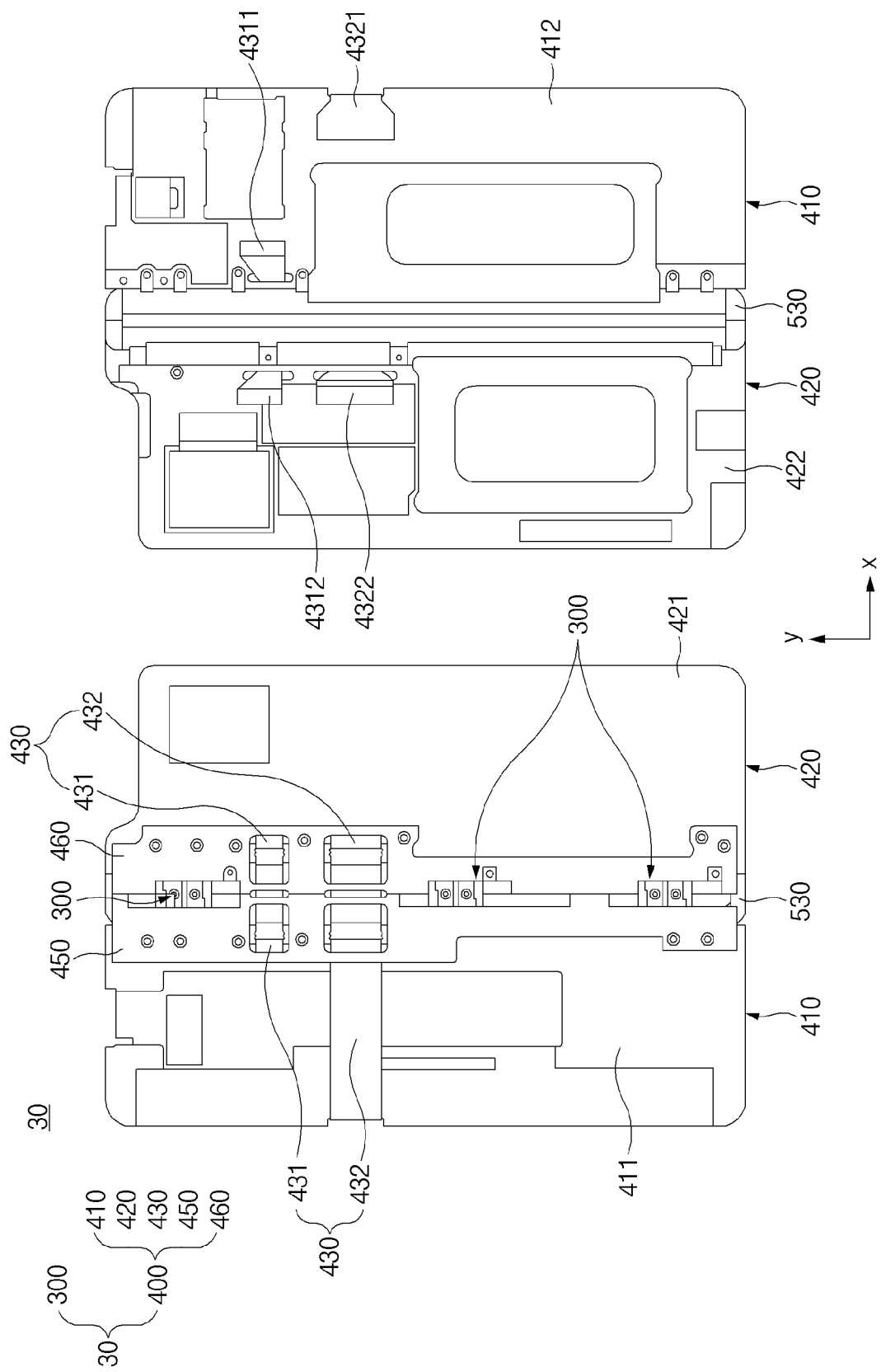
FIG. 9 illustrates a view of a front surface and a rear surface of a bracket assembly of the electronic device according to an embodiment.
Figure 10:
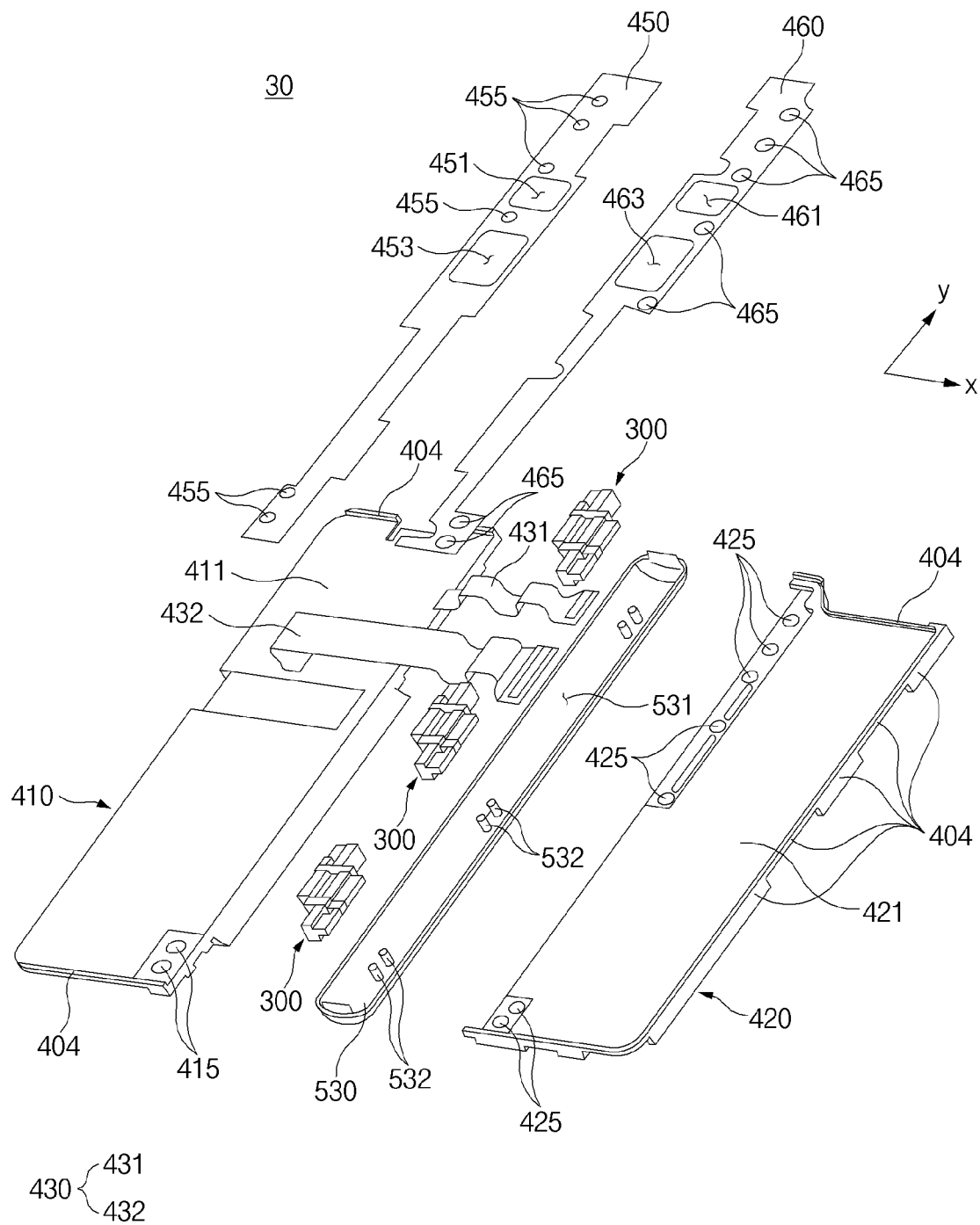
FIG. 10 illustrates an exploded perspective view of the bracket assembly of the electronic device according to an embodiment.
Figure 11A:
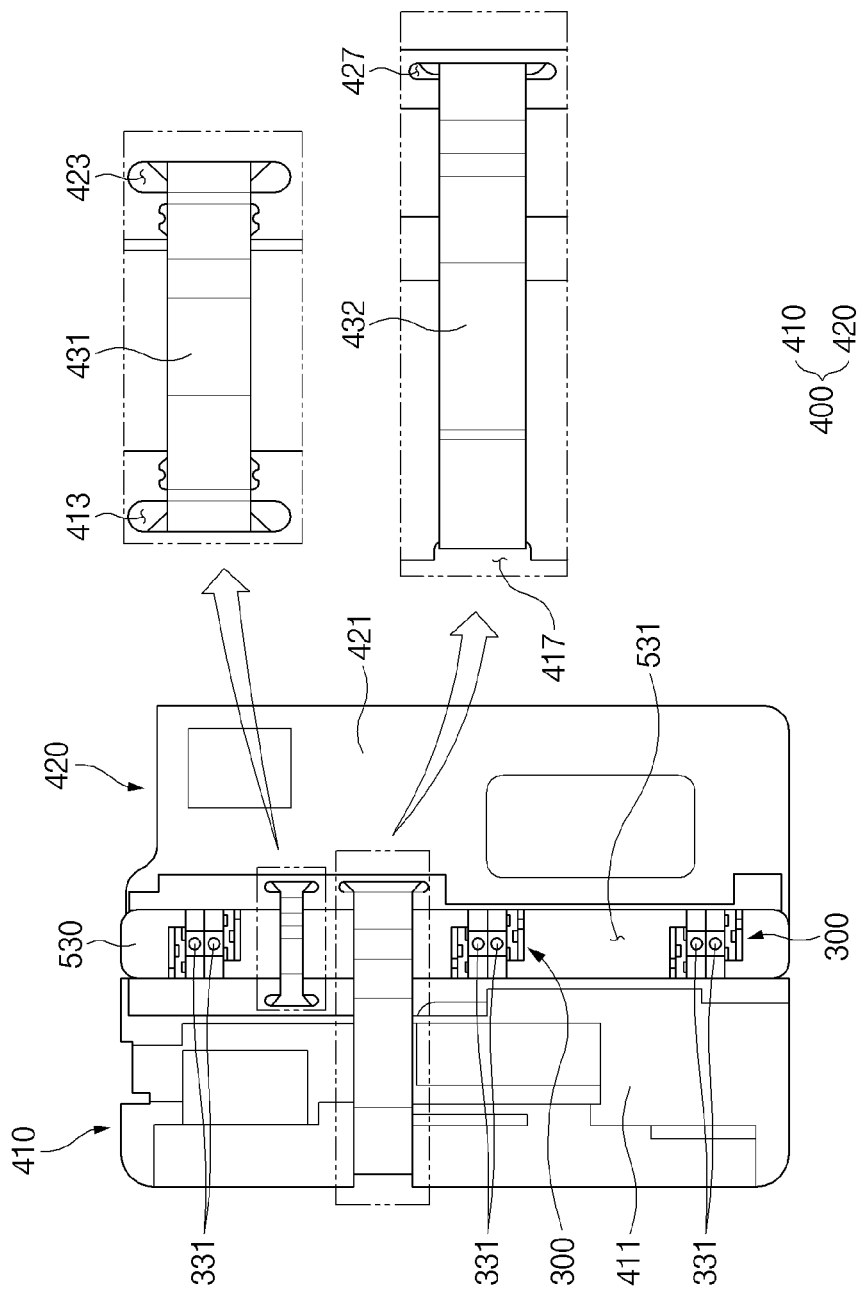
FIGS. 11A and 11B illustrate views of a wiring member of the electronic device according to an embodiment and fixation of the wiring member to a bracket.
Figure 11B:
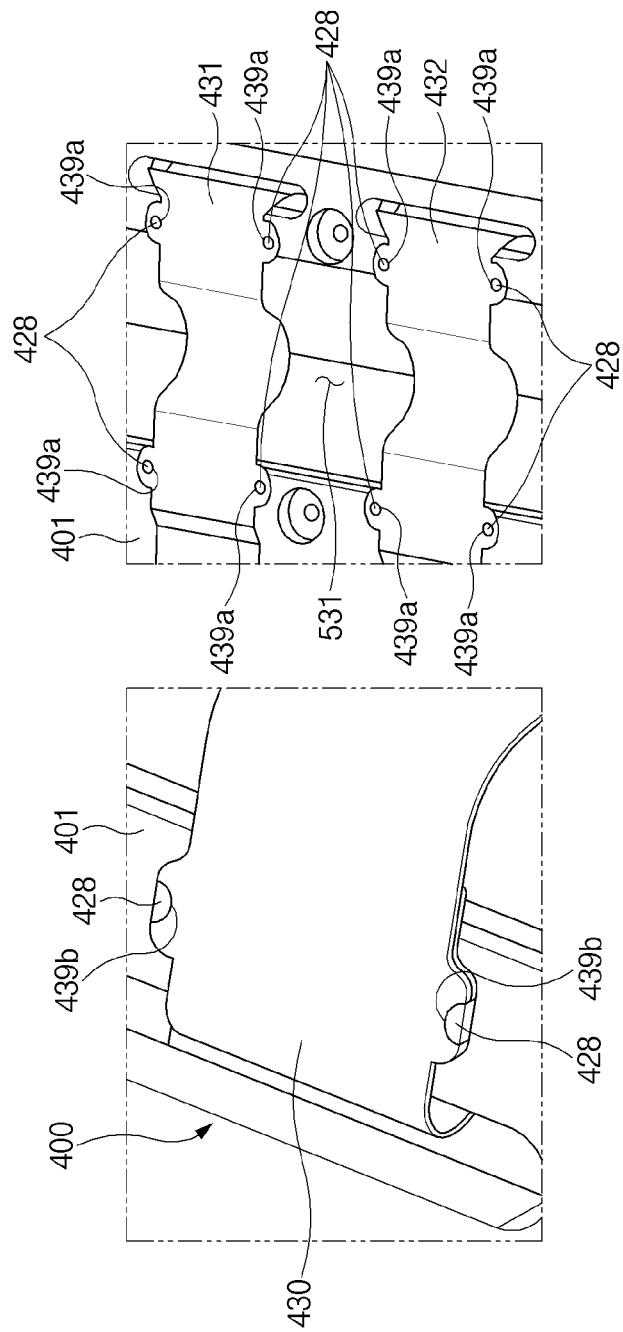

Hereinafter, one embodiment of the bracket assembly 30 illustrated in FIG. 3 will be described with reference to FIGS. 9 to 16. FIG. 9 illustrates a view of a front surface and a rear surface of a bracket assembly of an electronic device (e.g., the electronic device 10) according to an embodiment. FIG. 10 illustrates an exploded perspective view of the bracket assembly of the electronic device according to an embodiment. FIGS. 11A and 11B illustrate views of the wiring member of the electronic device according to an embodiment and fixation of the wiring member to the bracket.

Referring to FIG. 9, in an embodiment, the bracket assembly 30 may include the hinge structures 300 disposed inside the hinge cover 530 and a bracket 400. The bracket 400 may include the first bracket 410, the second bracket 420, the hinge cover 530 disposed between the first bracket 410 and the second bracket 420, a first hinge bracket 450 that connects the hinge structures 300 and the first bracket 410, a second hinge bracket 460 that connects the hinge structures 300 and the second bracket 420, and the wiring member 430.

In an embodiment, the first bracket 410 may include a first surface 411 on which the plate 140 is disposed and a second surface 412 opposite to the first surface 411. The first bracket 410 may be connected with the hinge structures 300 by the first hinge bracket 450. The wiring member 430 may be disposed on the first surface 411 of the first bracket 410.

In an embodiment, the second bracket 420 may include a first surface 421 on which the plate 140 is disposed and a second surface 422 opposite to the first surface 421. The second bracket 420 may be connected with the hinge structures 300 by the second hinge bracket 460. The wiring member 430 may be disposed on the first surface 421 of the second bracket 420.

In an embodiment, as will be described herein, the first bracket 410 and the second bracket 420 may be foldably connected together by the hinge structures 300 and the hinge brackets 450 and 460. When the electronic device 10 is in a folded state, the first surface 411 of the first bracket 410 and the first surface 421 of the second bracket 420 may face each other. When the electronic device 10 is in a flat state, the first surface 411 of the first bracket 410 and the first surface 421 of the second bracket 420 may face the same direction.

In an embodiment, the electronic device 10 may include one or more hinge structures 300. The one or more hinge structures 300 may be disposed inside the hinge cover 530. The one or more hinge structures 300 may be arranged in the y-axis direction. The hinge structures 300 may be fixedly located inside the hinge cover 530 and may be disposed in an area corresponding to the folding area 103 of the display 100. At least one wiring member 430 may be disposed between the hinge structures 300. As will be described herein, the hinge structures 300 may be connected with the bracket 400 by the hinge brackets 450 and 460, and the first bracket 410 and the second bracket 420 may be folded by the hinge structures 300. Specific contents will be described below with reference to FIG. 12.

Referring to FIG. 10, in an embodiment, the bracket assembly 30 may further include the first hinge bracket 450 coupled to the first bracket 410 and the second hinge bracket 460 coupled to the second bracket 420. The first hinge bracket 450 and the second hinge bracket 460 may connect the hinge structures 300 with the first bracket 410 and the second bracket 420, respectively.

In an embodiment, a first guide hole 451 and a third guide hole 453 may be formed in the first hinge bracket 450. A second guide hole 461 and a fourth guide hole 463 may be formed in the second hinge bracket 460. At least a part of the wiring member 430 may be inserted into the guide holes 451, 453, 461, and 463. The guide holes 451, 453, 461, and 463 may partially guide movements of the wiring member 430 when the electronic device 10 is folded. For example, at least part of a first wiring member 431 may be inserted into the first guide hole 451 formed in the first hinge bracket 450 and the second guide hole 461 formed in the second hinge bracket 460. At least part of a second wiring member 432 may be inserted into the third guide hole 453 formed in the first hinge bracket 453 and the fourth guide hole 463 formed in the second hinge bracket 460.

In an embodiment, the bracket assembly 30 may include at least one wiring member 430. The wiring member 430 may be arranged in a direction (e.g., the x-axis direction) that is perpendicular to the folding axis (e.g., the y-axis direction). The wiring member 430 may traverse the first bracket 410 and the second bracket 420 that are disposed on opposite sides of the hinge structures 300. The wiring member 430 may be made of a flexible conductive material and may thus be prevented from being damaged according to folding of the electronic device 10. In various embodiments, the extension direction of the wiring member 430 is not necessarily limited to the direction (e.g., the x-axis direction) perpendicular to the folding axis.

In an embodiment, the wiring member 430 may include the first wiring member 431 and the second wiring member 432. At least part of the first wiring member 431 may be exposed on the first surface 411 of the first bracket 410 and the first surface 421 of the second bracket 420 through the first guide hole 451 and the second guide hole 461. Likewise, at least part of the second wiring member 432 may be exposed on the first surface 411 of the first bracket 410 and the first surface 421 of the second bracket 420 through the third guide hole 453 and the fourth guide hole 463.

Referring again to FIG. 9, in an embodiment, the first wiring member 431 may include a third connector 4311 and a fourth connector 4312 formed on opposite end portions thereof, and the second wiring member 432 may include a fifth connector 4321 and a sixth connector 4322 formed on opposite end portions thereof. The third connector 4311 and the fifth connector 4321 may be disposed on the second surface 412 of the first bracket 410, and the fourth connector 4312 and the sixth connector 4322 may be disposed on the second surface 422 of the second bracket 420. The connectors may be electrically connected to a first substrate (e.g., the first substrate 610 of FIG. 3) that is disposed on the second surface 412 of the first bracket 410 and/or a second substrate (e.g., the second substrate 620 of FIG. 3) that is disposed on the second surface 422 of the second bracket 420.

Referring to FIGS. 9 and 11A, a first opening 413 may be formed in the first bracket 410, and a second opening 423 may be formed in the second bracket 420. The first opening 413 and the second opening 423 may be disposed in a direction (e.g., the x-axis direction) across the first bracket 410 and the second bracket 420. The hinge structure 300 may be disposed between the first opening 413 and the second opening 423. The first wiring member 431 may extend from the second surface 412 of the first bracket 410 through the first opening 413 to the first surface 411 of the first bracket 410. The first wiring member 431 extending to the first surface 421 of the second bracket 420 may extend to the second surface 422 of the second bracket 420 through the second opening 423.

Referring to FIGS. 9 and 11A, a third opening 417 may be formed in the first bracket 410, and a fourth opening 427 may be formed in the second bracket 420. In various embodiments, the fourth opening 427 may be a groove formed in an end portion of the first bracket 410. The third opening 417 and the fourth opening 427 may be disposed in a direction (e.g., the x-axis direction) across the first bracket 410 and the second bracket 420. The hinge structure 300 may be disposed between the third opening 417 and the fourth opening 427. The second wiring member 432 may extend from the second surface 412 of the first bracket 410 through the third opening 417 to the first surface 411 of the first bracket 410. The second wiring member 432 extending to the first surface 421 of the second bracket 420 may extend to the second surface 422 of the second bracket 420 through the fourth opening 427.

Referring to FIGS. 11A and 11B, the first wiring member 431 and the second wiring member 432 may be fixed to a first surface 401 of the bracket 400. As described above, the first wiring member 431 and the second wiring member 432 may be firstly fixed by being inserted into the guide holes 451, 453, 461, and 463 and may be secondly fixed by position fixing holes 439a or position fixing recesses 439b formed in the wiring member 430 and position fixing protrusions 428 formed on the bracket 400.

In an embodiment, the position fixing protrusions 428 that are inserted into the position fixing holes 439a or the position fixing recesses 439b may be formed on the first surface 401 of the bracket 400. The position fixing protrusions 428 may have a shape corresponding to the position fixing holes 439a or the position fixing recesses 439b.

In various embodiments, the position fixing recesses 439b may be semicircular recesses as illustrated on a left side of FIG. 11B. The position fixing protrusions 428, the position fixing recesses 439b, or the position fixing holes 439a illustrated in the drawings are merely illustrative, and the fixing method is not limited to that illustrated. The disclosure may include various fixing methods for fixing the wiring member 430 to the bracket 400.

Figure 12A:
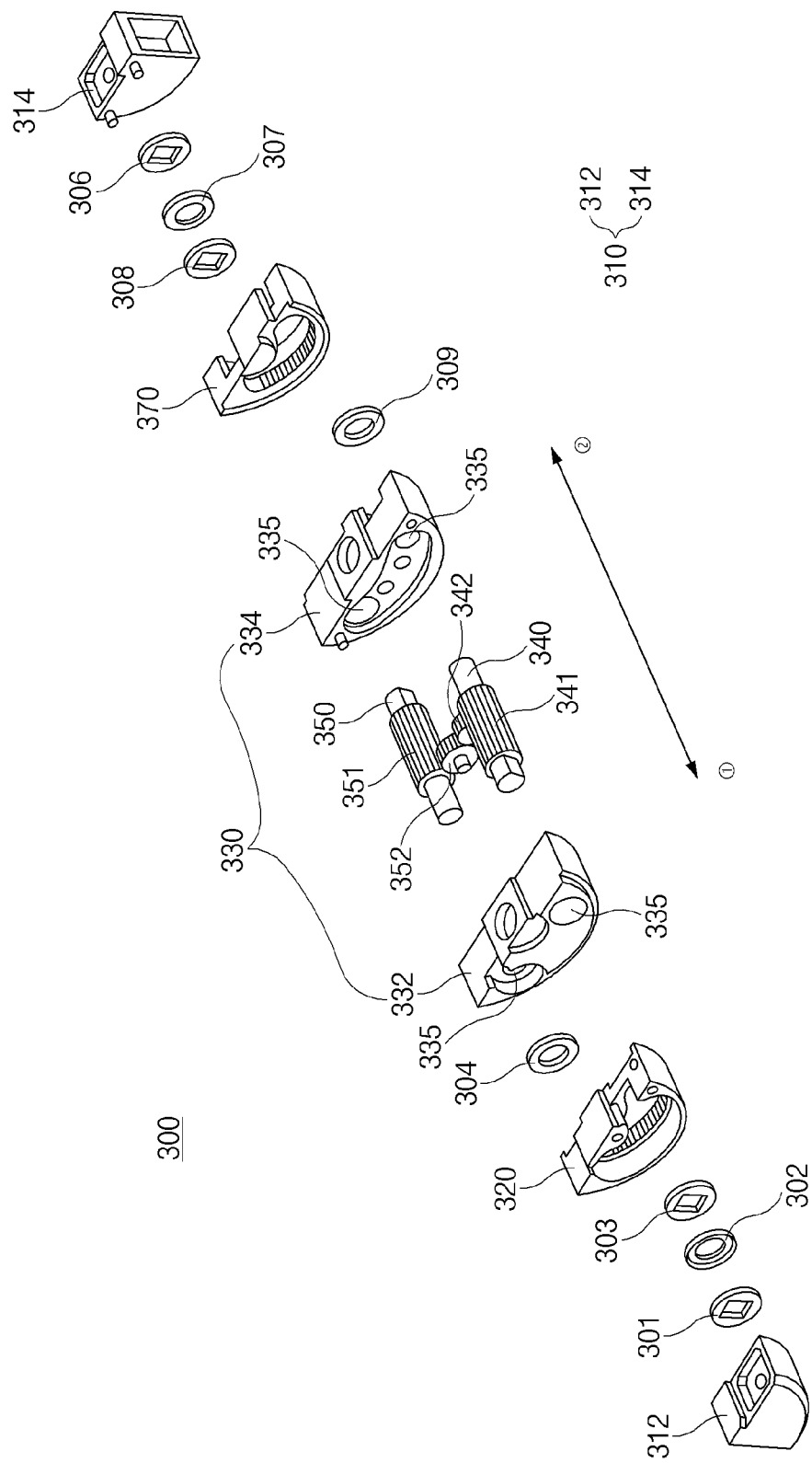
FIGS. 12A, 12B, and 12C illustrate views of one embodiment of hinge structures of the electronic device of FIGS. 9 and 10.
Figure 12B:
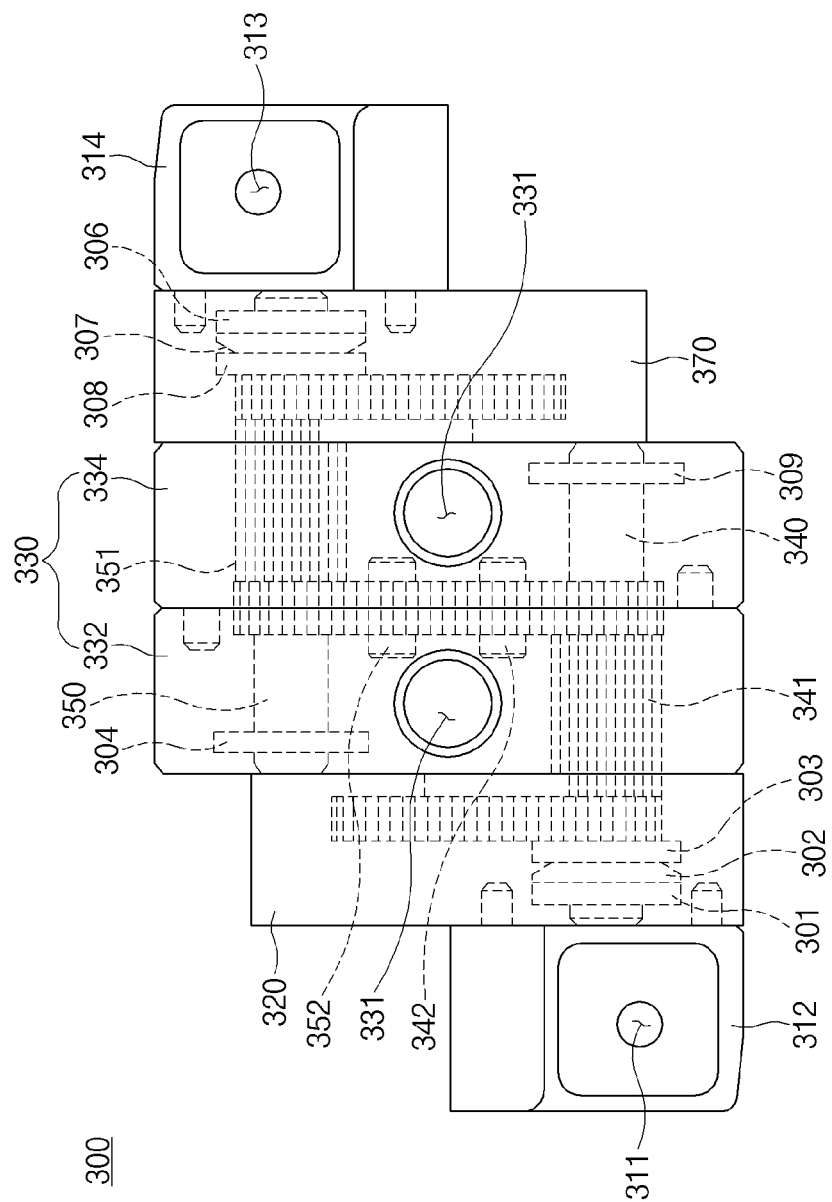
Figure 12C:
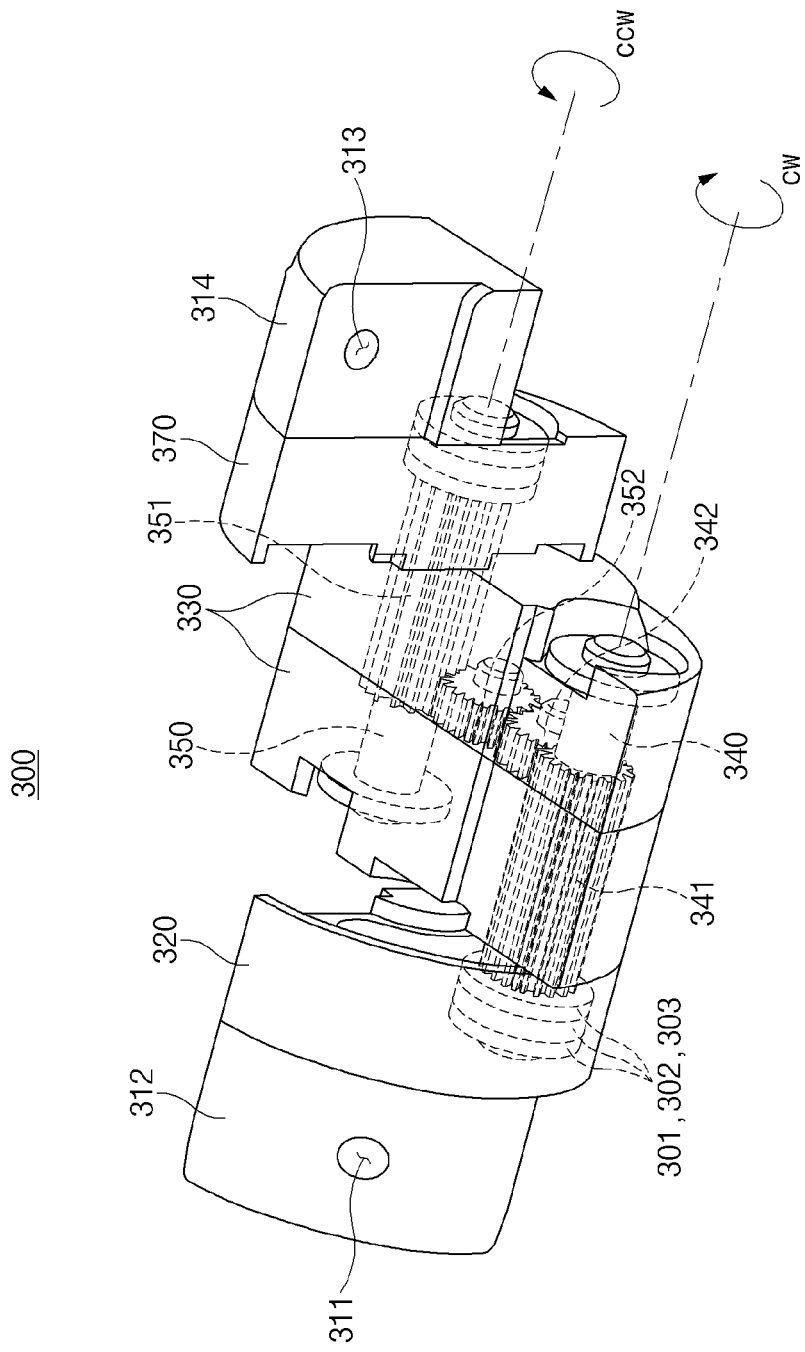

FIGS. 12A, 12B, and 12C illustrate views of one embodiment of the hinge structures 300 of the electronic device of FIGS. 9 and 10. Referring to FIGS. 12A, 12B, and 12C, in an embodiment, each of the hinge structures 300 may include a first bracket housing 312, first housing washer rings 301 and 303, a first elastic member 302, a first inner gear 320, a first gear washer ring 304, a first fixing bracket 332, a first folding shaft 340 (e.g., a spur gear), a first main gear 341, a first gear 342 (e.g., a spur gear), a second gear 352 (e.g., a spur gear), a second main gear 351, a second folding shaft 350 (e.g., a spur gear), a second fixing bracket 334, a second gear washer ring 309, a second inner gear 370, a second elastic member 307, second housing washer rings 306 and 308, and a second bracket housing 314. Here, the direction in which the first folding shaft 340 and the second folding shaft 350 extend is referred to as the axial direction. In the drawings, the left direction is referred to as the first axial direction (e.g., direction ①), and the right direction is referred to as the second axial direction (e.g., direction ②).

In an embodiment, the first main gear 341 may be formed on the first folding shaft 340. The first folding shaft 340 (or the first shaft) may pass through the first fixing bracket 332 in the first axial direction (in the left direction in the drawings) and may pass through the second fixing bracket 334 in the second axial direction (in the right direction in the drawings). The first main gear 341 formed on the first folding shaft 340 may be meshed with an internal gear of the first inner gear 320. The first folding shaft 340 may further extend in the first axial direction of the first inner gear 320 and may be coupled with the first housing washer rings 301 and 303 and the first elastic member 302. Meanwhile, the first folding shaft 340 may further extend in the second axial direction of the second fixing bracket 334 and may be coupled with the second gear washer ring 309.

In an embodiment, the second main gear 351 may be formed on the second folding shaft 350. The second folding shaft 350 (or the second shaft) may pass through the first fixing bracket 332 in the first axial direction (in the left direction in the drawings) and may pass through the second fixing bracket 334 in the second axial direction (in the right direction in the drawings). The second main gear 351 formed on the second folding shaft 350 may be meshed with an internal gear of the second inner gear 370. The second folding shaft 350 may further extend in the second axial direction of the second inner gear 370 and may be coupled with the second housing washer rings 306 and 308 and the second elastic member 307. Meanwhile, the second folding shaft 340 may further extend in the first axial direction of the first fixing bracket 332 and may be coupled with the first gear washer ring 304.

In an embodiment, the first gear 342 may be meshed, at one side thereof, with the first main gear 341 formed on the first folding shaft 340 and may be meshed, at an opposite side thereof, with the second gear 352. Accordingly, the first gear 342 may transmit torque to the second gear 352 when the first folding shaft 340 rotates. The first gear 342 may be disposed in a cavity that is formed by combining the first fixing bracket 332 and the second fixing bracket 334.

In an embodiment, the second gear 352 may be meshed, at one side thereof, with the second main gear 351 formed on the second folding shaft 350 and may be meshed, at an opposite side thereof, with the first gear 342. The second gear 352 may transmit torque to the first gear 342 when the second folding shaft 350 rotates. The second gear 352 may be disposed in the cavity that is formed by combining the first fixing bracket 332 and the second fixing bracket 334. According to various embodiments, the sizes and number of idle gears (e.g., the first gear 342 and the second gear 352) may be changed to reduce the thickness of the electronic device 10. Therefore, an electronic device (e.g., the electronic device 10 of FIG. 1) of the disclosure is not limited to the number and sizes of gears illustrated in the drawings.

In an embodiment, the first bracket housing 312 may be disposed adjacent to the first inner gear 320 and may be fixed to the first inner gear 320. For example, the first bracket housing 312 may include at least one protrusion formed thereon in the second axial direction (in the right direction in the drawings), and the at least one protrusion may be fixedly inserted into a recess formed in the first inner gear 320. The first bracket housing 312 may have a circular arc shaped section with a predetermined central angle (e.g., a right angle).

In an embodiment, an upper surface of the first bracket housing 312, as will be described herein, may be coupled (e.g., screw-coupled) with the second hinge bracket 460, and the second hinge bracket 460 may be coupled with the second bracket 420. Accordingly, when the electronic device 10 is folded, the first bracket housing 312 may be folded together with the second housing structure 520. A curved portion of the first bracket housing 312 may be formed to correspond to an inner surface of the hinge cover 530. The first bracket housing 312 may preferably be made of a material (e.g., metal) having a predetermined strength. Without being limited thereto, however, the first bracket housing 312 may be made of various materials.

In an embodiment, an upper surface of the second bracket housing 314, as will be described herein, may be coupled with the first hinge bracket 450, and the first hinge bracket 450 may be coupled with the first bracket 410. Accordingly, when the electronic device 10 is folded, the second bracket housing 314 may be folded together with the first housing structure 510. The second bracket housing 314 may have substantially the same shape and material as the first bracket housing 312 and may be disposed on the opposite side to the first bracket housing 312. For example, the second bracket housing 314 may be fixed to one surface of the second inner gear 370 that faces the second axial direction. An outer circumferential surface of the second bracket housing 314 may include a curved portion having a predetermined curvature, and the curved portion may correspond to the inner surface of the hinge cover 530.

In an embodiment, the first bracket housing 312 may be coupled to one surface of the first inner gear 320 that faces the first axial direction (the left direction in the drawings), and the first fixing bracket 332 may be disposed in the second axial direction (in the right direction in the drawings) with respect to the first inner gear 320. The first inner gear 320 may be coupled to the first fixing bracket 332 so as to be rotatable relative to the first fixing bracket 332. The first inner gear 320 and the first bracket housing 312 coupled to the first inner gear 320 may rotate along a side surface of the first fixing bracket 332. The first inner gear 320 may have a semi-elliptical shape and may include, on the inside thereof, the internal gear that is meshed with the first main gear 341 formed on the first folding shaft 340. The internal gear may be formed in the shape of a semi-elliptical arc. The first main gear 341 formed on the first folding shaft 340 may be meshed with the internal gear. The first inner gear 320 may be made of metal having a predetermined strength. For example, the first inner gear 320 may be made of the same material as that of the first bracket housing 312. The material of the first inner gear 320 described in various embodiments is not limited to a specific material.

In an embodiment, the second inner gear 370 may be disposed between the second fixing bracket 334 and the second bracket housing 314. The shape and material of the second inner gear 370 may be substantially the same as the shape and material of the first inner gear 320 described above. For example, the second inner gear 370 may have a semi-elliptical shape that is smaller in size than the second fixing bracket 334, and may include, in a predetermined area thereof, the internal gear that is meshed with the second main gear 351 formed on the second folding shaft 350.

In an embodiment, the first fixing bracket 332 may be disposed between the first inner gear 320 and the second fixing bracket 334. The first fixing bracket 332 may have a semi-elliptical shape that is larger in size than the first inner gear 320. The first fixing bracket 332 may include a hole 333 into which part of the first folding shaft 340 is inserted and a hole 335 into which part of the second folding shaft 350 is inserted. The first fixing bracket 332 may include a hole 331 vertically formed through the center thereof (from the center of a flat upper end of the semi-elliptical shape to a lower end thereof). A boss formed on the hinge cover 530 may be inserted into the hole 331 vertically formed through the first fixing bracket 332.

In an embodiment, the second fixing bracket 334 may be disposed between the first fixing bracket 332 and the second inner gear 370. The second fixing bracket 334 may have substantially the same shape as the first fixing bracket 332 (e.g., a semi-elliptical shape larger in size than the second inner gear 370). The second fixing bracket 334 may include through-holes 335 and 333 through which the first folding shaft 340 and the second folding shaft 350 pass. The second fixing bracket 334 may include a hole 331 vertically formed through the second fixing bracket 334 from an upper end to a lower end thereof, and a boss formed on the hinge cover 530 may be inserted into the hole 331.

In an embodiment, the first housing washer rings 301 and 303 may be disposed between the first bracket housing 312 and the first inner gear 320, and the first elastic member 302 may be disposed between the first housing washer rings 301 and 303. The first housing washer rings 301 and 303 and the first elastic member 302 may be mounted in a recess formed on one side of the first inner gear 320. A hole through the first inner gear 320 may be provided on the inside of the recess. Part of the first folding shaft 340 that passes through the first fixing bracket 332 and the second fixing bracket 334 may be disposed in the hole.

In an embodiment, the second housing washer rings 306 and 308 and the second elastic member 307 may be mounted in a recess (or a hole) formed on one side of the second inner gear 370 and may be coupled with the second folding shaft 350. The second elastic member 307 may be disposed between the second housing washer rings 306 and 308 to exert an elastic force on the second housing washer rings 306 and 308 in the direction of the second folding shaft 350.

In an embodiment, the first gear washer ring 304 may be disposed between the first inner gear 320 and the first fixing bracket 332. For example, the first gear washer ring 304 may be mounted in a recess (or a hole) formed on the first fixing bracket 332, while being coupled to an end portion of the second folding shaft 350. The second folding shaft 350 that passes through the first fixing bracket 332 and the second fixing bracket 334 may be inserted into the first gear washer ring 304.

In an embodiment, the second gear washer ring 309 may be mounted in a recess formed on the second fixing bracket 334, while being coupled to an end portion of the first folding shaft 340.

Referring to FIGS. 12B and 12C, in an embodiment, sides of the first fixing bracket 332 and the second fixing bracket 334 of the hinge structure 300 (e.g., the right side of the first fixing bracket 332 and the left side of the second fixing bracket 334 with respect to the drawings) may be disposed to face each other. The first folding shaft 340 may pass through the holes 333 located below with respect to the drawings, among the holes formed in the first fixing bracket 332 and the second fixing bracket 334. The first main gear 341 formed on the first folding shaft 340 may be meshed with the internal gear of the first inner gear 320. The second folding shaft 350 may pass through the holes 335 located above with respect to the drawings, among the holes formed in the first fixing bracket 332 and the second fixing bracket 335. The second main gear 351 formed on the second folding shaft 350 may be meshed with the internal gear of the second inner gear 370. The first bracket housing 312 may be coupled to the surface of the first inner gear 320 that faces the first axial direction (the left direction in the drawings), and the second bracket housing 314 may be coupled to the surface of the second inner gear 370 that faces the second axial direction (the right direction in the drawings).

In an embodiment, the first bracket housing 312 may be coupled with the second hinge bracket 460, and the second bracket housing 314 may be coupled with the first hinge bracket 450. The first hinge bracket 450 may be coupled to the first bracket 410, and the second hinge bracket 460 may be coupled to the second bracket 420.

In an embodiment, when the electronic device 10 is in a folded state (e.g., the electronic device of FIG. 2), as illustrated in FIG. 12C, the first bracket housing 312 and the first inner gear 320 may be disposed in the state of being rotated relative to the first fixing bracket 332 by a first angle (e.g., 90 degrees) in a first direction (e.g., the CW direction in the drawing) from the initial state. Likewise, the second bracket housing 314 and the second inner gear 370 may be disposed in the state of being rotated relative to the second fixing bracket 334 by the first angle (e.g., 90 degrees) in a second direction (e.g., the CCW direction in the drawing) from the initial state. The first direction and the second direction may be opposite to each other. Meanwhile, the fixing bracket 330 is not rotated because the fixing bracket 330 is fixed to the hinge cover 530.

Figure 13A:
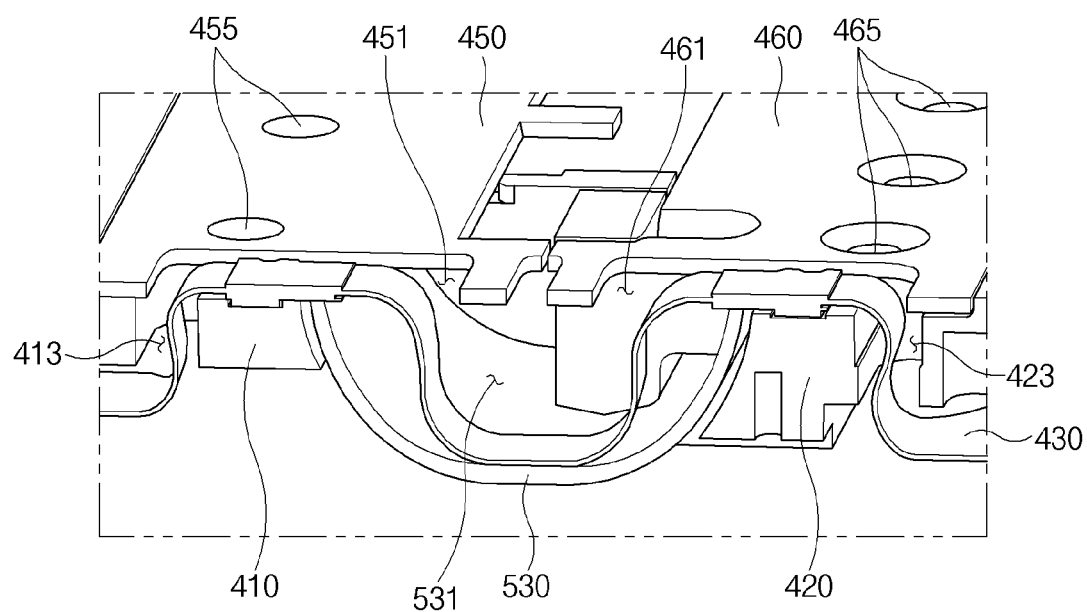
FIGS. 13A, 13B, 13C, and 13D illustrate views of the wiring member of the electronic device according to various embodiments.
Figure 13B:
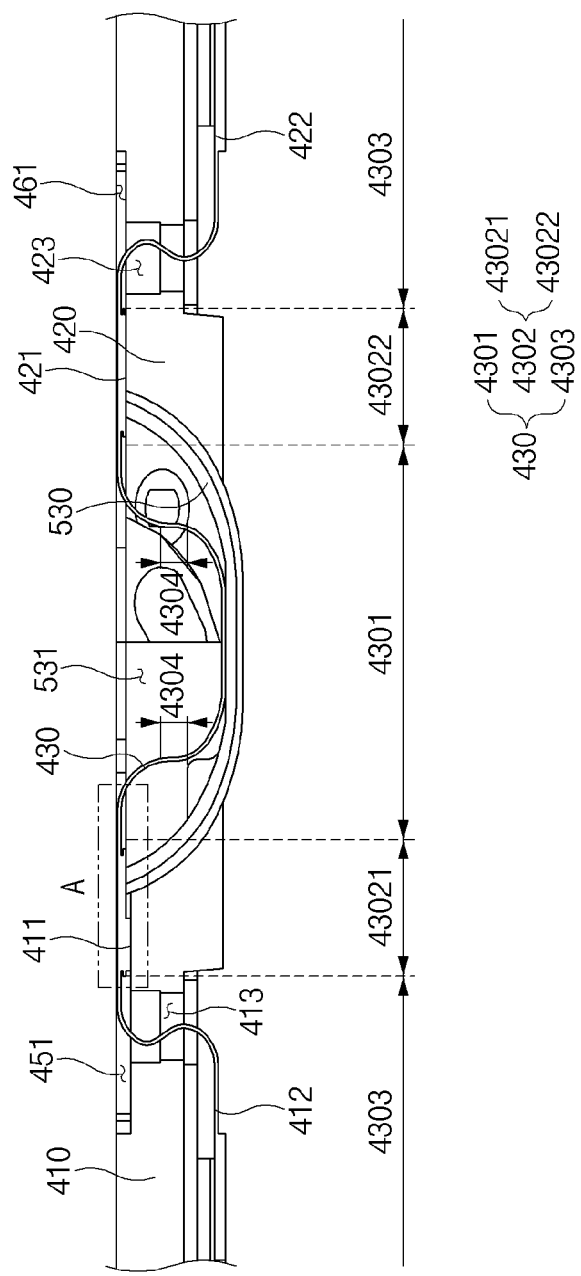
Figure 13C:
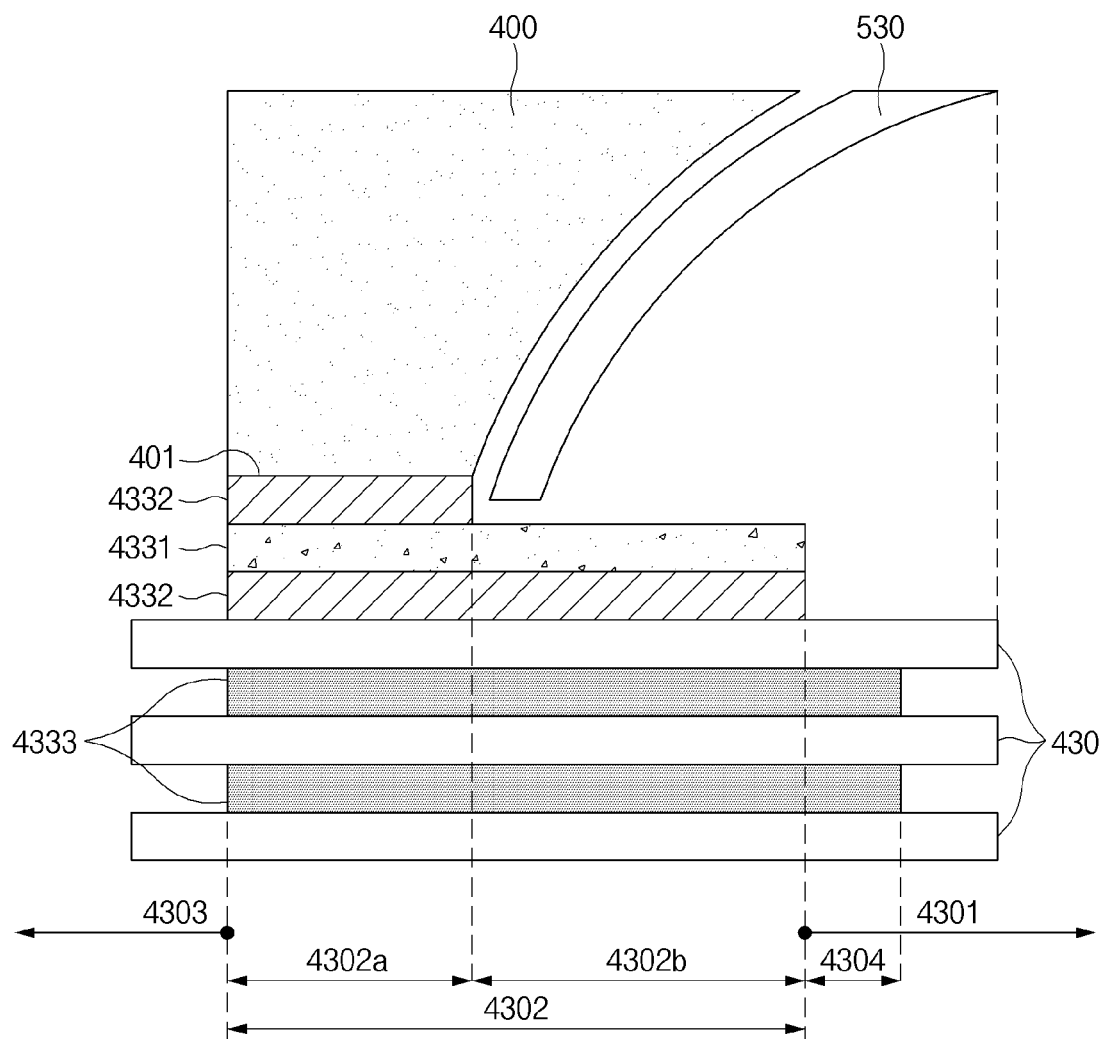

FIGS. 13A, 13B, 13C, and 13D illustrate views of the wiring member of the electronic device according to various embodiments. FIG. 13A illustrates a view of the wiring member disposed in an inner space of the hinge cover. FIG. 13B is a sectional view taken along line A-A' of FIG. 9. FIG. 13C illustrates a view of layers constituting the wiring member. Hereinafter, the wiring member 430 and a mounting structure of the wiring member 430 will be described with reference to FIGS. 13A, 13B, and 13C.

Referring to FIGS. 13A, 13B, and 13C, the wiring member 430 may extend from the first bracket 410 to the second bracket 420 across the hinge cover 530. At least part of the wiring member 430 may be disposed in an inner space 531 of the hinge cover 530. Referring to FIG. 13A, the wiring member 430 disposed in the inner space 531 of the hinge cover 530 may extend to the first bracket 410 and the second bracket 420 through the guide holes 451 and 461 and the openings 413 and 423.

Specifically, referring to FIG. 13B, the wiring member 430 may extend from the second surface 412 of the first bracket 410 through the first opening 413 to the first surface 411 of the first bracket 410. The wiring member 430 extending to the first surface 411 of the first bracket 410 may extend to the inner space 531 of the hinge cover 530 through the first guide hole 451 of the first hinge bracket 450. The wiring member 430 extending into the hinge cover 530 may extend to the first surface 421 of the second bracket 420 through the second guide hole 461 of the second hinge bracket 460. The first wiring member 430 extending to the first surface 421 of the second bracket 420 may extend to the second surface 422 again through the second opening 423 of the second bracket 420. Accordingly, the wiring member 430 may electrically connect circuit boards that are disposed on the second surface 412 of the first bracket 410 and the second surface 422 of the second bracket 420.

In an embodiment, as illustrated in FIG. 13B, the wiring member 430 may include a variable area 4301 received in the hinge cover 530, fixed areas 4302 extending from opposite sides of the variable area 4301, and extension areas 4303 extending from opposite sides of the fixed areas 4302. The fixed areas 4302 may include a first fixed area 43021 fixed to the first bracket 410 and a second fixed area 43022 fixed to the second bracket 420.

In an embodiment, the first fixed area 43021 may be attached to part of the first surface 411 of the first bracket 410 that is located between the first opening 413 formed in the first bracket 410 and the inner space 531 of the hinge cover 530. The second fixed area 43022 may be attached to part of the first surface 421 of the second bracket 420 that is located between the second opening 423 formed in the second bracket 420 and the inner space 531 of the hinge cover 530.

Figure 13D:
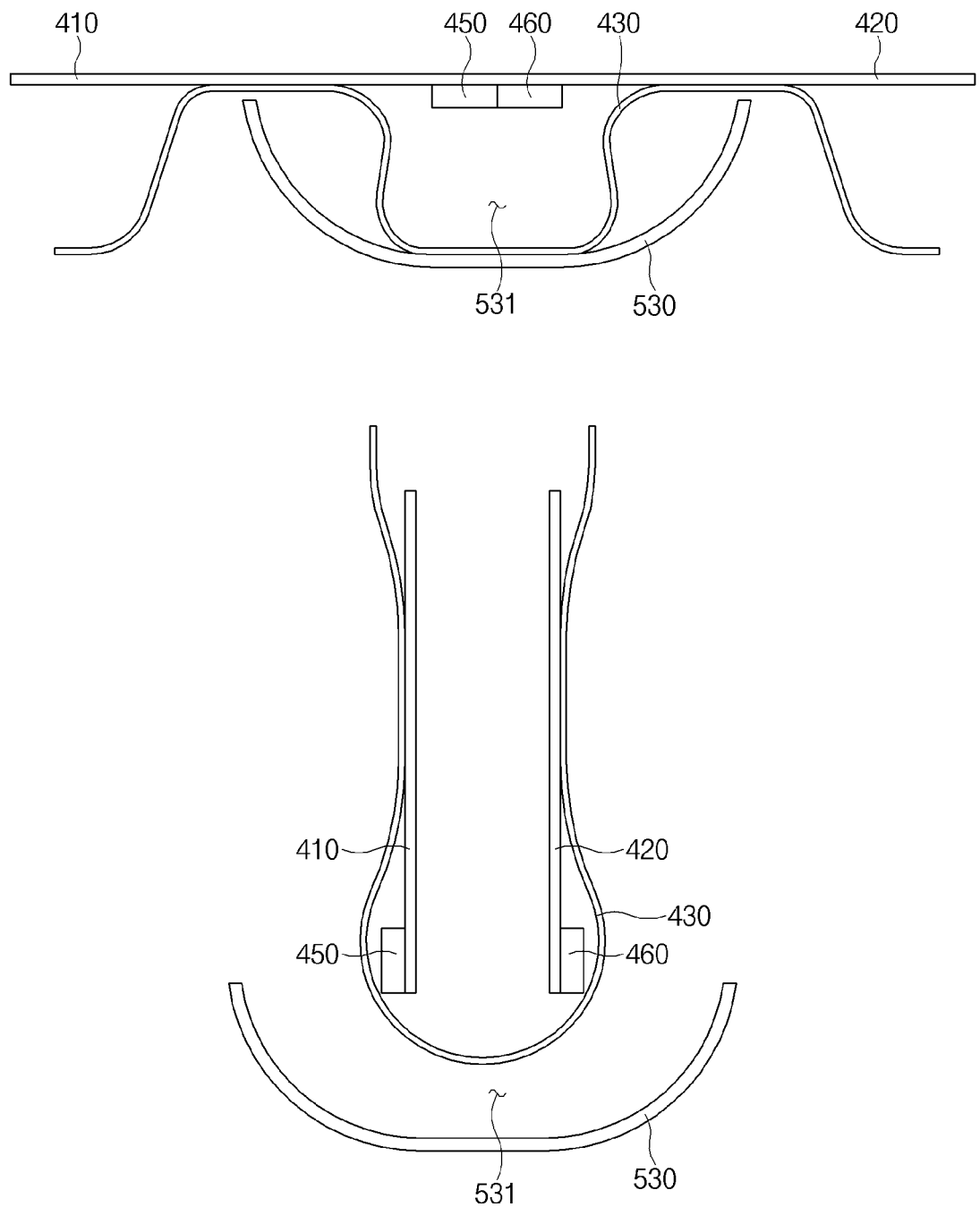

Referring to FIGS. 13B, 13C, and 13D, the variable area 4301 may be formed between the first fixed area 43021 attached to the first bracket 410 and the second fixed area 43022 attached to the second bracket 420. The variable area 4301 may be bent in the inner space 531 of the hinge cover 530 to have a predetermined curvature. When the electronic device 10 is in a flat state, the wiring member 430 may be disposed in contact with the inner surface of the hinge cover 530. When the electronic device 10 is in a folded state, the wiring member 430 may be spaced apart from the inner surface of the hinge cover 530 by a predetermined distance.

In an embodiment, the variable area 4301 may include a straight line area 4304, at least part of which is formed in a straight line. This may prevent damage to the wiring member 430 due to the hinge brackets 450 and 460 that moves into the inner space 531 of the hinge cover 530 when the hinge structure 300 rotates.

In an embodiment, the extension areas 4303 may be formed at the opposite sides of the fixed areas 4302 and may extend to the substrate disposed on the second surface of the first bracket 410 and/or the second bracket 420. At least parts of the extension areas 4303 may be disposed on the second surface 412 of the first bracket 410 and/or the second surface 422 of the second bracket 420.

Referring to FIG. 13C, the wiring member 430 may include a protection layer 4331 and a first adhesive layer 4332 that are disposed between the wiring member 430 and the first surface 401 of the bracket 400. In an embodiment, the first adhesive layer 4332 may include a double-sided tape.

The fixed areas 4302 of the wiring member 430 may include an attachment area 4302a attached to the first surface 401 of the bracket 400 by the first adhesive layer 4332 and a protection area 4302b protected by the protection layer 4331. The protection layer 4331 may be disposed below the fixed areas 4302 of the wiring member 430. The protection layer 4331 may prevent damage to the surface of the wiring member 430 due to the hinge brackets 450 and 460 that rotate to the inner space 531 of the hinge cover 530 when the hinge structure 300 performs a folding operation, or may prevent damage to the surface of the wiring member 430 due to the hinge cover 530.

In an embodiment, the protection layer 4331 may include a SUS material. Without being limited thereto, however, the protection layer 4331 may include a material having strength sufficient to protect the wiring member 430.

In an embodiment, the wiring member 430 may include a plurality of wiring layers and a second adhesive layer 4333 disposed between the wiring layers. The second adhesive layer 4333 may include a PP material.

Figure 14A:
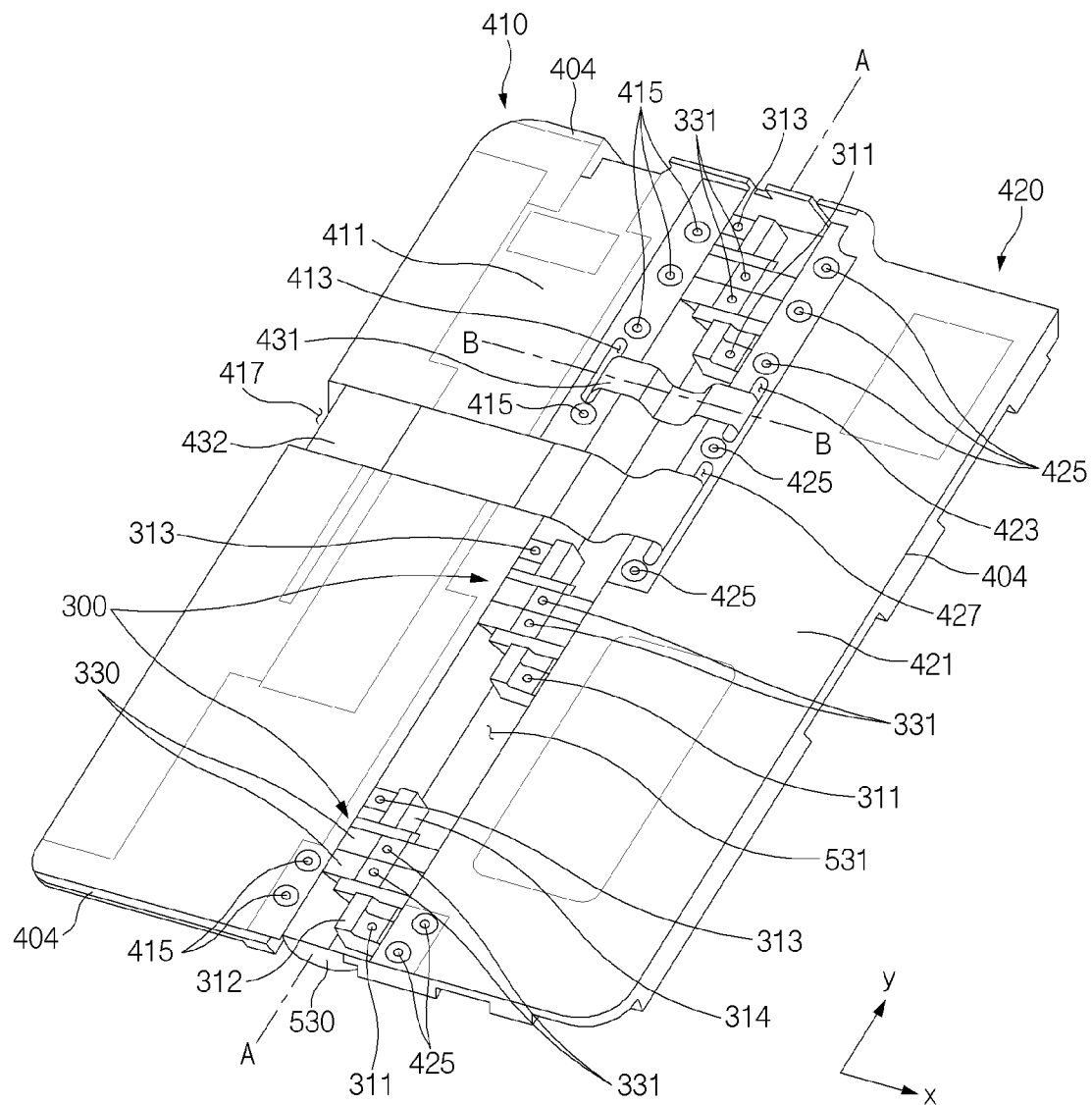
FIGS. 14A, 14B, and 14C illustrate views of a coupling relationship of the bracket assembly of the electronic device according to an embodiment.
Figure 14B:
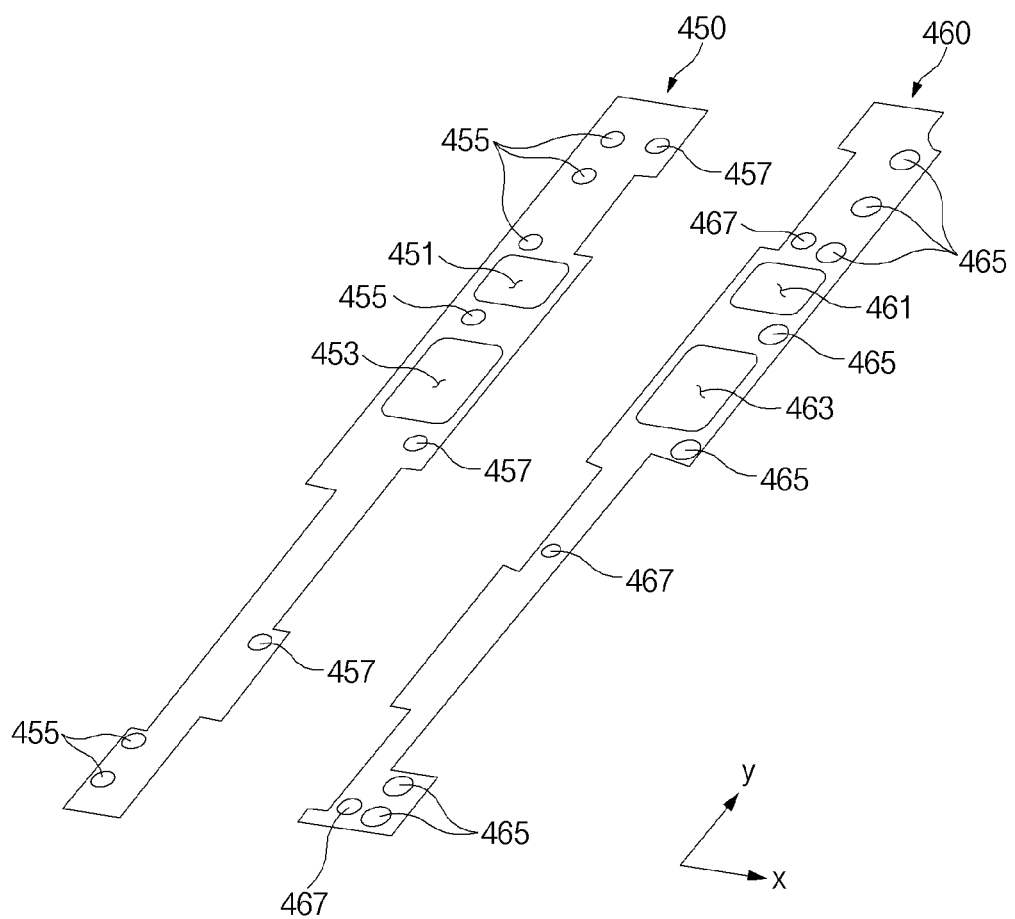
Figure 14C:
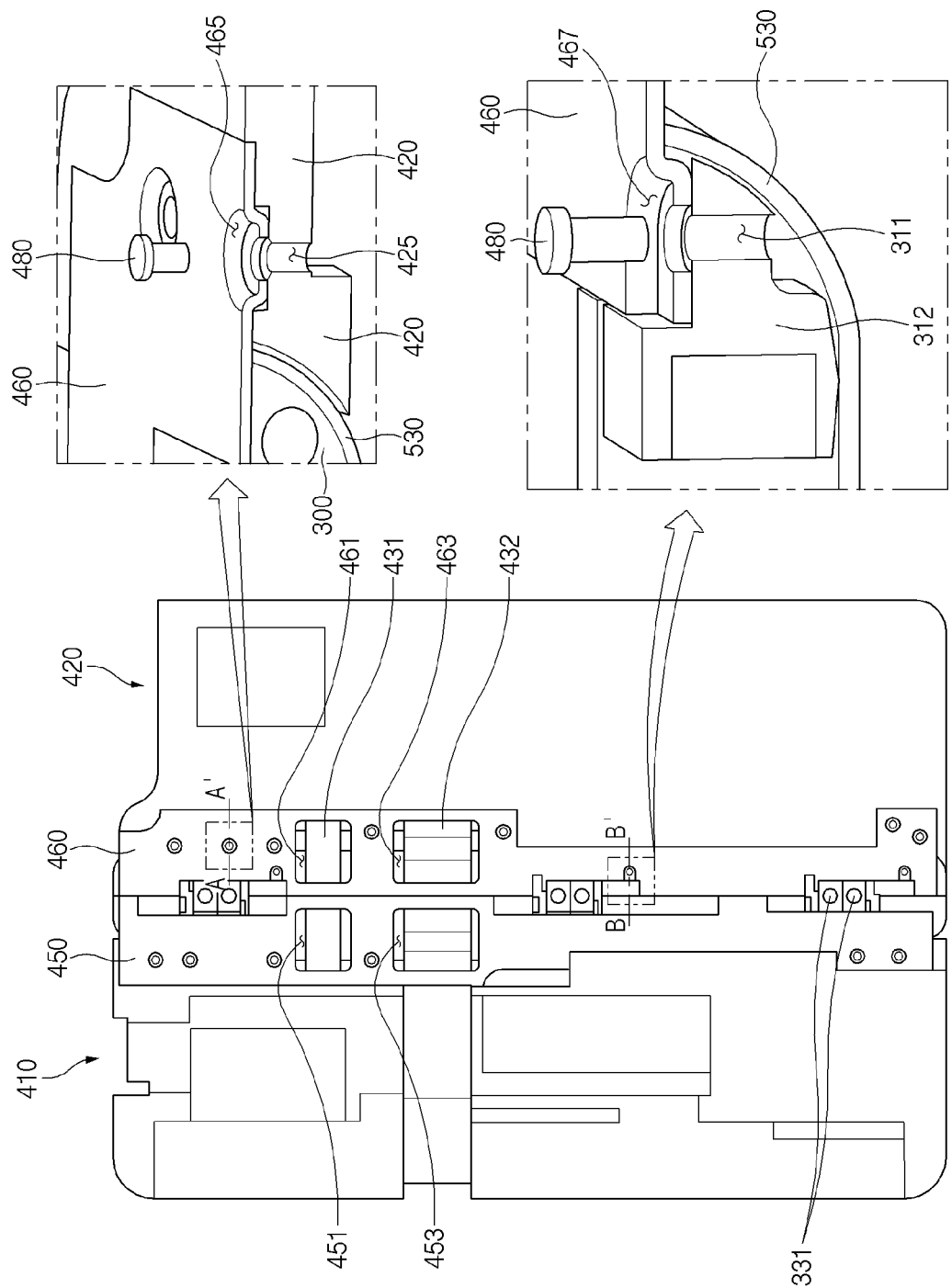

FIGS. 14A, 14B, and 14C illustrate views of a coupling relationship of the bracket assembly of the electronic device according to an embodiment. Hereinafter, coupling of the hinge cover 530, the hinge structures 300, the first hinge bracket 450, the second hinge bracket 460, the first bracket 410, and the second bracket 420, which have been described above, will be described with reference to FIGS. 14A and 14C.

Referring to FIG. 14A, the plurality of hinge structures 300 may be disposed between the first bracket 410 and the second bracket 420. Each of the hinge structures 300 may include the fixing bracket 330 fixed to the hinge cover 530, and the first bracket housing 312 and the second bracket housing 314 that are disposed on the opposite sides of the fixing bracket 330. With respect to the drawings, the first bracket housing 312 may be adjacent to the second bracket 420, and the second bracket housing 314 may be adjacent to the first bracket 410.

In an embodiment, one or more first fastening holes 415 may be formed in the first bracket 410. In an embodiment, one or more second fastening holes 425 may be formed in the second bracket 420. In an embodiment, one or more fourth fastening holes 311 may be formed in the first bracket housing 312 of the hinge structure 300. In an embodiment, one or more third fastening holes 313 may be formed in the second bracket housing 314 of the hinge structure 300. In an embodiment, one or more fixing holes 331 may be formed in the fixing bracket 330 of the hinge structure 300.

Referring to FIG. 14B, the first hinge bracket 450 and the second hinge bracket 460 may extend in a direction parallel to the folding axis (e.g., the y-axis, the first folding shaft 340 and the second folding shaft 350 of FIG. 12A). The first hinge bracket 450 may be coupled with the first bracket 410 and the hinge structure 300, and the second hinge bracket 460 may be coupled with the second bracket 420 and the hinge structure 300.

In an embodiment, first corresponding fastening holes 455 corresponding to the first fastening holes 415 formed in the first bracket 410 may be formed in the first hinge bracket 450. Third corresponding fastening holes 457 corresponding to the third fastening holes 313 formed in the second bracket housing 314 of the hinge structure 300 may be formed in the first hinge bracket 450. Second corresponding fastening holes 465 corresponding to the second fastening holes 425 formed in the second bracket 420 may be formed in the second hinge bracket 460. Fourth corresponding fastening holes 467 corresponding to the fourth fastening holes 311 formed in the first bracket housing 312 of the hinge structure 300 may be formed in the second hinge bracket 460.

Referring to FIG. 14C, in an embodiment, the second bracket 420 and the second hinge bracket 460 may be coupled by fastening members 480 (e.g., screws) that pass through the second fastening holes 425 and the second corresponding fastening holes 465. Likewise, the first bracket 410 and the first hinge bracket 450 may be coupled by fastening members 480 (e.g., screws) that pass through the first fastening holes 415 and the first corresponding fastening holes 455. Meanwhile, in an embodiment, the second hinge bracket 460 and the first bracket housing 312 may be coupled by fastening members 480 that pass through the fourth fastening holes 311 and the fourth corresponding fastening holes 467. Likewise, the first hinge bracket 450 and the second bracket housing 314 may be coupled by fastening members 480 that pass through the third fastening holes 313 and the third corresponding fastening holes 457.

Therefore, the first bracket housing 312 and the second bracket housing 314 may be coupled so as to be rotatable about the folding axis (e.g., the first folding shaft 340 of FIG. 12A and/or the second folding shaft 350 of FIG. 12) in the hinge cover 530. Accordingly, the second hinge bracket 460 may rotate as the first bracket housing 312 rotates, and the second bracket 420 coupled to the second hinge bracket 460 may rotate together. Furthermore, the first hinge bracket 450 may rotate as the second bracket housing 314 rotates, and the first bracket 410 coupled to the first hinge bracket 450 may rotate together.

Figure 15A:
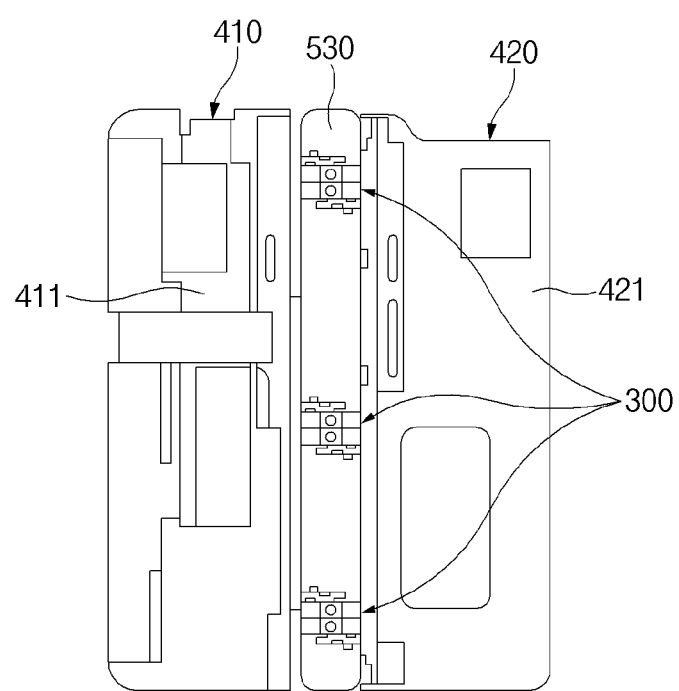
FIGS. 15A, 15B, and 15C illustrate views of an assembly sequence of the bracket assembly of the electronic device according to an embodiment.
Figure 15B:
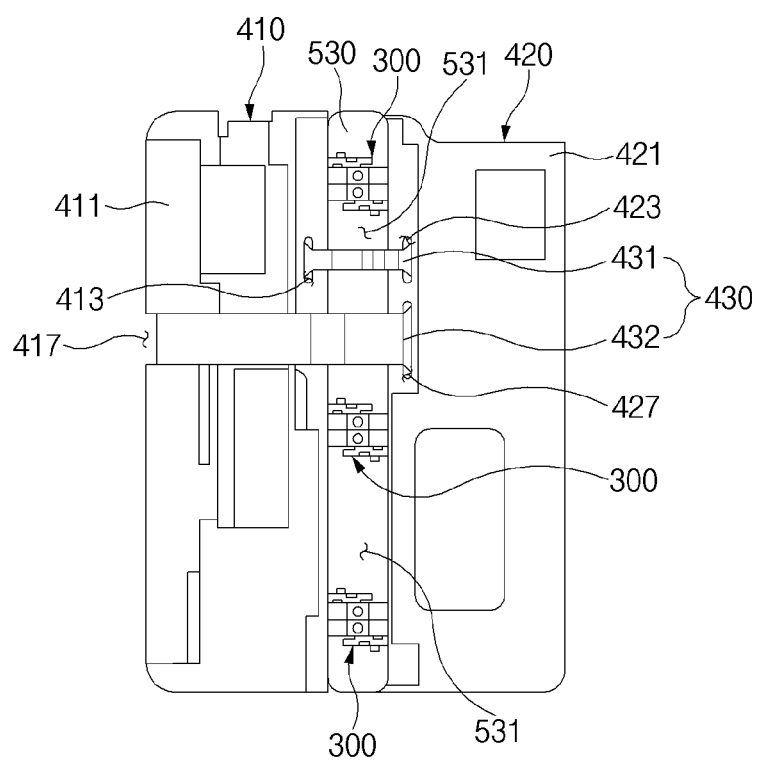
Figure 15C:
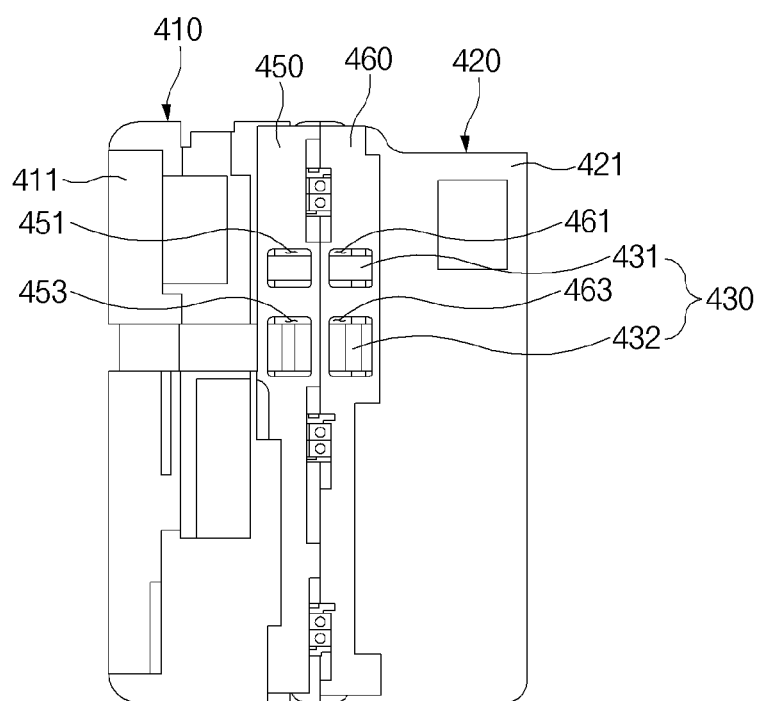

FIGS. 15A, 15B, and 15C illustrate views of an assembly sequence of the bracket assembly of the electronic device according to an embodiment. In an embodiment, the bracket assembly 30 may include the first bracket 410, the second bracket 420, the hinge cover 530 disposed between the first bracket 410 and the second bracket 420, and the hinge structures 300 disposed in the hinge cover 530.

Referring to FIG. 15A, the first bracket 410 and the second bracket 420 may be disposed on the opposite sides of the hinge cover 530. The first surface 411 of the first bracket 410 and the first surface 421 of the second bracket 420 may be disposed to face the same direction. The hinge cover 530 may be disposed such that the hinge structures 300 provided in the hinge cover 530 face the same direction as the first surface 411 of the first bracket 410 and the first surface 421 of the second bracket 420. The hinge structures 300 may be fixed in the hinge cover 530. As described above, fixing members (e.g., the fixing members 532 of FIG. 10) that are vertically formed in the hinge cover 530 may be inserted into fixing holes (e.g., the fixing holes 331 of FIG. 12B) that are formed in fixing brackets (e.g., the fixing brackets 330 of FIG. 10) of the hinge structures 300, and thus the hinge structures 300 may be fixed.

Referring to FIG. 15B, the wiring member 430 may be mounted on the assembly that includes the first bracket 410, the second bracket 420, the hinge cover 530, and the hinge structures 300. The first wiring member 431 may be inserted into the first opening 413 formed in the first bracket 410 and the second opening 423 formed in the second bracket 420. The opposite end portions of the first wiring member 431 may be disposed on the second surfaces (the second surfaces 412 and 422 of FIG. 13B) of the first bracket 410 and the second bracket 420, and the portion between the opposite end portions may be received in the hinge cover 530. The second wiring member 432 may be inserted into the third opening 417 formed in the first bracket 410 and the fourth opening 427 formed in the second bracket 420. The opposite end portions of the second wiring member 432 may be disposed on the second surfaces (the second surfaces 412 and 422 of FIG. 13B) of the first bracket 410 and the second bracket 420, and at least a portion (e.g., the variable area 4301 of FIG. 13B) between the opposite end portions may be received in the hinge cover 530. As described above with reference to FIG. 13B, the wiring members 431 and 432 may be attached to the first surface 411 of the first bracket 410 and the first surface 421 of the second bracket 420 by fixed areas (e.g., the fixed areas 4302 of FIG. 13B).

Referring to FIG. 15C, the first hinge bracket 450 and the second hinge bracket 460 may be coupled to the assembly that includes the first bracket 410, the second bracket 420, the hinge cover 530, and the hinge structures 300.

In an embodiment, the first fastening holes 415 of the first bracket 410 and the first corresponding fastening holes 455 of the first hinge bracket 450 may be fastened together, and the third fastening holes 313 of the hinge structures 300 and the third corresponding fastening holes 457 of the first hinge bracket 450 may be fastened together. Accordingly, the first bracket 410 may be coupled to the hinge structures 300 so as to be rotatable.

In an embodiment, the second fastening holes 425 of the second bracket 420 and the second corresponding fastening holes 465 of the second hinge bracket 460 may be fastened together, and the fourth fastening holes 311 of the hinge structures 300 and the fourth corresponding fastening holes 467 of the second hinge bracket 460 may be fastened together. Accordingly, the second bracket 420 may be coupled to the hinge structures 300 so as to be rotatable.

As described above, the coupling may be performed by using the fastening members 480 that pass through the fastening holes 415, 425, 311, and 313 and the corresponding fastening holes 455, 457, 465, and 467. However, this is merely illustrative, and the disclosure may include various fastening methods between the bracket 400 and the hinge structures 300.

Figure 16A:
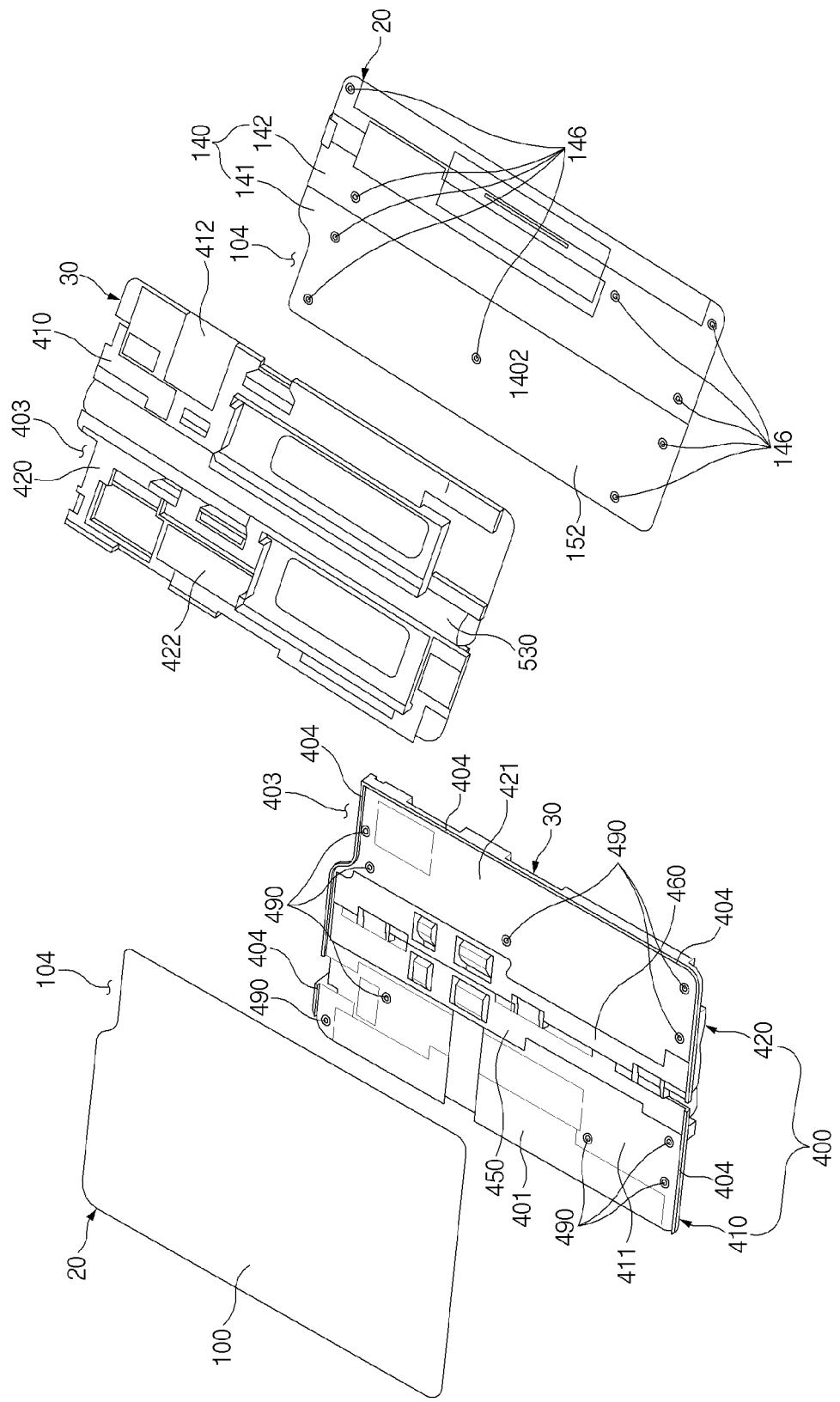
FIGS. 16A and 16B illustrate views of a coupled state of the bracket assembly and the display unit of the electronic device according to an embodiment.
Figure 16B:
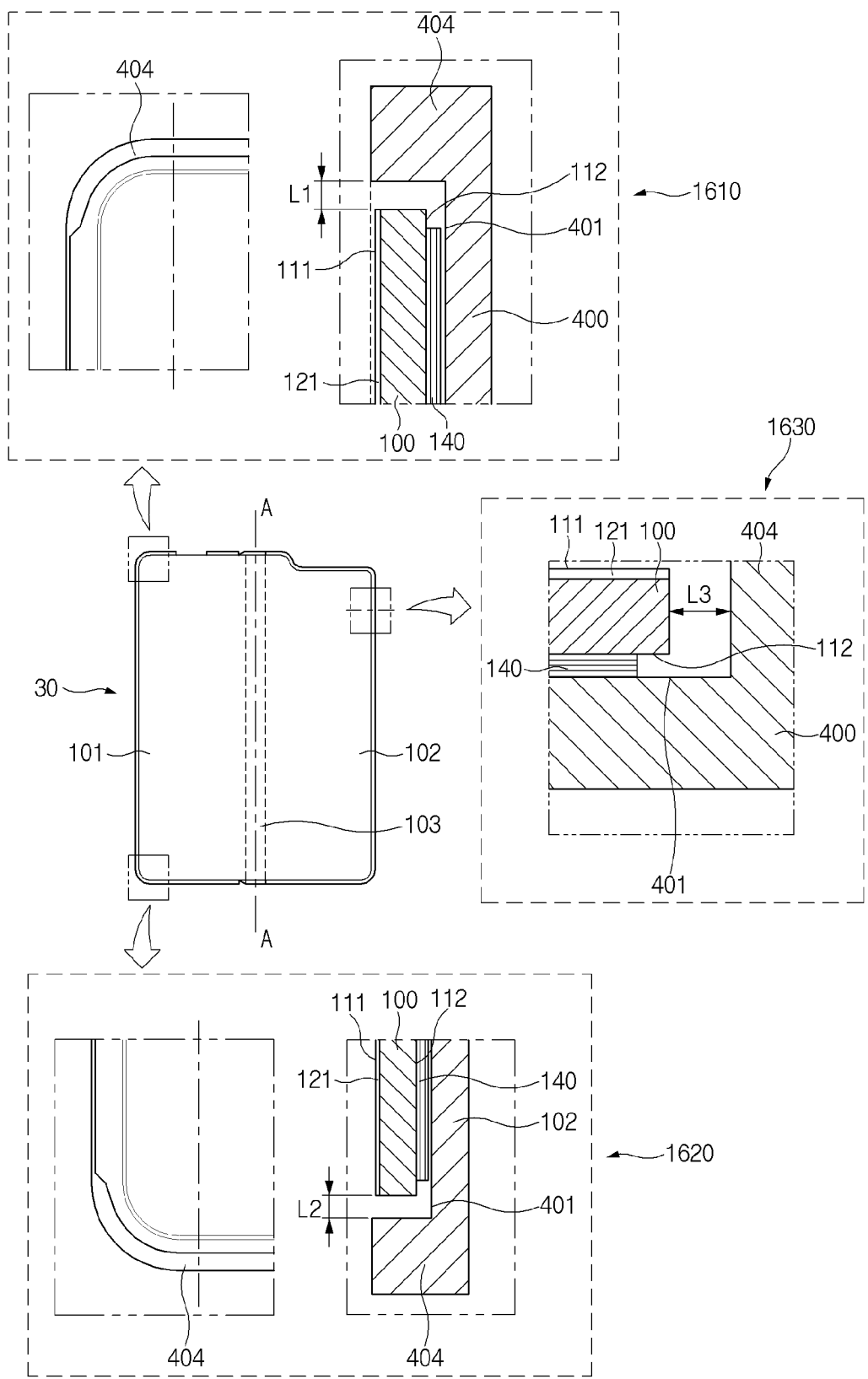

FIGS. 16A and 16B illustrate views of a coupled state of a bracket assembly (e.g., the bracket assembly 30 of FIG. 3) and a display module (e.g., the display unit 20 of FIG. 3) of the electronic device according to an embodiment. Referring to FIGS. 16A and 16B, the bracket assembly 30 may include the first bracket 410, the second bracket 420, the hinge cover 530, hinge structures (e.g., the hinge structures 300 of FIG. 12A), and the hinge brackets 450 and 460. Furthermore, the display module 20 may include the display 100 and the plate 140.

Referring to FIG. 16A, in an embodiment, the display module 20 may be disposed on one surface of the first bracket 410 and one surface of the second bracket 420. The first bracket 410 and the second bracket 420 may be coupled with the plate 140 of the display module 20 by boss fastening. For example, the one or more corresponding bosses 490 may be formed on the first surface 411 of the first bracket 410 and the first surface 421 of the second bracket 420, and the bosses 146 may be formed on the second surface 1402 of the plate 140 that faces the first surface 411 of the first bracket 410 and the first surface 421 of the second bracket 420. One of the bosses 146 and the corresponding bosses 490 may be protrusions, and the other may be depression members into which the protrusions are inserted.

In an embodiment, the first bracket 410 and the second bracket 420 may have a sidewall 404 that surrounds at least part of the plate 140 on which the display 100 is mounted. The sidewall 404 may be formed on at least part of the periphery of the first bracket 410 and the second bracket 420. A notch 403 corresponding to the notch 104 of the display 100 may be formed in the second bracket 420. The sidewall 404 may not be formed on the notch 403, and a sensor area (e.g., the sensor area 524 of FIG. 1) of a housing (e.g., the second housing structure 520 of FIG. 1) may be disposed on the notch 403.

FIG. 16B illustrates sections of partial areas of the assembly in which the bracket assembly 30 and the display module 20 are coupled in an embodiment. In this disclosure, the display module may be referred to as the display unit (e.g., the display unit 20 of FIG. 3). Referring to an upper section 1610 illustrated in FIG. 16B, the display 100 may include a plurality of layers, and the plurality of layers may include the PI layer 121 that forms the first surface 111 of the display 100. The sidewall 404 and the display 100 may be spaced apart from each other by a first gap of L1. Referring to a lower section 1620 illustrated in FIG. 16B, the sidewall 404 and the display 100 may be spaced apart from each other by a second gap of L2. Referring to a side section 1630 illustrated in FIG. 16B, the sidewall 404 and the display 100 may be spaced apart from each other by a third gap of L3.

In various embodiments, the first gap L1, the second gap L2, and the third gap L3 may include an assembly tolerance. The assembly tolerance may mean an allowable error within the limits of maintaining functions of parts and an assembly when the parts are assembled.

In various embodiments, the third gap L3 may be greater than the first gap L1 and/or the second gap L2. For example, the third gap L3 may further include shear correction of the display 100.

The shear of the display 100 may be generated as the flat folding area 103 is transformed into a curved surface when the electronic device 10 shifts into a folded state. Specifically, because the display 100 includes a plurality of stacked layers, the stacked layers may be transformed into curved surfaces having different radii of curvature. That is, a layer adjacent to the first surface 111 may have a smaller radius of curvature than a layer adjacent to the second surface 112 and therefore may further move toward the sidewall 404. Therefore, the third gap L3 may be greater than the first gap L1 or the second gap L2. Preferably, even when the electronic device 10 is in a folded state (e.g., a fully folded state illustrated in FIG. 2), the third gap L3 may be greater than the first gap L1 or the second gap L2 such that a layer located on the first surface 111 of the display 100 does not touch the sidewall 404. In various embodiments, the third gap L3 may be parallel to the direction of stress applied to the plurality of layers as the electronic device 10 shifts into a folded state, and shear displacement according to the applied stress may be further included in the third gap L3 including the assembly tolerance.

In contrast, the first gap L1 and the second gap L2 may not include shear correction. For example, because the display 100 is not folded in a direction parallel to the folding axis (the axis A), there may be no difference in radius of curvature between the stacked layers. Therefore, the first gap L1 and the second gap L2 may not include shear correction and may include only the assembly tolerance. In various embodiments, the first gap L1 and the second gap L2 may be equal to each other.

Figure 17:
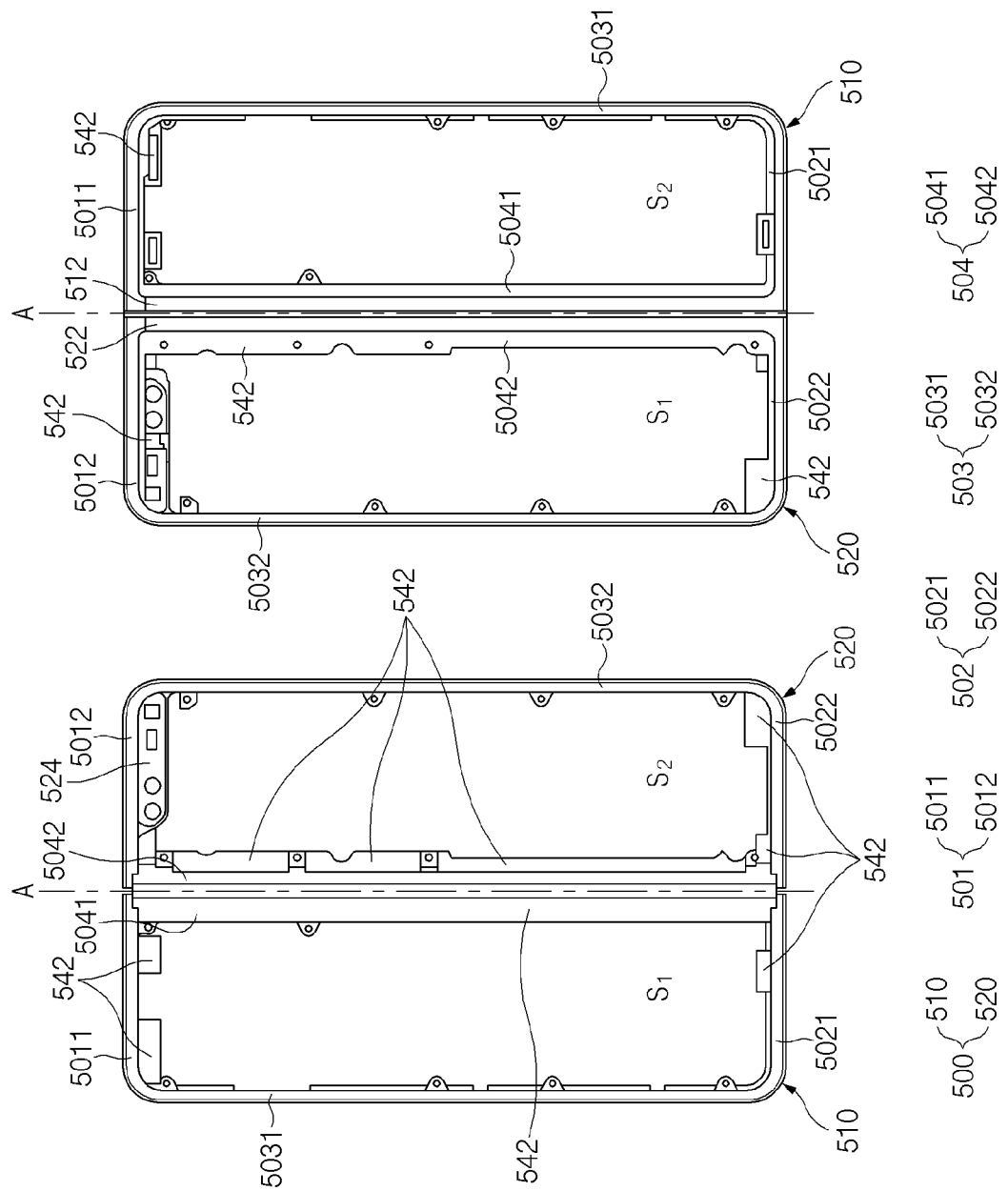
FIG. 17 illustrates a view of a foldable housing of the electronic device according to an embodiment.

FIG. 17 illustrates a view of the foldable housing of the electronic device according to an embodiment.

In an embodiment, the foldable housing 500 may include the first housing structure 510 and the second housing structure 520. The first housing structure 510 and the second housing structure 520 may include frames 501, 502, 503, and 504. The frames may include a first horizontal frame 501, a second horizontal frame 502, a first vertical frame 503, and a second vertical frame 504. The first horizontal frame 501 and the second horizontal frame 502 may extend in a direction perpendicular to the folding axis A, and the first vertical frame 503 and the second vertical frame 504 may extend in a direction parallel to the folding axis A.

In an embodiment, the first housing structure 510 may include a first horizontal frame 5011, a second horizontal frame 5021, a first vertical frame 5031, and a second vertical frame 5041. The first vertical frame 5031 and the second vertical frame 5041 may connect the first horizontal frame 5011 and the second horizontal frame 5021.

In an embodiment, the second housing structure 520 may include a first horizontal frame 5012, a second horizontal frame 5022, a first vertical frame 5032, and a second vertical frame 5042. The first vertical frame 5032 and the second vertical frame 5042 may connect the first horizontal frame 5012 and the second horizontal frame 5022.

In an embodiment, a first inner space S1 may be formed in the first housing structure 510 by the first horizontal frame 5011, the second horizontal frame 5021, the first vertical frame 5031, and the second vertical frame 5041. In this disclosure, the first inner space S1 may be referred to as the recess.

In an embodiment, a second inner space S2 may be formed in the second housing structure 520 by the first horizontal frame 5012, the second horizontal frame 5022, the first vertical frame 5032, and the second vertical frame 5042. In this disclosure, the second inner space S2 may be referred to as the recess.

In an embodiment, as illustrated in FIG. 17, the sensor area 524 may be formed on the second housing structure 520. The sensor area 524 may be disposed to correspond to a notch (e.g., the notch 403 of FIG. 16A) that is formed in a bracket (e.g., the second bracket 420 of FIG. 15C). One or more openings may be formed in the sensor area 524, and some sensors disposed in the electronic device 10 may be visually exposed outside the electronic device 10 through the openings.

In an embodiment, referring to FIG. 17, the first housing structure 510 and the second housing structure 520 may include a mounting surface 542 on which a bracket assembly (e.g., the bracket assembly 30 of FIG. 15C) is mounted. One or more mounting surfaces 542 may be formed. The mounting surfaces 542 may be formed in the frames that constitute the first housing structure 510 and/or the second housing structure 520. In an embodiment, the mounting surfaces 542 may extend from the frames 501, 402, 503, and 504 toward the inner spaces S1 and S2.

In an embodiment, the first housing structure 510 and the second housing structure 520 may include the first rotation support surface 512 and the second rotation support surface 522 for supporting a hinge cover (e.g., the hinge cover 530 of FIG. 18), respectively. The first rotation support surface 512 and the second rotation support surface 522 may correspond to each other, with the hinge cover therebetween.

Figure 18:
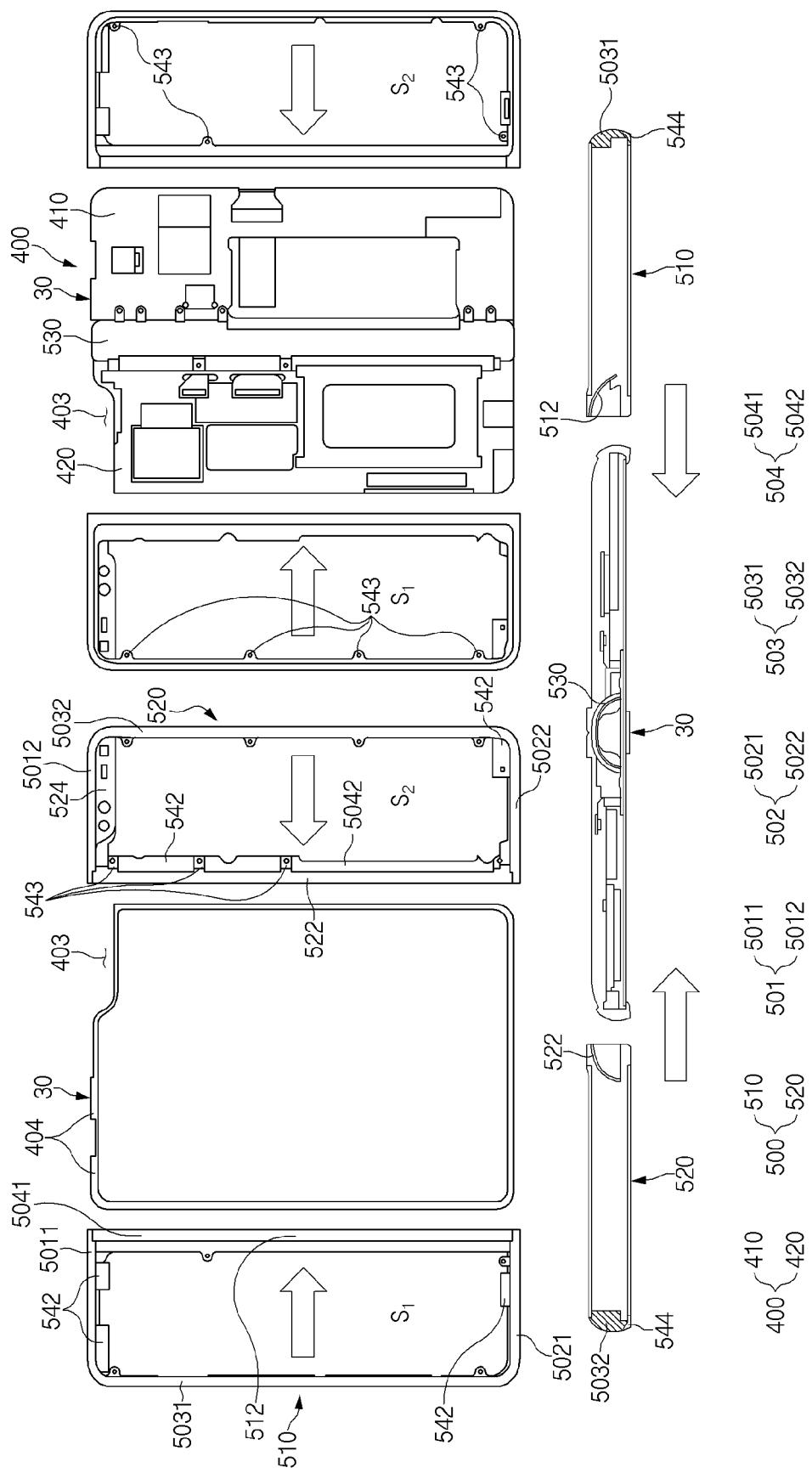
FIG. 18 illustrates a view of coupling of the foldable housing and the bracket assembly of the electronic device according to an embodiment.
Figure 19:
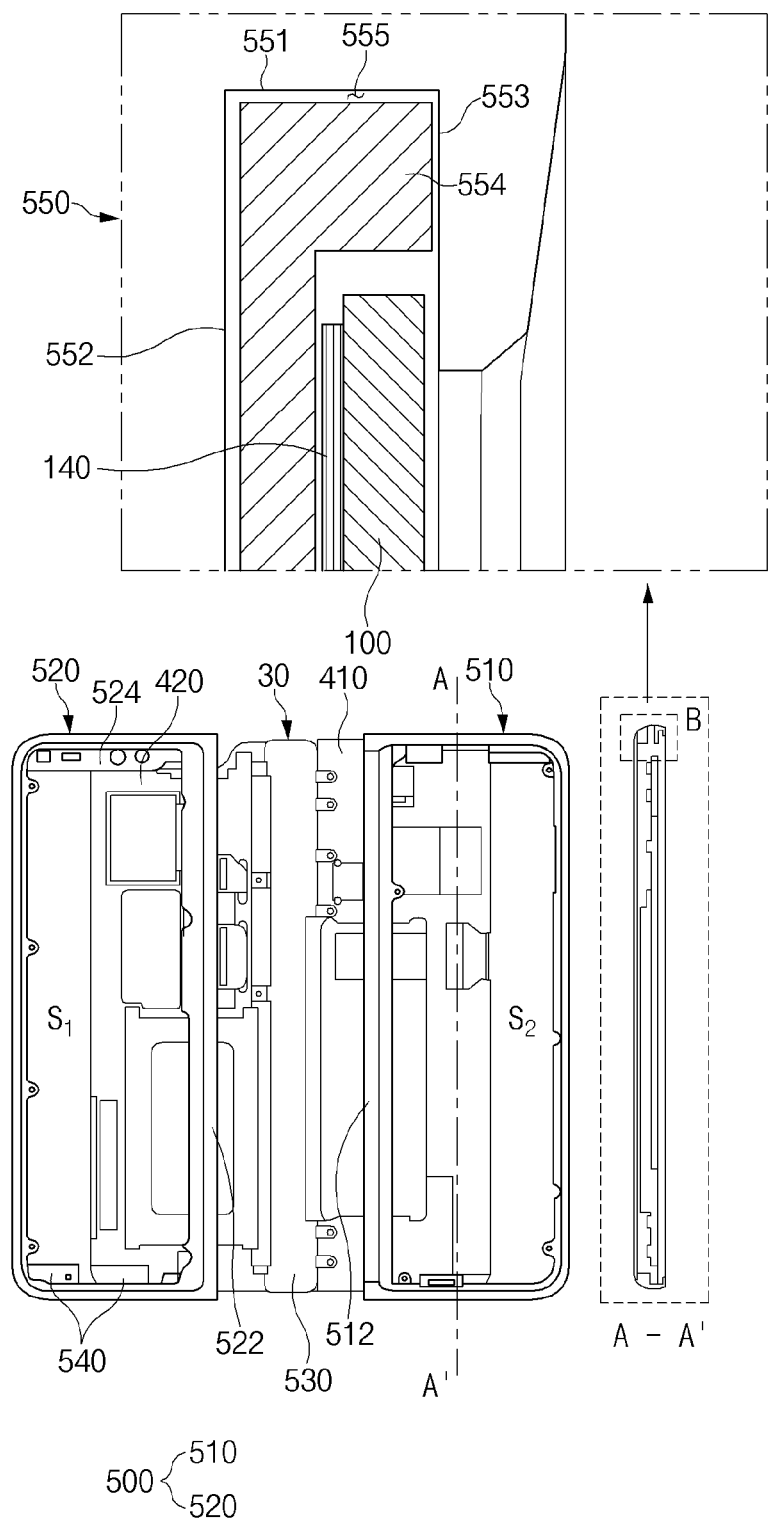
FIG. 19 illustrates a view of a sliding structure of the electronic device according to an embodiment.
Figure 20:
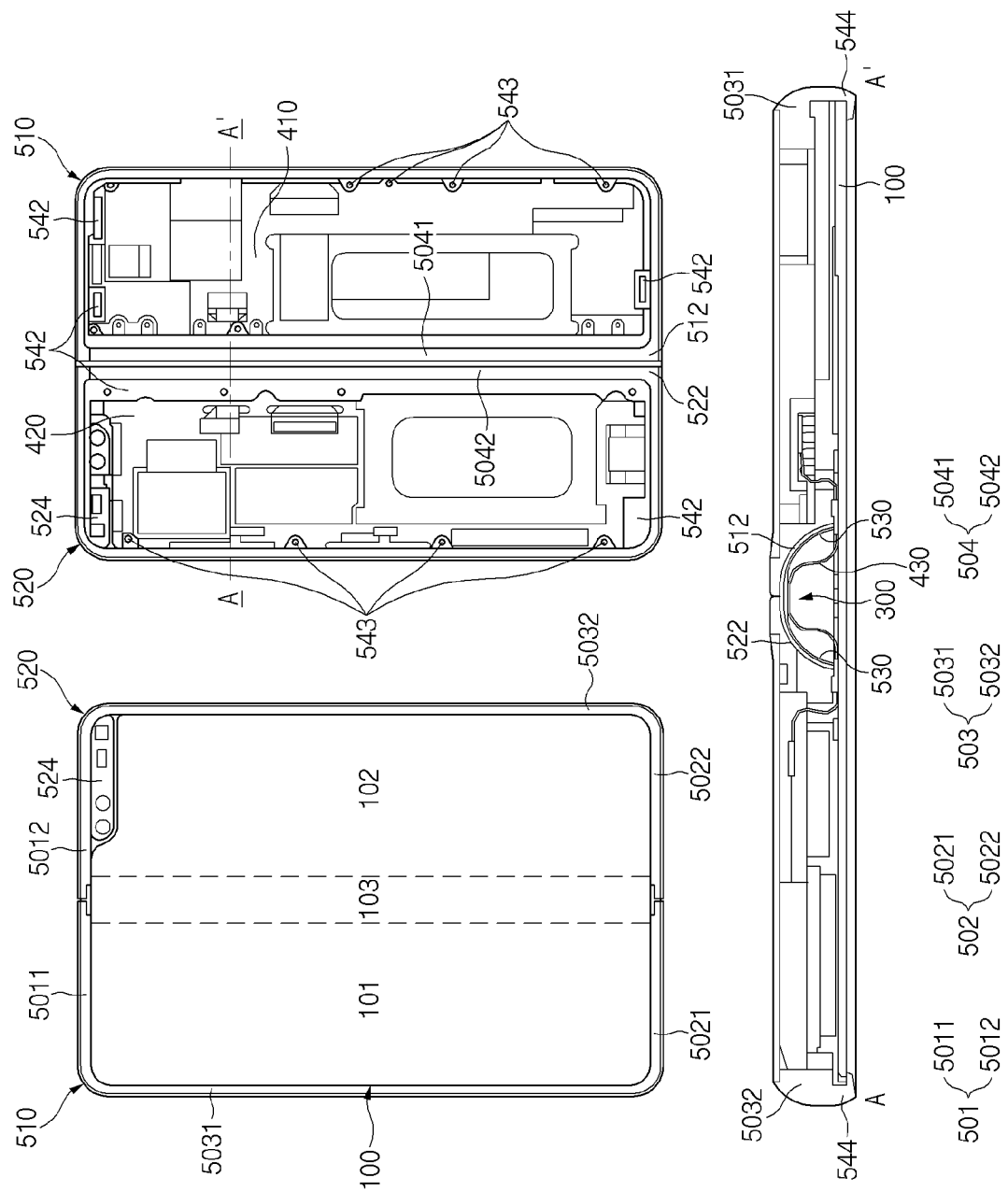
FIG. 20 illustrates a view of assembly of the foldable housing and the bracket assembly of the electronic device according to an embodiment.

FIG. 18 illustrates a view of coupling of the foldable housing and the bracket assembly of the electronic device according to an embodiment. FIG. 19 illustrates a view of a sliding structure of the electronic device according to an embodiment. FIG. 20 illustrates a view of assembly of the foldable housing and the bracket assembly of the electronic device according to an embodiment.

Hereinafter, assembly of the bracket assembly 30 and the foldable housing 500 will be described with reference to FIGS. 18 and 19. As described above (see FIG. 16A), the bracket assembly 30 on which the display 100 is mounted may be coupled with the first housing structure 510 and the second housing structure 520.

Referring to FIG. 18, in an embodiment, the first housing structure 510 and the second housing structure 520 may be disposed on opposite sides of the bracket assembly 30. The first housing structure 510 may be disposed adjacent to the first bracket 410, and the second housing structure 520 may be disposed adjacent to the second bracket 420. The first housing structure 510 and the second housing structure 520 may slide toward the bracket assembly 30 and may be coupled with the bracket assembly 30.

In an embodiment, the first housing structure 510 and/or the second housing structure 520 may further include a cover surface 533 that forms part of the front surface of the electronic device 10. The cover surface 544 may be formed on at least one of the first horizontal frame 501, the second horizontal frame 502, the first vertical frame 503, and the second vertical frame 504 that constitute the first housing structure 510 and/or the second housing structure 520. The cover surface 544 may extend toward the inner spaces S1 and S2 from the frames. The cover surface 544 may cover gaps (e.g., L1, L2, and L3 of FIG. 16B) between the display 100 and the sidewall 404 of the bracket 400 such that the gaps are not exposed on the front surface of the electronic device 10. In an embodiment, the cover surface 544 formed on the first housing structure 510 and/or the second housing structure 520, along with the mounting surface 542, may form a recess into which the bracket assembly 30 slides.

In an embodiment, at least part of the periphery of the first bracket 410 may be inserted into the recess formed between the mounting surface 542 and the cover surface 544 of the first housing structure 510. At least part of the periphery of the second bracket 420 may be inserted into the recess formed between the mounting surface 542 and the cover surface 544 of the second housing structure 520. Accordingly, the first bracket 410 may be disposed in the first inner space S1, and the second bracket 420 may be disposed in the second inner space S2.

Referring to FIG. 19, the electronic device 10 according to an embodiment may include a sliding structure 550. The sliding structure 550 may include sliding grooves 555 formed in the first horizontal frames 5011 and 5012 located on an upper side among the frames constituting the first housing structure 510 and the second housing structure 520, and sliding members 554 including the upper and lower end portions of the first bracket 410 and the second bracket 420. For example, the sliding members 554 may include sidewalls (e.g., the sidewall 404 of FIG. 16A) that are formed on the upper and lower end portions of the first bracket 410 and the second bracket 420.

Referring to the sectional view of FIG. 19, the sliding groove 555 may be formed by a first surface 551 facing the sliding member 554, a second surface 552 on which the sliding member 554 is seated and that extends from the first surface 551, and a third surface 553 facing the second surface 552. For example, the second surface 552 may include the mounting surface 542 formed in the first horizontal frames 5011 and 5012 or the second horizontal frames 5021 and 5022, and the third surface 553 may include the cover surface 544 formed in the first horizontal frames 5011 and 5012 or the second horizontal frames 5021 and 5022.

Referring to FIG. 20, the first housing structure 510 may surround at least part of the periphery of the first bracket 410, and the second housing structure 520 may surround at least part of the periphery of the second bracket 420. At least part of the first bracket 410 may be disposed in a first inner space (e.g., the first inner space S1 of FIG. 17), and at least part of the second bracket 420 may be disposed in a second inner space (e.g., the second inner space S2 of FIG. 17).

In an embodiment, one or more coupling holes 543 may be formed in the frames 501, 502, 503, and 504. A first substrate (e.g., the first substrate 610 of FIG. 22) and/or a second substrate (e.g., the second substrate 620 of FIG. 22) may be mounted on at least some of the coupling holes 543. A first back cover (e.g., the first back cover 580 of FIG. 23) and/or a second back cover (e.g., the second back cover 590 of FIG. 23) may be mounted on at least some of the coupling holes 543.

In an embodiment, the first housing structure 510 and the second housing structure 520 may include the rotation support surfaces 512 and 522 formed in the second vertical frames 5041 and 5042. The rotation support surfaces 512 and 522 may be formed as curved surfaces corresponding to the hinge cover 530. When the electronic device 10 shifts from a flat state (e.g., the electronic device of FIG. 1) to a folded state (e.g., the electronic device of FIG. 2), the first housing structure 510 and the second housing structure 520 that rotate relative to each other may be supported by the rotation support surfaces 512 and 522.

Figure 21:
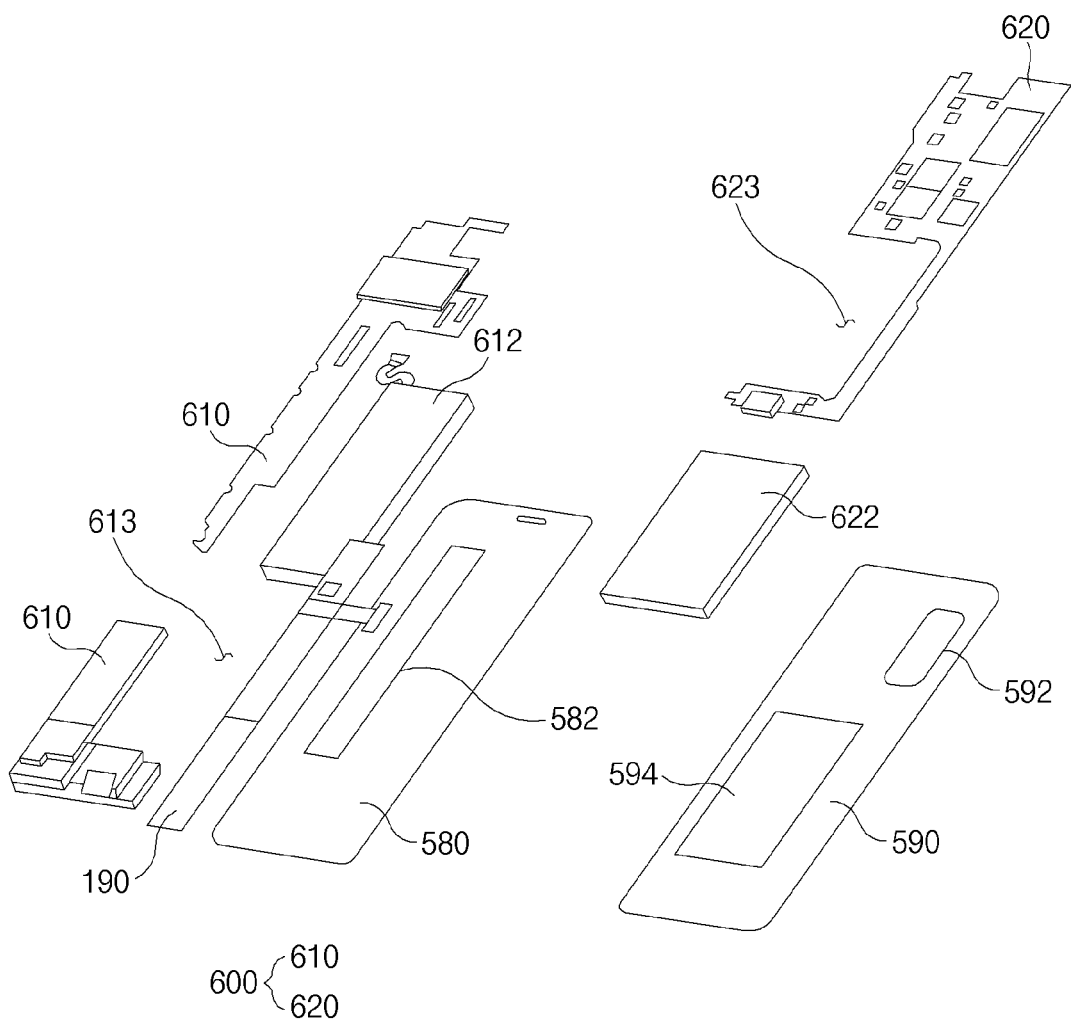
FIG. 21 illustrates an exploded perspective view of a substrate and a back cover of the electronic device according to an embodiment.
Figure 22:
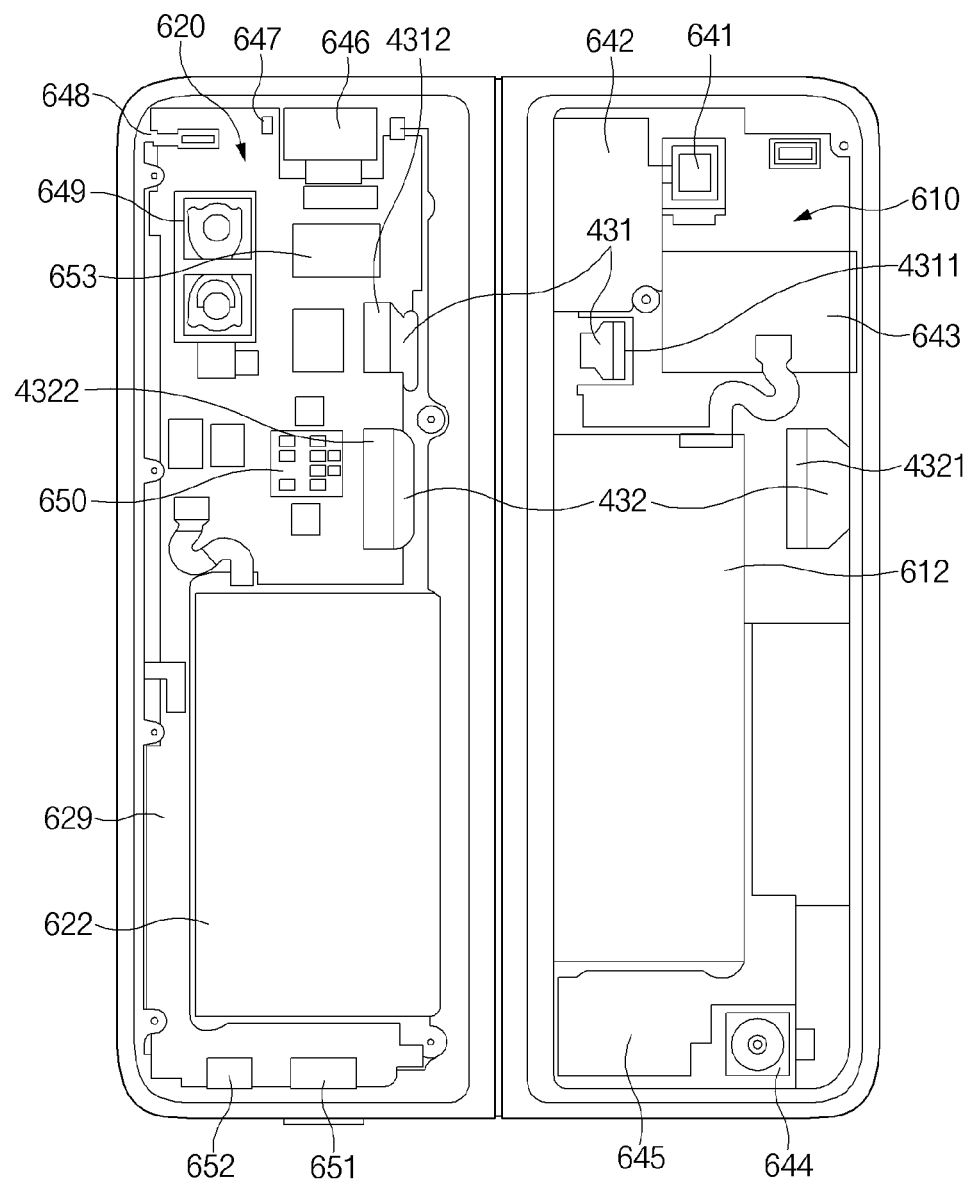
FIG. 22 illustrates a view of the substrate of the electronic device according to an embodiment.
Figure 23:
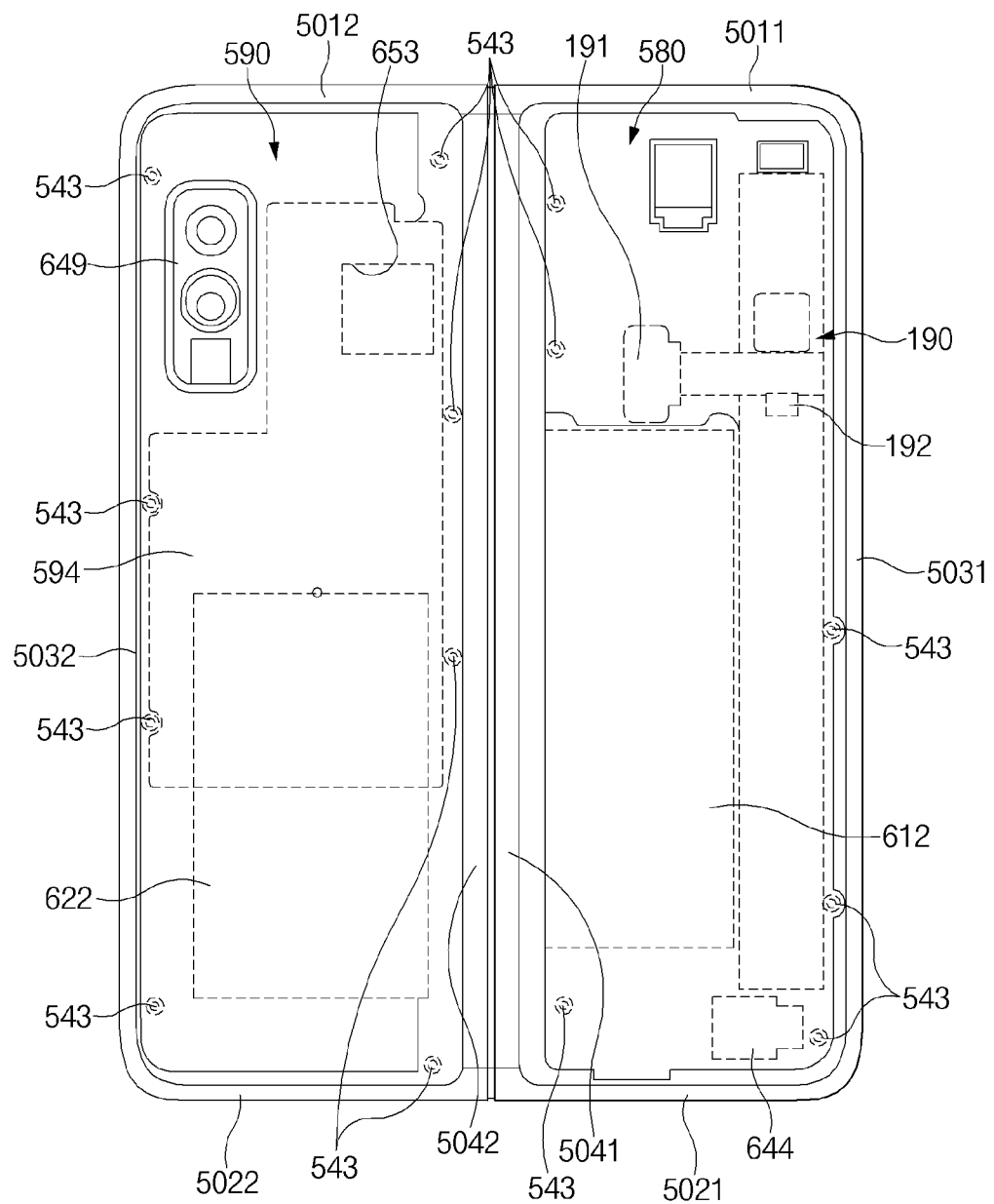
FIG. 23 illustrates a view of the back cover of the electronic device according to an embodiment.

FIG. 21 illustrates an exploded perspective view of the substrate and the back covers of the electronic device according to an embodiment. FIG. 22 illustrates a view of the substrate of the electronic device according to an embodiment. FIG. 23 illustrates a view of the back covers of the electronic device according to an embodiment.

Hereinafter, the substrate 600 and the back covers 580 and 590 will be described with reference to FIGS. 21, 22, and 23.

As illustrated in FIG. 21, in an embodiment, the electronic device may include the substrate 600, a first battery 612, and a second battery 622. The substrate 600 may include the first substrate 610, the second substrate 620, and one or more electric elements mounted on the first substrate 610 and the second substrate 620. A cover may include the first back cover 580, the second back cover 590, the sub-display 190 viewed through the first back cover 580, and a wireless charger module 594 disposed on the second back cover 590.

Referring to FIGS. 21 and 22, the first substrate 610 may be disposed on a second surface (e.g., the second surface 412 of FIG. 18) of the first bracket 410, and the second substrate 620 may be disposed on a second surface (e.g., the second surface 422 of FIG. 18) of the second bracket 420. The first battery 612 may be disposed on the first bracket 410, and the second battery 622 may be disposed on the second bracket 420. In an embodiment, a recess 613 in which the first battery 612 is located may be formed in the substrate 610, and a recess 623 in which the second battery 622 is located may be formed in the second substrate 620.

In an embodiment, the first substrate 610 and the second substrate 620 may be connected by the wiring members 431 and 432. The wiring members 431 and 432 may electrically connect the first substrate 610 and the second substrate 620 across the inside of the hinge cover 530. The wiring member 430 may include the first wiring member 431 and the second wiring member 432. The first connector 4311 and the second connector 4312 may be formed on opposite end portions of the first wiring member 431, and the third connector 4321 and the fourth connector 4322 may be formed on opposite end portions of the second wiring member 432. The connectors may be electrically connected with the substrates 610 and 620.

In an embodiment, the substrate 600 may include the one or more electric elements. The electric elements may include, for example, a receiver 641, a first speaker 642, a memory socket 643, a second speaker 645, a vibration motor 644, a front camera 646, a rear camera 649, a first microphone 652, a second microphone 647, the main chip 650, and a USB module 651. For example, the receiver 641, the first speaker 642, the memory socket 643, the second speaker 645, and the vibration motor 644 may be mounted or disposed on the first substrate 610. A front sensor connecting part 648 connected with the sensor area 524 formed in the second housing structure 520 may be disposed on the second substrate 620. For example, the front camera 646, the rear camera 649, the first microphone 652, the second microphone 647, the main chip 650, the USB module 651, and the front sensor connecting part 648 may be mounted or disposed on the second substrate 620. The types, arrangement, and number of electric elements illustrated in the drawing are merely illustrative, and the scope of the disclosure is not limited by the drawing.

Referring to FIG. 23, the back covers 580 and 590 may be coupled with the housing 500. The back covers may include the first back cover 580 coupled to the first housing structure 580 and the second back cover 590 coupled to the second housing structure 520.

In an embodiment, the sub-display 190 may be disposed between the first back cover 580 and the first substrate 610. The sub-display 190 may be electrically connected with the first substrate 610 by a sub-display connecting part 191. In various embodiments, the sub-display 190 may further include a display panel and a touch screen panel disposed on the display panel. The touch screen panel may be disposed between the display panel and the first back cover 580.

In an embodiment, the first back cover 580 may form the rear surface of the electronic device 10. Referring to FIG. 21, the first back cover 580 may include the first rear area 582 formed in the rear surface of the electronic device 10. The first rear area 582 may be formed in a position corresponding to the position of the sub-display 190. The first rear area 582 may be formed of a transparent material through which light is able to pass. Light emitted from the sub-display 190 may be transferred to a user through the first rear area 582.

In an embodiment, the second back cover 590 may form the rear surface of the electronic device 10. Referring to FIG. 21, the second back cover 590 may include the second rear area 592 formed in the rear surface of the electronic device 10. The second rear area 592 may be formed in a position corresponding to the position of the rear camera 649. The second rear area 592 may be formed of a transparent material through which light is able to pass. External light may be incident on the rear camera 649 through the second area 592.

Referring to FIG. 23, the first back cover 580 may be coupled to the first housing structure 510. The first back cover 580 may be disposed between the first horizontal frame 5011, the second horizontal frame 5021, the first vertical frame 5031, and the second vertical frame 5041. As described above, the coupling holes 543 may be formed in the frames. The first back cover 580 may include coupling protrusions formed on a surface facing the first substrate 610 and inserted into the coupling holes 543. The coupling protrusions may be formed in positions corresponding to the coupling holes 543. The coupling protrusions may be formed along the periphery of the first back cover 580. The coupling protrusions may be inserted or press-fit into the coupling holes 543.

In an embodiment, the second back cover 590 may be coupled to the second housing structure 520. The second back cover 590 may be disposed between the first horizontal frame 5012, the second horizontal frame 5022, the first vertical frame 5032, and the second vertical frame 5042. As described above, the coupling holes 543 may be formed in the frames. The second back cover 590 may include coupling protrusions formed on a surface facing the second substrate 620 and inserted into the coupling holes 543. The coupling protrusions may be formed in positions corresponding to the coupling holes 543. The coupling protrusions may be formed along the periphery of the second back cover 590. The coupling protrusions may be inserted or press-fit into the coupling holes 543.

In various embodiments, the housing structures 510 and 520 and the back covers 580 and 590 may be made of various materials. For example, the housing structures 510 and 520 may be mad of a material containing metal. For example, the back covers 580 and 590 may be mad of a material containing glass.

In various embodiments, the housing structures 510 and 520 and the back covers 580 and 590 may be integrated with each other and may be formed of the same material. For example, the housing structures 510 and 520 and the back covers 580 and 590 may be made of a material containing metal, but may be integrated with each other. At least one of the first back cover 580 and the second back cover 590 may be integrally formed with the housing structures 510 and 520.

Figure 24:
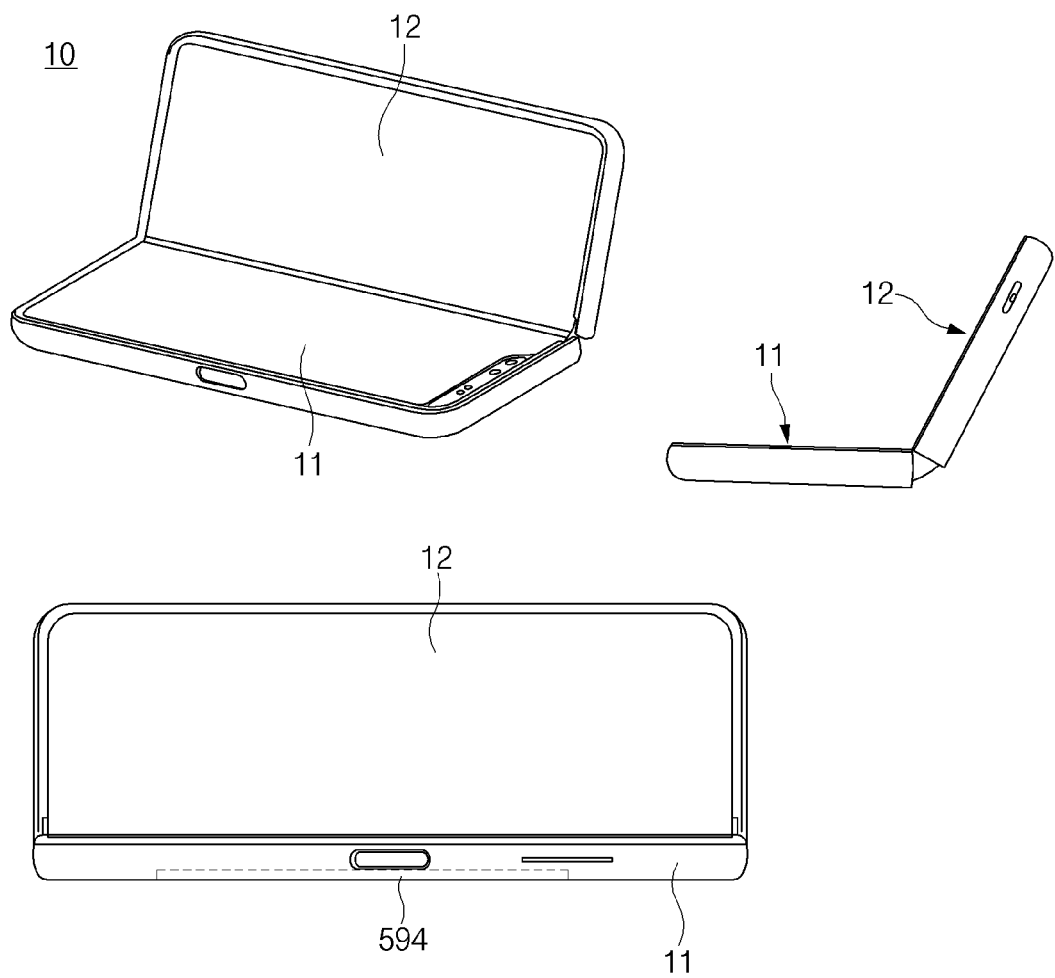
FIG. 24 illustrates a view of a usage status of the electronic device according to various embodiments.

FIG. 24 illustrates a view of a usage status of the electronic device according to various embodiments. Referring to FIG. 24, the electronic device 10 is between a folded state and a flat state.

In an embodiment, the electronic device 10 may include a main area 11 and a sub-area 12. When the electronic device 10 shifts from a flat state to a folded state, the main area 11 may refer to an area fixed by a user, and the sub-area 12 may refer to an area that rotates relative to the main area 11.

The first area (e.g., the first area 101 of FIG. 20) of the above-described display (e.g., the display 100 of FIG. 2) may be included in the sub-area 12, and the second area (e.g., the second area 102 of FIG. 20) may be included in the main area 11.

In an embodiment, when the electronic device 10 is in a folded state or shifts from a flat state to a folded state, the main area 11 may be fixed by the user's hand, and the sub-area 12 may be inclined at a predetermined angle with respect to the main area 11.

In an embodiment, the sub-area 12 may be disposed on the rear surface in a flat state and may be disposed on the front surface in a folded state.

In various embodiments, a receiver (e.g., the receiver 641 of FIG. 22), a proximity sensor, and a sub-display (e.g., the sub-display 190 of FIG. 23) may be further included in the sub-area 12 of the electronic device 10. The aim is to ensure usability of the electronic device 10 when the electronic device 10 is in a folded state (e.g., the electronic device of FIG. 2). When the electronic device 10 is in a folded state (e.g., the electronic device of FIG. 2), the sub-area 12 may be disposed on the front surface of the electronic device 10.

For example, when the electronic device 10 is in a folded state, the sub-display (e.g., the sub-display 190 of FIG. 2) that is included in the sub-area 12 may be disposed on the front surface of the electronic device 10. Accordingly, visual information may be provided to the user through the sub-display (e.g., the sub-display 190 of FIG. 2) that is disposed on the front surface of the electronic device 10, even though the electronic device 10 is in the folded state (e.g., the electronic device of FIG. 2).

Likewise, when the electronic device 10 is in a folded state (e.g., the electronic device of FIG. 2), the receiver (e.g., the receiver 641 of FIG. 22) or the proximity sensor that is included in the sub-area 12 may be disposed on the front surface of the electronic device 10. Accordingly, a user input may be received through the receiver (e.g., the receiver 641 of FIG. 22) or the proximity sensor that is disposed on the front surface of the electronic device 10, even though the electronic device 10 is in the folded state (e.g., the electronic device of FIG. 2).

In an embodiment, the wireless charger module 594 may be disposed in the main area 11. When the electronic device 10 is charged through the wireless charger module 594, the user may place the main area 11 on a wireless charger. Furthermore, visual information may be provided through the display included in the sub-area 12 even during wireless charging, by folding the sub-area 12 at a predetermined angle with respect to the main area 11. In various embodiments, the wireless charger module 594 may be disposed in the sub-area 12 instead of the main area 11, or may be disposed in both the main area 11 and the sub-area 12.

Figure 25A:
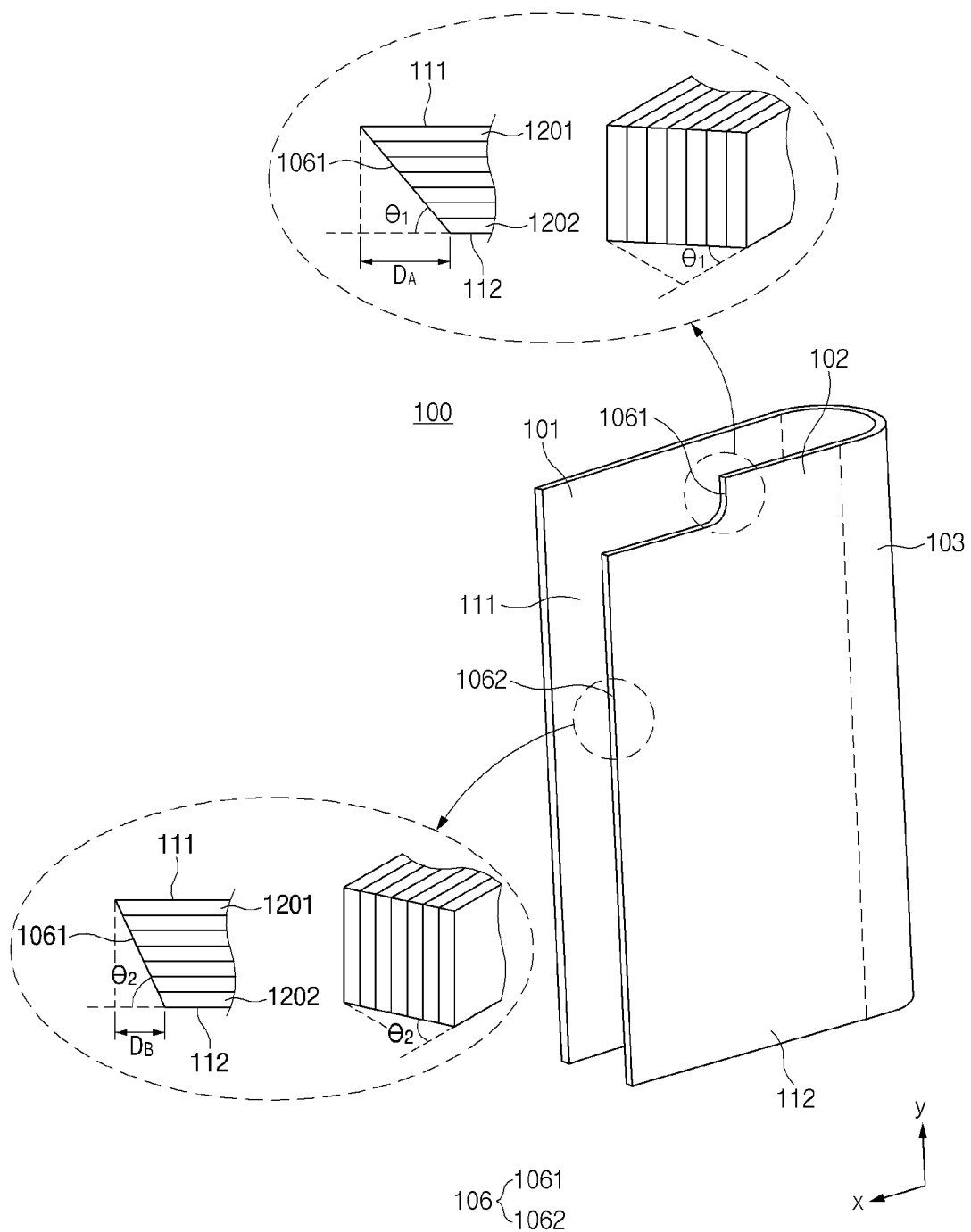
FIGS. 25A and 25B illustrate views of gaps between the display and the housing and shear of the display when the electronic device according to various embodiments is in a folded state.
Figure 25B:
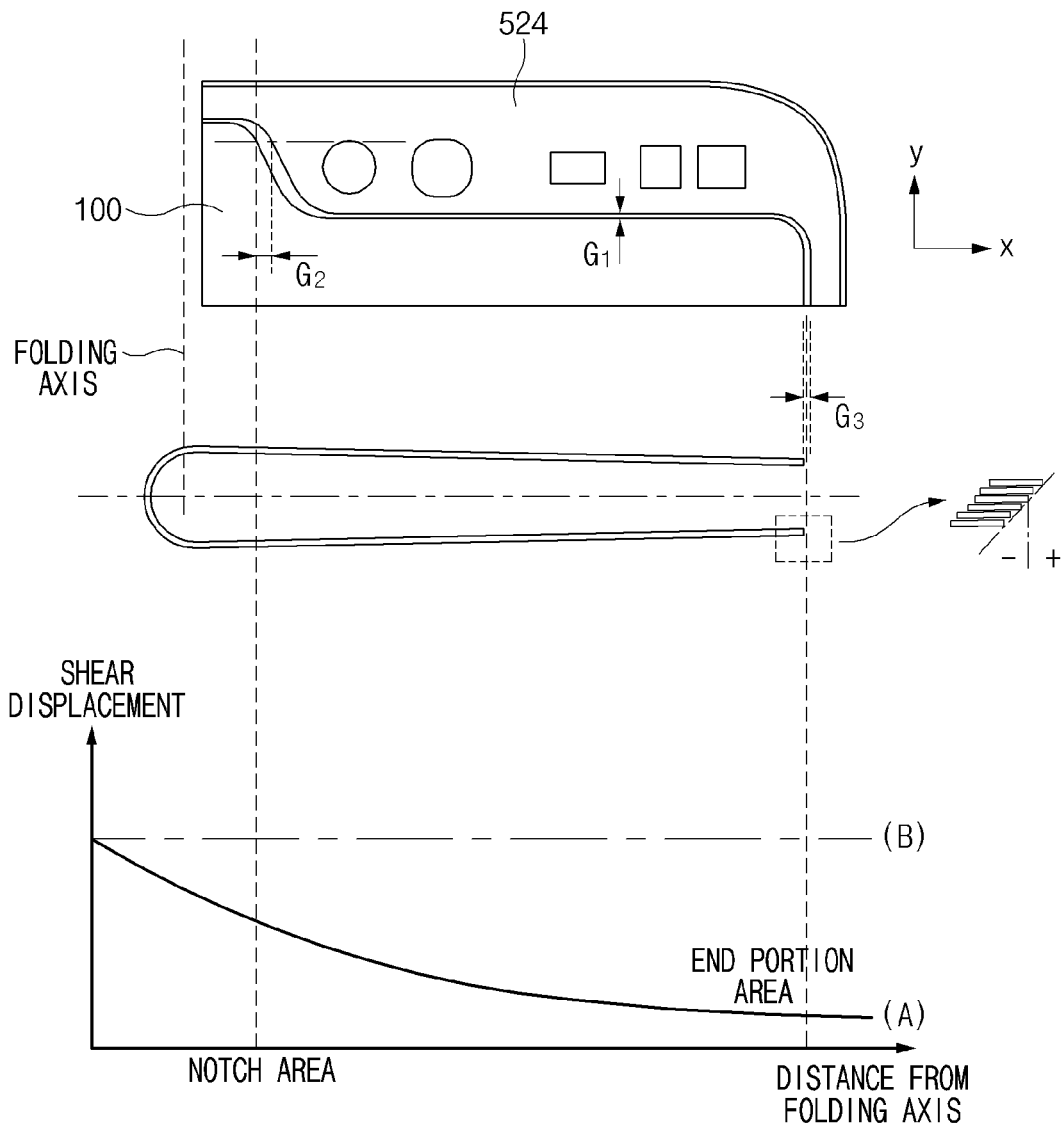

FIGS. 25A and 25B illustrate views of gaps between the display and the housing and shear of the display when the electronic device according to various embodiments is in a folded state. For example, FIGS. 25A and 25B illustrate views of the display 100, gaps between the display 100 and the housing 500, and shear of the display 100 when the electronic device 10 according to the embodiment illustrated in FIGS. 1, 2, and 3 is in a folded state.

Figure 26A:
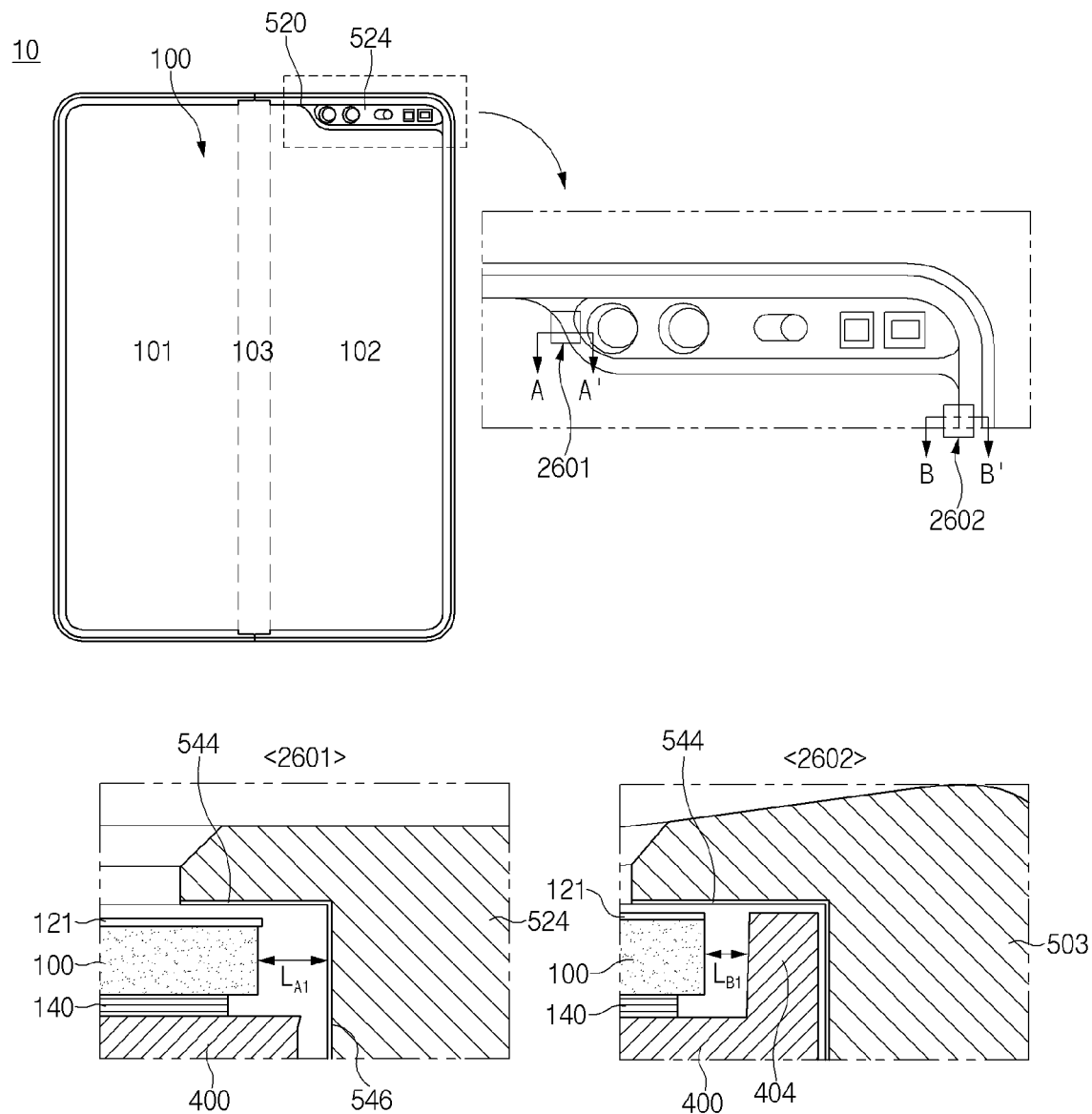
FIGS. 26A, 26B, and 26C illustrate views of sections of partial areas of the display and gaps between the display and the housing when the electronic device according to various embodiments is in a folded state.
Figure 26B:
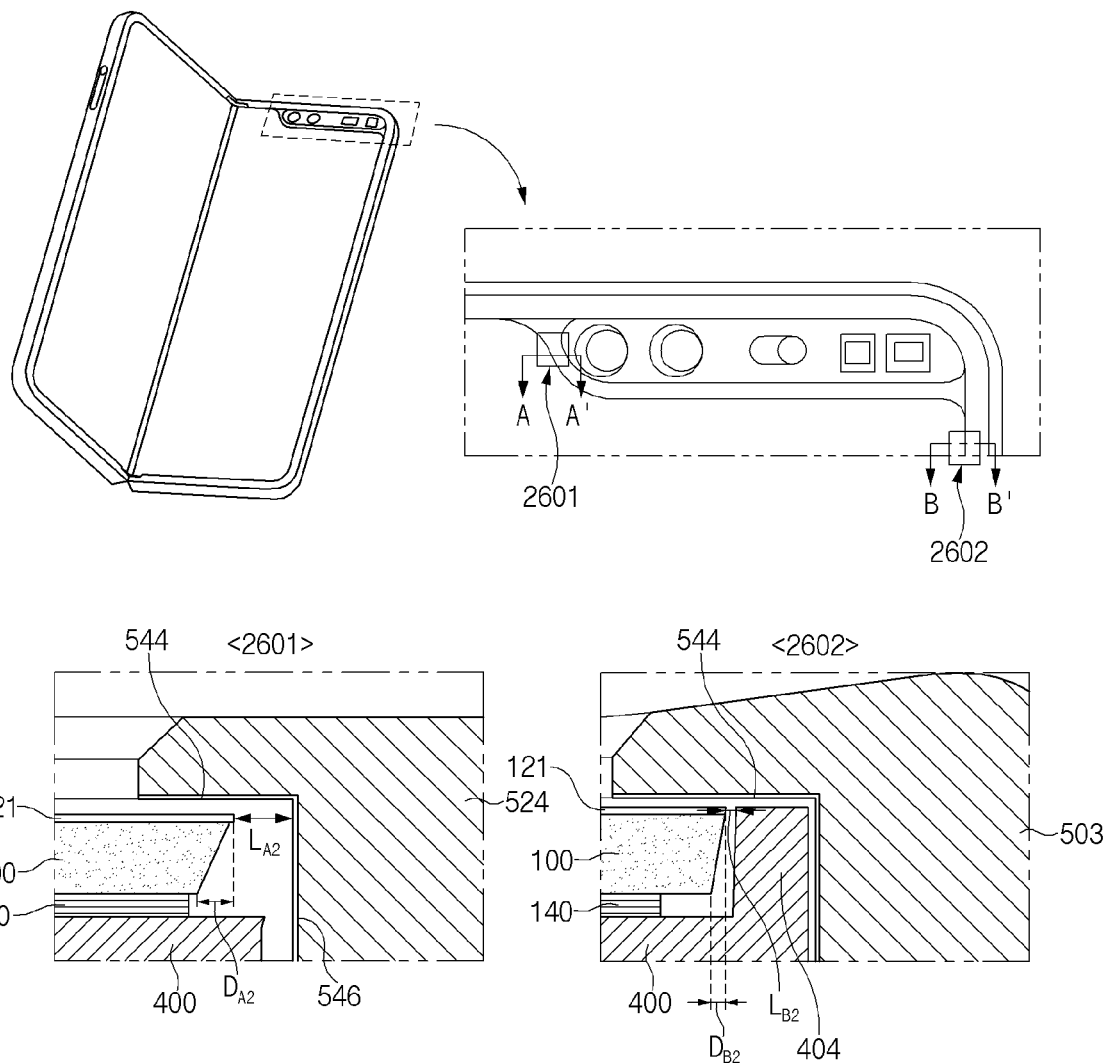
Figure 26C:
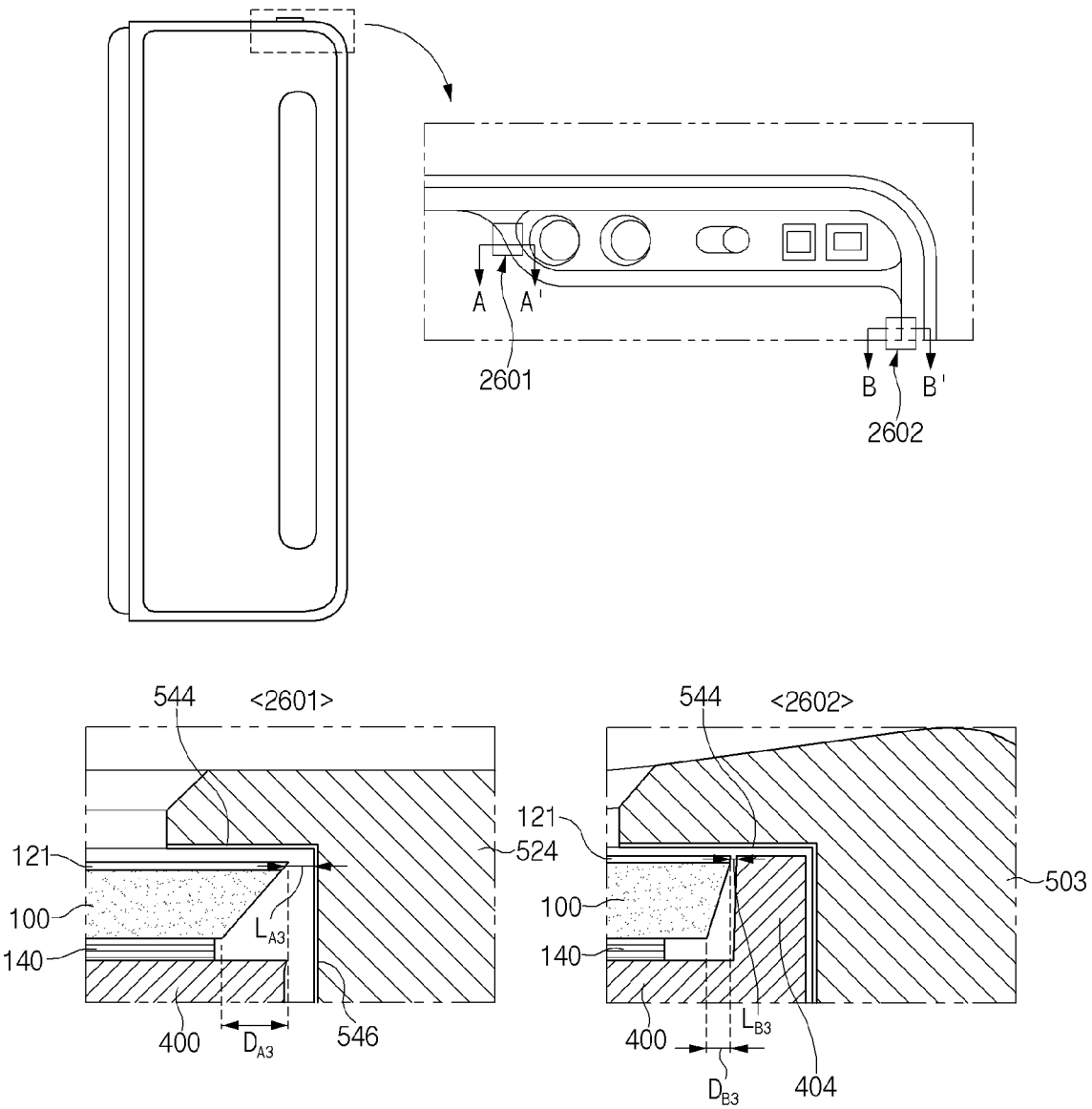

FIGS. 26A, 26B, and 26C illustrate views of sections of partial areas of the display and gaps between the display and the housing when the electronic device according to various embodiments is in a folded state. For example, FIGS. 26A, 26B, and 26C illustrate views of sections of partial areas of the display 100 disposed on the front surface of the electronic device and gaps between the display and the housing when the electronic device according to the embodiment illustrated in FIGS. 1, 2, and 3 is in a folded state. Sectional views for a first end surface 1061 and a second end surface 1062 in the second direction are illustrated in FIGS. 26A, 26B, and 26C. The second direction may be a direction perpendicular to the folding area 103 or the folding axis of the electronic device 10.

Referring to FIG. 25A, the display 100 including a plurality of layers may include a first layer 1201 that forms the first surface 111 of the display 100 and a second layer 1202 that forms the second surface 112 of the display 100 that is opposite to the first surface 111. When the display 100 is folded as illustrated, each layer may be pushed by a predetermined displacement in one direction. The one direction may be the x-axis direction that is perpendicular to the folding axis (the y-axis direction in FIG. 25A) in the folding area 103 and away from the folding area 103.

As illustrated in FIG. 25A, at least part of the folding area 103 of the display 100 may form a curved surface, with the electronic device 10 in a folded state. Accordingly, the layers of the display 100 may be bent to have different radii of curvature in the folding area 103. In the state in which the part of the display 100 is bent, the first layer 1201 located on the first surface 111 may have a smaller radius than the second layer 1202 located on the second surface 112. In this state, an end portion of the first layer 1201 less bent in the folding area 103 may be further pushed and displaced in the one direction, compared with an end portion of the second layer 1202 greatly bent in the folding area 103 because the first layer 1201 and the second layer 1202 have the same length in the one direction (the x-axis direction). That is, a layer (e.g., the first layer 1201) adjacent to the first surface 111 of the display 100 may further move in the one direction, compared with a layer (e.g., the second layer 1202) adjacent to the second surface 112 of the display 100. Therefore, in the illustrated embodiment, end portions of the layers may form a step structure when the display 100 is folded.

As mentioned above, there may be a difference in displacement between the end portions of the layers of the display 100. The displacement difference may be defined as a "degree of shear". The degree of shear may increase as the displacement difference increases. The "degree of shear" may be defined as an angle formed by sections of the layers. The "degree of shear" may increase as the angle decreases. The degree of shear may be 0 in a flat state and may have a maximum value in a folded state.

Referring again to FIGS. 25A and 25B, there may be a difference in displacement between the layers of the display 100 according to positions from the folding area 103 in a folded state of the electronic device 10. In the illustrated embodiment, the difference between the displacement of the first layer 1201 located on the first surface 111 and the displacement of the second layer 1202 located on the second surface 112 may decrease with an increase in the distance from the folding area 103. That is, the degree of shear of the display 100 may increase with an approach to the folding area 103.

For example, referring to FIG. 25A, when the electronic device 10 is in a folded state, the displacement difference $D_A$ in the notch area 104 (e.g., in the first end surface 1061) that is located close to the folding area 103 may be greater than the displacement difference $D_B$ in a side end area (e.g., the second end surface 1062) that is located far away from the folding area 103.

In an embodiment, when the display 100 is folded, the storage moduli of the layers may affect the displacements of the layers. For example, the layers of the display 100 may be bonded together by an adhesive material having a predetermined adhesive force. For example, each layer of the display 100 may have a predetermined elastic force by the material of which the layer is made, and may have a unique modulus. Accordingly, an adhesive force with an adjacent layer and/or the elastic force of each layer may be applied to the layer. The storage modulus may be a variable reflecting the external force applied to the layer and/or the characteristics of the layer itself.

FIG. 25B illustrates shear displacement reflecting storage modulus, according to the distance from a folding area (e.g., 103 of FIG. 25A) or a folding axis, in a folded state. Graph "A" shows shear displacement according to the distance from a folding axis of a layer in which storage modulus is reflected. Graph "B" shows shear displacement according to the distance from a folding axis of a virtual layer in which storage modulus is not reflected.

Here, the "shear displacement" or the "maximum shear displacement" may be defined as the displacement of a layer that moves the longest distance, among the plurality of layers, in a predetermined area of the display 100 when the electronic device 10 is in a folded state. The distance from the folding axis, which is the horizontal axis of the graph, may be the distance from the folding area 103.

Referring to graph B, the display 100 may have constant shear irrespective of the distance from the folding area 103 when storage modulus is not reflected. In contrast, it can be seen that shear decreases with an increase in the distance from the folding area 103 when storage modulus is reflected (graph A). For example, shear stress by a neighboring layer may be applied to an area of any one layer. A layer having elasticity may absorb part of the shear stress, and therefore shear may decrease with an increase in the distance from the folding area 103.

FIG. 25B illustrates first to third gaps G1, G2, and G3 between the side surface of the display 100 and the sidewall of the recess of the housing 500. The first gap G1 may be a gap in a direction (e.g., the y-axis direction) parallel to the folding axis, and the second gap G2 and the third gap G2 may be gaps in a direction (e.g., the x-axis direction) perpendicular to the folding axis. In an embodiment, the second gap G2 and the third gap G3 may be selected to accommodate shear displacement according to the difference in radius of curvature between the plurality of layers of the display 100. In contrast, because the first gap G1 is a gap in a direction (e.g., the y-axis direction) parallel to the folding axis, shear according to folding of the display 100 may not occur. Accordingly, the second gap G2 and/or the third gap G3 may be greater than the first gap G1.

A structure associated with a notch area and a side end area (section B-B') of the display 100 will be described with reference to FIGS. 26A, 26B, and 26C. FIGS. 26A, 26B, and 26C illustrate gaps $L_{A1}$, $L_{A2}$, and $L_{A3}$ between the display 100 and the sensor area 524 in a first area 2601 and gaps $L_{B1}$, $L_{B2}$, and $L_{B3}$ between the display 100 and the sidewall 404 in a second area 2602. The first area 2601 may be referred to as the first portion (e.g., the first portion 520a of FIG. 1) of the second housing structure 520. The illustrated gaps may mean the distances in a direction perpendicular to the folding axis and may be set to accommodate shear displacement according to folding of the display 100.

In an embodiment, the display 100 may be spaced apart from an inner surface 546 of the sensor area 524 by the predetermined gap $L_{A1}$ in the first area 2601 of the electronic device 10 in a flat state. The display 100 may be spaced apart from the sidewall 404 of the bracket 400 by the predetermined gap $L_{B1}$ in the second area 2602 of the electronic device 10 in the flat state.

The predetermined gaps may be determined such that a layer (e.g., the first layer 1201 located on the first surface 111) that has the maximum shear displacement in a folded state is located inside the second housing structure 520 or the sidewall 404 of the bracket 400. Accordingly, the predetermined gaps may be formed to be greater than the maximum shear displacement of the corresponding area (e.g., the displacement of the first layer 1201 located on the first surface 111), and therefore the display 100 may not make contact with the inner surface 546 of the sensor area 524 or the sidewall 404 of the bracket 400 in the folded state.

Specifically, the predetermined gap in the first area 2601 (e.g., section A-A') may be greater than the maximum shear displacement (e.g., the shear displacement of the first layer 1201 forming the first surface 111) that is formed when the display of the first area 2601 (e.g., section A-A') is pushed, with the electronic device in the folded state. The maximum shear displacement in the first area 2601 (e.g., section A-A') may be equal to the difference $L_{A1}-L_{A3}$ between $L_{A1}$ illustrated in FIG. 26A and $L_{A3}$ illustrated in FIG. 26C and may be smaller than the first gap $L_{A1}$. Accordingly, the layers of the display 100 may not make contact with the inner surface 546 of the sensor area 524 even when the electronic device 10 is folded.

Meanwhile, the predetermined gap in the second area 2602 (e.g., section B-B') may be greater than the maximum shear displacement (e.g., the shear displacement of the first layer 1201 forming the first surface 111) that is formed when the display of the second area 2602 (e.g., section B-B') is pushed, with the electronic device in the folded state. The maximum shear displacement in the second area 2602 (e.g., section B-B') may be equal to the difference $L_{B1}-L_{B3}$ between $L_{B1}$ illustrated in FIG. 26A and $L_{B3}$ illustrated in FIG. 26C and may be smaller than the first gap $L_{B1}$. Accordingly, the layers of the display 100 may not make contact with the sidewall 404 of the bracket 400 even when the electronic device 10 is folded.

Hereinafter, the gap in the first area 2601 (e.g., section A-A') of FIG. 26A in the flat state may be referred to as the first gap $L_{A1}$, and the gap in the second area 2602 (e.g., section B-B') of FIG. 26A in the flat state may be referred to as the second gap $L_{B1}$. The gap in the first area 2601 (e.g., section A-A') of FIG. 26B in an intermediate state may be referred to as the third gap $L_{A2}$, and the gap in the second area 2602 (e.g., section B-B') of FIG. 26B may be referred to as the fourth gap $L_{B2}$. The gap in the first area 2601 (e.g., section A-A') of FIG. 26C in the folded state may be referred to as the fifth gap $L_{A3}$, and the gap in the second area 2602 (e.g., section B-B') of FIG. 26C may be referred to as the sixth gap $L_{B3}$. In various embodiments, the first to sixth gaps may further include an assembly tolerance.

Referring to FIG. 26A, when the electronic device 10 is in the flat state, the first gap $L_{A1}$ may be greater than the second gap $L_{B1}$. Referring to FIG. 26B, when the electronic device 10 is in the intermediate state, the third gap $L_{A2}$ may be greater than the fourth gap $L_{B2}$. Referring to FIG. 26C, when the electronic device 10 is in the folded state, the fifth gap $L_{A3}$ may be greater than the sixth gap $L_{B3}$. That is, the gaps (the first gap, the third gap, and the fifth gap) in the first area close to the folding area may be greater than the gaps (the second gap, the fourth gap, and the sixth gap) in the second area.

If the layers of the display are formed of a rigid body, the gaps (the first gap, the third gap, and the fifth gap) in the first area 2601 and the gaps (the second gap, the fourth gap, and the sixth gap) in the second area 2602 according to the states of the electronic device may be equal to each other. As mentioned above, because the actual layers of the display 100 have predetermined elastic moduli and absorb part of stress caused by neighboring layers, shear in the second area 2602 far away from the folding area 103 may be smaller than shear in the first area 2601, and the gaps in the second area 2602 may be set to be smaller than the gaps in the first area 2601. In various embodiments, the fifth gap $L_{A3}$ and the sixth gap $L_{B3}$ illustrated in FIG. 26C may be assembly tolerances.

In another embodiment, unlike the first area 2601 illustrated in FIG. 26C, the sidewall 404 may be formed between the inner surface 546 of the sensor area 524 and the display 100. In this case, the gap between the display 100 and the sidewall 404 may be smaller than the fifth gap $L_{A3}$ illustrated in FIG. 26C, and the gap may be equal or similar to the gap between the display 100 and the sidewall 404 in the side end area (section B-B').

In an embodiment, the gap between the display 100 and the inner surface 546 of the sensor area 524 or the sidewall 404 of the bracket 400 may vary depending on the folded state of the electronic device 10. For example, with respect to the first area 2601, the gap may be the largest (the first gap $L_{A1}$) in the flat state and may be the smallest (the fifth gap $L_{A3}$) in the folded state. For example, with respect to the second area 2602, the gap may be the largest (the second gap $L_{B1}$) in the flat state and may be the smallest (the sixth gap $L_{B3}$) in the folded state.

Referring to FIG. 26B, when the electronic device is in the intermediate state, the first layer 1201 and the second layer 1202 in the first area 2601 may have a displacement difference of $D_{A2}$. In the second area, the first layer 1201 and the second layer 1202 may have a displacement difference of $D_{B2}$. In the illustrated embodiment, $D_{A2}$ may be greater than $D_{B2}$ because the degree of shear of the display increases with a decrease in the distance to the folding area.

Referring to FIG. 26C, when the electronic device is in the folded state, the first layer 1201 and the second layer 1202 in the first area 2601 may have a displacement difference of $D_{A3}$. In the second area, the first layer 1201 and the second layer 1202 may have a displacement difference of $D_{B3}$. As described above, $D_{A3}$ may be greater than $D_{B3}$ because the degree of shear of the display increases with a decrease in the distance to the folding area.

The displacement difference between the layers in a predetermined area of the display 100 may be changed (e.g., $D_{A2} \rightarrow D_{A3}$ or $D_{B2} \rightarrow D_{B3}$) according to the folded state of the electronic device 10. As a folding operation is performed, the difference in radius of curvature between the layers of the display may increase, and therefore a layer closer to the first surface 111 of the display 100 among the plurality of layers may move a longer distance (absolute displacement).

In various embodiments, the first area 2601 (section A-A') may exist in various positions in various shapes according to the shape or position of the sensor area 524. For example, the gaps (the first gap, the third gap, and the fifth gap) of the first area 2601 may become wider as the sensor area 524 is closer to the folding area 103 (or the folding axis (the y-axis)) than the sensor area 524 illustrated in the drawing.

Figure 27A:
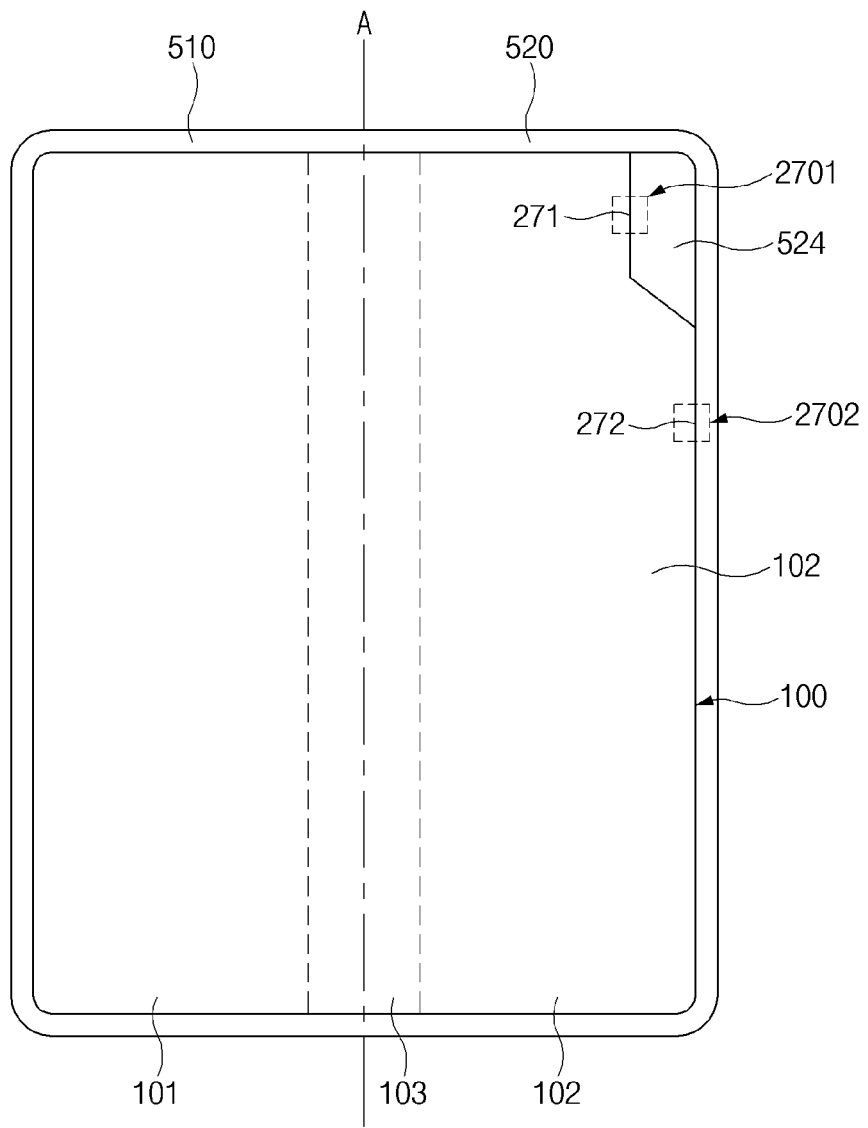
FIGS. 27A, 27B, and 27C illustrate views of a front surface of an electronic device according to various embodiments.
Figure 27B:
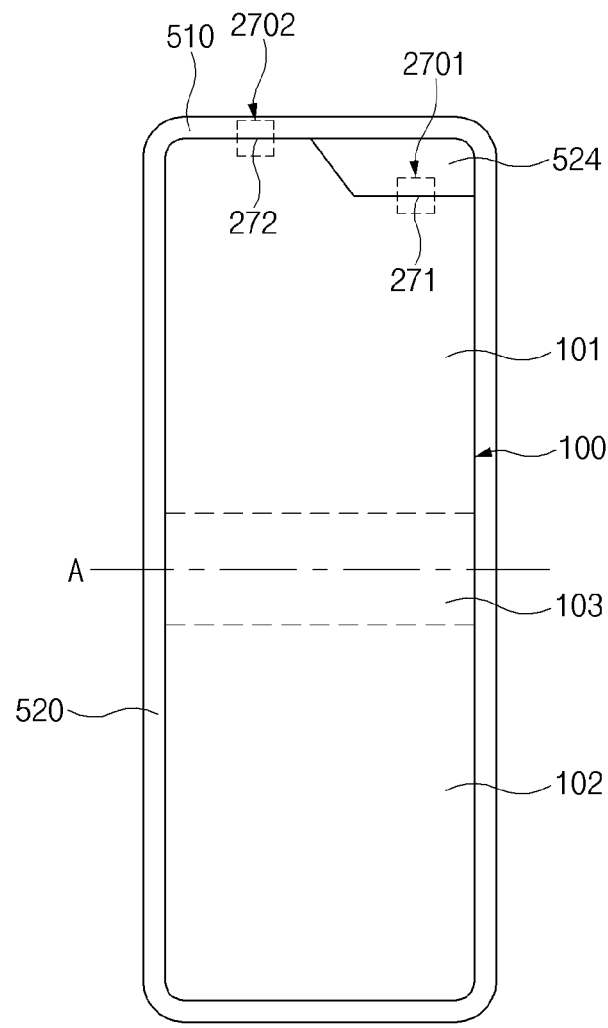
Figure 27C:
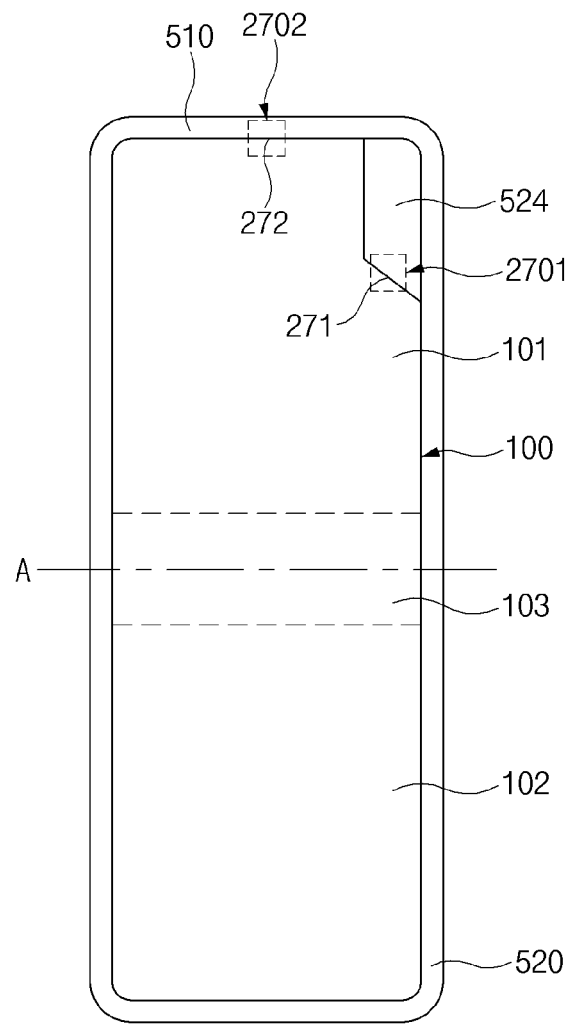

FIGS. 27A, 27B, and 27C illustrate views of a front surface of an electronic device according to various embodiments.

In an embodiment, referring to FIG. 27A, an electronic device 27 (e.g., the electronic device 10 of FIG. 1) may include a first area 2701 that includes a first border 271 that forms part of the periphery of a sensor area 524 and is parallel to the direction of a folding axis (an axis A). In an embodiment, the electronic device 27 may include a second area 2702 that includes a second border 272 that is parallel to the direction of the folding axis (the axis A) and forms an end portion of a first or second housing structure 510 or 520 in which the sensor area 524 is formed.

In an embodiment, the first area 2701 may be disposed closer to the folding axis (the axis A) than the second area 2702. In an embodiment, the gap formed by the first border 271 and a display 100 in the first area 2701 may be greater than the gap formed by the second border 272 and the display 100 in the second area 2702.

Referring to FIG. 27B, because the first area 2701 of the electronic device 27 (e.g., the electronic device 10 of FIG. 1) is disposed closer to the folding axis (the axis A) than the second area 2702, the gap formed by the first border 271 and the display 100 in the first area 2701 may be greater than the gap formed by the second border 272 and the display 100 in the second area 2702.

Referring to FIG. 27C, because the first area 2701 of the electronic device 27 (e.g., the electronic device 10 of FIG. 1) is disposed closer to the folding axis (the axis A) than the second area 2702, the gap formed by the first border 271 and the display 100 in the first area 2701 may be greater than the gap formed by the second border 272 and the display 100 in the second area 2702.

The electronic device according to various embodiments disclosed in the disclosure may be various types of devices. The electronic device may include, for example, a portable communication device (e.g., a smartphone), a computer device, a portable multimedia device, a mobile medical appliance, a camera, a wearable device, or a home appliance. The electronic device according to an embodiment of the disclosure should not be limited to the above-mentioned devices.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related components. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if a component (e.g., a first component) is referred to, with or without the term "operatively" or "communicatively", as "coupled with," "coupled to," "connected with," or "connected to" another component (e.g., a second component), it means that the component may be coupled with the other component directly (e.g., wiredly), wirelessly, or via a third component.

The term "module" used herein may include, for example, a unit implemented with hardware, software and firmware. The term "module" may be interchangeably used with the terms "logic", "logical block", "part" and "circuit". The "module" may be a minimum unit of an integrated part or may be a part thereof. The "module" may be a minimum unit for performing one or more functions or a part thereof. For example, the "module" may be implemented with an application-specific integrated circuit (ASIC).

Various embodiments of the disclosure may be implemented by software (e.g., the program #40) including an instruction stored in a storage media (e.g., an internal memory #36 or an external memory #38) readable by a machine (e.g., an electronic device #01). For example, a processor (e.g., a processor #20) of the machine (e.g., the electronic device #01) may call at least one instruction of the stored one or more instructions from the storage medium and execute the called instruction. This makes it possible for the machine performs at least one function based on the called at least one instruction. The one or more instructions may include a code generated by a compiler or a code executable by an interpreter. The machine-readable storage media may be provided in the form of non-transitory storage media. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, the method according to various embodiments disclosed in the disclosure may be provided as a part of a computer program product. The computer program product may be traded between a seller and a buyer as a product. The computer program product may be distributed in the form of machine-readable storage medium (e.g., a compact disc read only memory (CD-ROM)) or may be distributed (e.g., uploaded or downloaded) online through an application store (e.g., a Play Store™) or between two user device (e.g., smartphones) directly. In the case of online distribution, at least a portion of the computer program product may be temporarily stored or generated in a machine readable storage medium such as a memory of a manufacturer's server, an application store's server, or a relay server.

According to various embodiments, each component (e.g., the module or the program) of the above-described components may include single or plural objects. According to various embodiments, one or more components of the above-described components or operations may be omitted, or one or more components or operations may be added. Alternatively or additionally, some components (e.g., the module or the program) may be integrated in one component. In this case, the integrated component may perform the same or similar functions performed by each corresponding components prior to the integration. According to various embodiments of the disclosure, operations performed by a module, a programming, or other components may be executed sequentially, in parallel, repeatedly, or in a heuristic method. Also, at least some operations may be executed in different sequences, omitted, or other operations may be added.

According to the various embodiments of the disclosure, it is possible to easily and stably assemble the foldable electronic device, prevent damage to components affected when the foldable electronic device is folded or enhance durability of the components, and produce a design in consideration of deformation of the components.

In addition, the disclosure may provide various effects that are directly or indirectly recognized.

While the disclosure has been shown and described with reference to various embodiments thereof, it will be understood by those skilled in the art that various changes in form and details may be made therein without departing from the spirit and scope of the disclosure as defined by the appended claims and their equivalents.

Although the present disclosure has been described with various embodiments, various changes and modifications may be suggested to one skilled in the art. It is intended that the present disclosure encompass such changes and modifications as fall within the scope of the appended claims.

What is claimed is:

1. A portable communication device comprising:
    a housing including:
        a hinge cover,
        a first bracket, and
        a second bracket configured to face the first bracket in a fully folded state;
    a hinge accommodated in the housing, the hinge including:
        a first hinge plate coupled with the first bracket and including a first opening formed therethrough, and
        a second hinge plate coupled with the second bracket and including a second opening formed therethrough;
    a flexible display accommodated in the housing, the flexible display including:
        a first display portion disposed over the first bracket and the first hinge plate, and
        a second display portion disposed over the second bracket and the second hinge plate; and
    a flexible printed circuit board (FPCB) accommodated in the housing such that a first region of the FPCB is exposed through the first opening, a second region of the FPCB is exposed through the second opening, and a third region of the FPCB between the first region and the second region is disposed in the hinge cover as bended, the FPCB including a metal plate covering a portion of a rear surface of the first region such that, when viewed from a direction perpendicular to the flexible display, the metal plate is overlapped with a portion of a lateral periphery of the hinge cover when the housing is folded or unfolded.

2. The portable communication device of claim 1, wherein the FPCB is attached to the first bracket via an adhesive layer formed on a portion of the metal plate.

3. The portable communication device of claim 1, wherein the FPCB includes a second metal plate covering a portion of a rear surface of the second region, such that, when viewed from the direction, the second metal plate is overlapped with a portion of another lateral periphery of the hinge cover opposite to the lateral periphery when the housing is folded or unfolded.

4. The portable communication device of claim 1, wherein:
    the first hinge plate includes a third opening formed therethrough, and
    the second hinge plate includes a fourth opening formed therethrough,
    further comprising:
    a second FPCB accommodated in the housing such that a first region of the second FPCB is exposed through the third opening, a second region of the second FPCB is exposed through the fourth opening, and a third region of the second FPCB between the first region and the second region of the second FPCB is disposed in the hinge cover as bended.

5. The portable communication device of claim 1, wherein:
    the portion of the lateral periphery of the hinge cover is protruded inwardly, and
    the third region of the FPCB is disposed over the portion protruded inwardly.

6. The portable communication device of claim 1, wherein the metal plate includes a SUS material.

7. The portable communication device of claim 1, wherein the metal plate includes a first portion attached to the first bracket via an adhesive layer and a second portion extending from the first portion, and
    wherein, when viewed from the direction perpendicular to the flexible display, the second portion of the metal plate overlaps with the portion of the lateral periphery of the hinge cover when the housing is folded or unfolded.

8. The portable communication device of claim 1, wherein the metal plate is attached to the rear surface of the first region via an adhesive layer.

9. The portable communication device of claim 1, wherein the metal plate is spaced apart from the portion of the lateral periphery of the hinge cover.

10. The portable communication device of claim 1, wherein the metal plate does not cover a rear surface of the third region of the FPCB.

11. The portable communication device of claim 3, wherein the second metal plate includes a first portion attached to the second bracket via an adhesive layer and a second portion extending from the first portion of the second metal plate, and
    wherein, when viewed from the direction perpendicular to the flexible display, the second portion of the second metal plate overlaps with the portion of the other lateral periphery of the hinge cover when the housing is folded or unfolded.

12. The portable communication device of claim 3, wherein the second metal plate is attached to the rear surface of the second region via an adhesive layer.

13. The portable communication device of claim 3, wherein the second metal plate is spaced apart from the portion of the other lateral periphery of the hinge cover.

14. The portable communication device of claim 3, wherein the second metal plate does not cover a rear surface of the third region of the FPCB.

15. A portable communication device comprising:
a foldable housing;
a hinge accommodated in the foldable housing, the hinge including a first hinge plate including a first opening formed therethrough, and a second hinge plate including a second opening formed therethrough; and
a flexible printed circuit board (FPCB) accommodated in the foldable housing such that a first region of the FPCB is exposed through in the first opening when viewing the first hinge plate from a direction perpendicular to a flexible display, a second region of the FPCB is exposed through in the second opening when viewing the first hinge plate from the direction perpendicular to the flexible display, and a third region of the FPCB between the first region and the second region is disposed in the hinge cover as bended, the FPCB including a metal plate covering a portion of a rear surface of the first region such that, when viewed from the direction perpendicular to the flexible display, the metal plate is overlapped with a portion of a lateral periphery of the hinge cover when the foldable housing is folded or unfolded.

16. The portable communication device of claim 15, wherein the FPCB is attached to the foldable housing via an adhesive layer formed on a portion of the metal plate.

17. The portable communication device of claim 15, wherein the FPCB includes a second metal plate covering a portion of a rear surface of the second region of the FPCB such that, when viewed from the direction, the second metal plate is overlapped with a portion of another lateral periphery of the hinge cover opposite to the lateral periphery when the foldable housing is folded or unfolded.

18. The portable communication device of claim 15, wherein:
the first hinge plate includes a third opening formed therethrough, and
the second hinge plate includes a fourth opening formed therethrough,
further comprising:
a second FPCB accommodated in the foldable housing such that a first region of the second FPCB is exposed through the third opening, a second region of the second FPCB is exposed through the fourth opening, and a third region of the second FPCB between the first region and the second region of the second FPCB is disposed in the hinge cover as bended.

19. The portable communication device of claim 15, wherein:
the portion of the lateral periphery of the hinge cover is protruded inwardly, and
the third region of the FPCB is disposed over the portion protruded inwardly.

20. The portable communication device of claim 15, wherein the metal plate includes a SUS material.

* * * * *